(12) United States Patent
Tzuang et al.

(10) Patent No.: US 8,279,020 B2
(45) Date of Patent: Oct. 2, 2012

(54) UNITS FOR ANALOG SIGNAL PROCESSING

(75) Inventors: Ching-Kuang Tzuang, Hsinchu County (TW); Chao-Wei Wang, Taichung (TW); Shian-Shun Wu, Hsinchu County (TW)

(73) Assignee: National Taiwan University, Taipei (TW)

( * ) Notice: Subject to any disclaimer, the term of this patent is extended or adjusted under 35 U.S.C. 154(b) by 347 days.

(21) Appl. No.: 12/795,610

(22) Filed: Jun. 7, 2010

(65) Prior Publication Data

US 2011/0298569 A1    Dec. 8, 2011

(51) Int. Cl.
*H01P 1/22*    (2006.01)
(52) U.S. Cl. ...................................... 333/81 A; 333/109
(58) Field of Classification Search ............... 333/81 A, 333/81 R, 116, 117, 109; 327/308, 309
See application file for complete search history.

(56) References Cited

U.S. PATENT DOCUMENTS

| 5,349,312 | A | * | 9/1994 | Huettner et al. | 333/81 A |
| 5,477,200 | A | * | 12/1995 | Ono | 333/81 R |
| 2005/0104680 | A1 | * | 5/2005 | Katta | 333/32 |

* cited by examiner

*Primary Examiner* — Stephen Jones
(74) *Attorney, Agent, or Firm* — Stout, Uxa, Buyan & Mullins, LLP

(57) ABSTRACT

The invention discloses the variable attenuator with characteristics, comprising wide attenuation ranges; syntheses on group delays, and low variation of the group delay. The building blocks, which construct the variable attenuator, comprise internal matching networks, external matching networks, delay networks, protecting networks, biasing network, a power combining network, and variable impedance networks. The elements, which realize the internal matching networks, external matching networks, signal combining networks, comprise resistor, inductor, capacitor, and transmission lines. The elements, which realize the variable impedance networks, comprise n-channel field-effect transistor (FET), p-channel FET, n-type bipolar junction transistor (BJT), and p-type BJT. The elements of the variable attenuator can be either integrated on a semiconductor chip by using system-on-chip (SOC) technologies. The building blocks of the variable attenuator can be realized on different substrates and integrated in a module by using multi-chip module (MCM) technologies.

8 Claims, 56 Drawing Sheets

MA-MA' Cut

MC-MC' Cut

SCA-SCA' Cut

UNITS FOR ANALOG SIGNAL PROCESSING

BACKGROUND OF THE INVENTION

1. Field of the Invention

The present invention relates to a variable attenuator applied to a modulator design at microwave and millimeter-wave frequency bands. For maintaining the quality of microwave RF signal processing, the variable attenuator is designed for achieving the wide attenuation range and low phase-shifting over all attenuation range.

2. Description of the Prior Art

The prior art variable attenuator cannot achieve a wide attenuation range and low phase-shifting over all attenuation range.

SUMMARY OF THE INVENTION

The invention discloses a variable attenuator with the characteristics, comprising the wide attenuation ranges, the syntheses on the group delays, and the low variation of the group delay. The invention discloses that the elements of the variable attenuator can be either integrated on a semiconductor chip by using the system-on-chip (SOC) technologies. The invention discloses that the building blocks of the variable attenuator, which can be realized on the different substrates, can be integrated in a module by using the multi-chip module (MCM) technologies.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 38 is a schematic diagram of a curve of the attenuation of the variable attenuator 201 versus the voltage at the node 202a.

FIG. 39 is a schematic diagram of a phase delay of the variable attenuator 201 versus the voltage at the node 202a.

DETAILED DESCRIPTION

Figure 1:
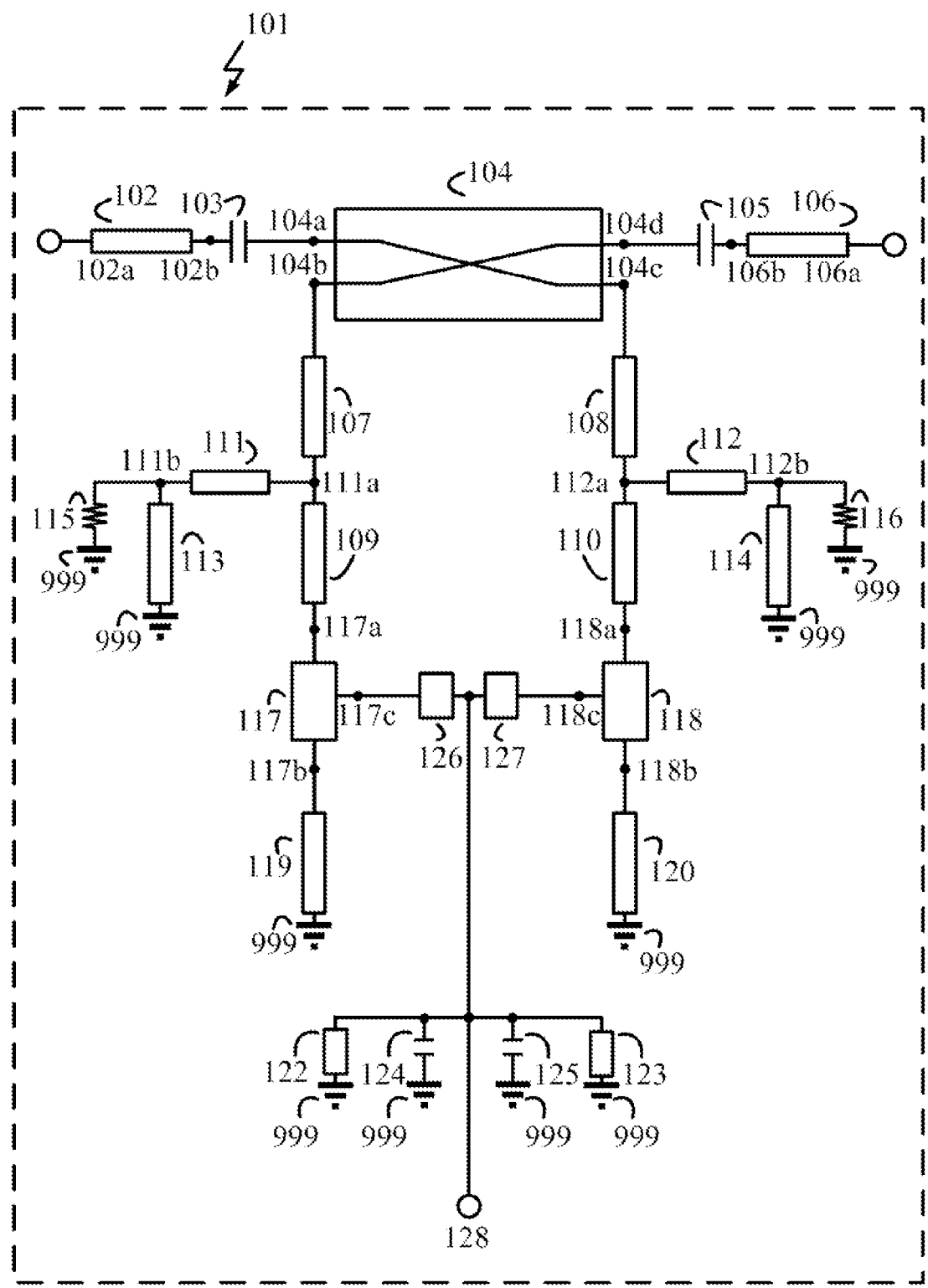
FIG. 1 is a schematic of a variable attenuator that can synthesize the group delay.

FIG. 1 shows the variable attenuator 101 that can synthesize the group delay. Both nodes 102a and 106a can be the input or output terminal of the variable attenuator 101 for the signal transmission. The absolute value of the attenuation of the attenuator is equal to the magnitude of the transmission coefficient between nodes 102a and 106a. The group delay of the variable attenuator 101 is equal to the derivative of the phase of the transmission coefficient between nodes 102a and 106a respect to the angular frequency of the signal at node 102a or 106a. Node 128 is the control terminal of the variable attenuator 101 to control the attenuation. Node 999 is the reference ground of the variable attenuator 101. Node 102b connects with the node 104a of the coupler 104 via the capacitor 103. Node 106b connects with the node 104d of the coupler 104 via the capacitor 105. Nodes 104a, 104b, 104c, and 104d are regarded as the input, coupled, through, and isolated ports of the coupler 104. If the waveform of the signal at nodes 102a and 106a has no mean value, the capacitors 103 and 105 can be omitted; the element 102 and 106 can directly connect with nodes 104a and 104d, respectively.

The resistor 115 and the element 113, which are in parallel between the nodes 111b and 999, connect with the node 111a via the element 111. The resistor 116 and the element 114, which are parallel between the nodes 112b and 999, connect with the node 112a via the element 112. Nodes 111a and 112a connect with the nodes 104b with 104c via the elements 107 and 108, respectively. The nodes 117a and 118a of the elements 117 and 118 connect with the nodes 111a and 112a via the elements 109 and 110, respectively. The nodes 117b and 118b of the elements 117 and 118 connect with the node 999 via the elements 119 and 120, respectively. The nodes 117c and 118c of the elements 117 and 118 connect with the node 128 via the elements 126 and 127, respectively.

The elements 122 and 123 connect in parallel between the nodes 128 and 999. The capacitors 124 and 125 connect in parallel between the nodes 128 and 999. The elements 122 and 123 can assist in electrostatic discharge and protect the variable attenuator 101 from the electrostatic damage. The capacitors 124 and 125 can reduce the noise or interferences injected into the variable attenuator 101 from the node 128. If the signal at the node 128 has no electrostatic discharge, the elements 122 and 123 can be omitted. If no interferences or noises are injected into the node 128, the capacitors 124 and 125 can be omitted.

Figure 2:
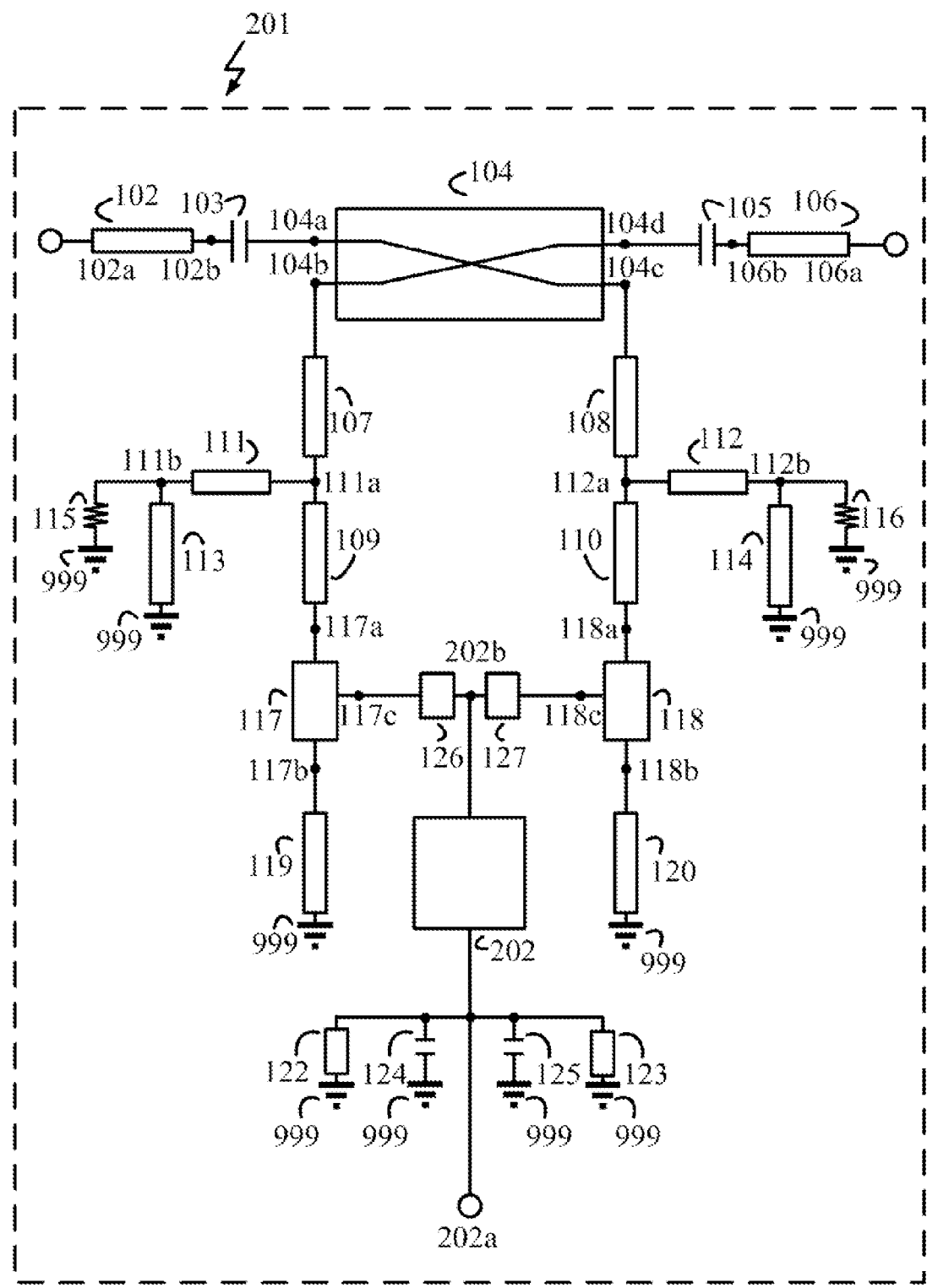
FIG. 2 is another schematic of the variable attenuator that can synthesize the group delays.

FIG. 2 shows the variable attenuator 201 that is identical to variable attenuator 101 except an additional element 202. The node 202a is the control terminal to control the attenuation of the variable attenuator 201. In FIG. 2, the nodes 117c and 118c connect with the node 202b via the element 126 and 127, respectively. The elements 122, 123 and capacitors 124 and 125 connect in parallel between the nodes 202a and 999. The elements 122 and 123 can assist in electrostatic discharge and protect the variable attenuator 201 from the electrostatic damage. The capacitors 124 and 125 can reduce the noise or interferences injected into variable attenuator 201 from the node 202a. If the signal at node 202a has no electrostatic discharge, the elements 122 and 123 can be omitted. If no interferences or noises are injected into node 202a, the capacitors 124 and 125 can be omitted.

Figure 3:
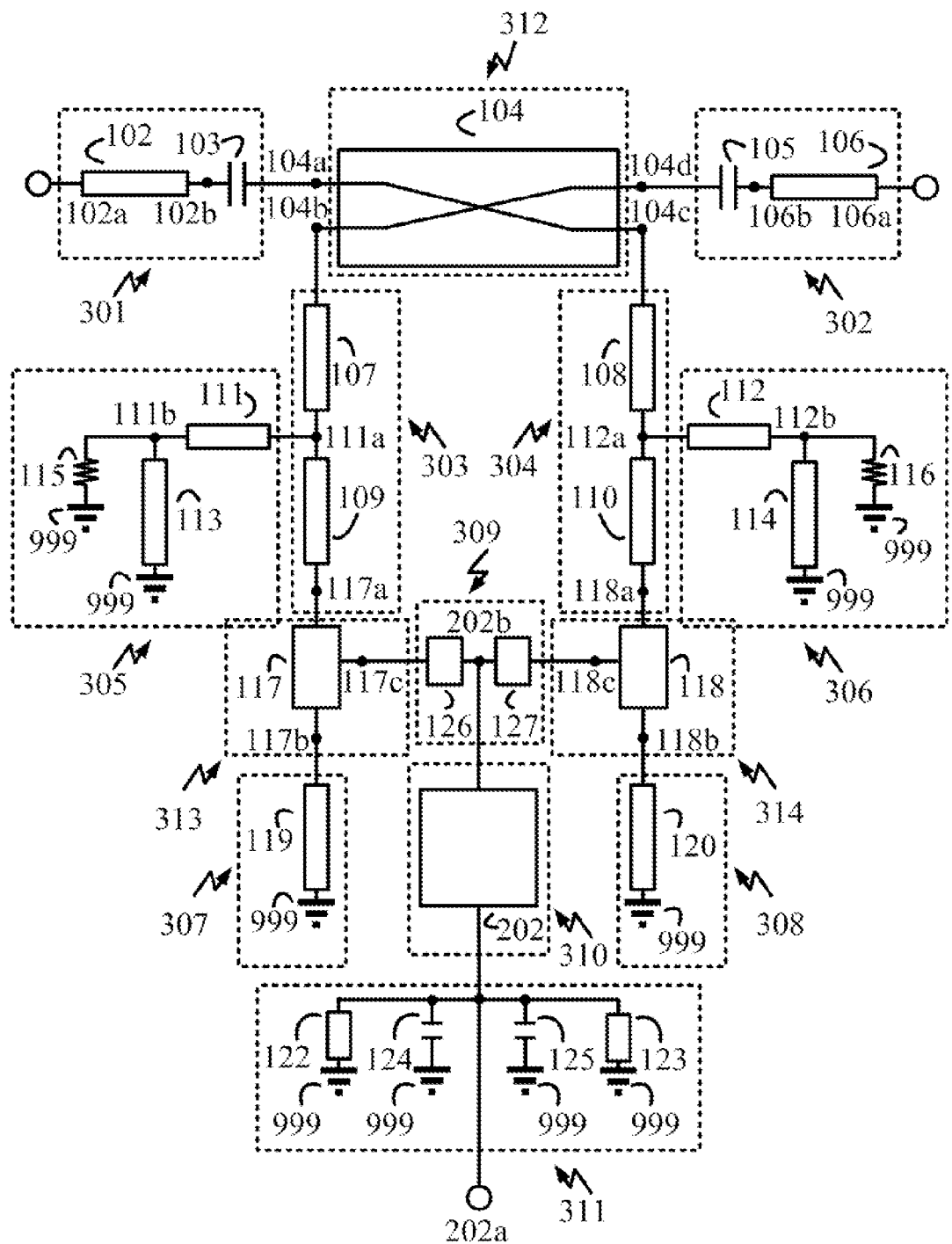
FIG. 3 is a function block diagram of the variable attenuator.

FIG. 3 shows the function blocks of the variable attenuator. The block 301 consists of the element 102 and the capacitor 103. The block 302 consists of the element 106 and the capacitor 105. The block 303 consists of the elements 107 and 109. The block 304 consists of the elements 108 and 110. The block 305 consists of the resistor 115, and the elements 111 and 113. The block 306 consists of the resistor 116, and the elements 112 and 114. The blocks 307 and 308 consist of the elements 119 and 120, respectively. The block 309 consists of the elements 126 and 127. The block 310 consists of the element 202. The block 311 consists of the elements 122 and 123, and the capacitors 124 and 125. The blocks 301 and 302 are the first and second external matching networks that can reduce the voltage standing wave ratio (VSWR) at nodes 102a and 106a. The blocks 303 and 304 are the first and second delay networks that can assist variable attenuator in synthesizing the group delay. The blocks 305, 306, 307, 308, and 309 are the first, second, third, fourth, fifth internal matching networks that can assist the variable attenuator in reducing the difference between the maximum and minimum values of the group delays. The blocks 310 can synthesize the transfer function between the signal at node 202a and the attenuation. The block 311 is the network for protecting the variable attenuator from the electrostatic damage and reducing the interferences injected into the variable attenuator. The block 312 is the power combining network. The block 313 and 314 are the first and second variable impedance networks.

Figure 4:
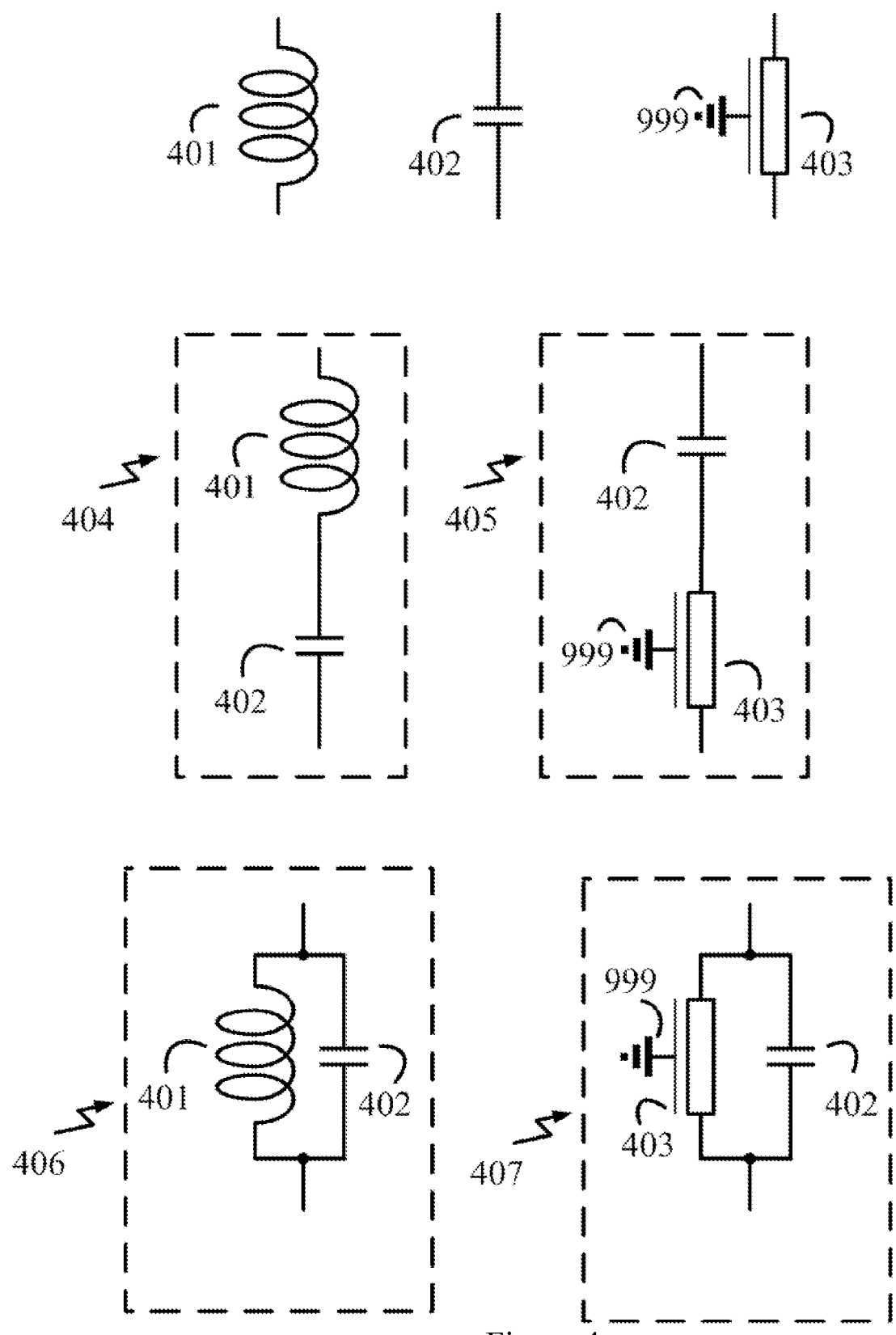
FIG. 4 is a schematic diagram of circuit topologies of the elements 102, 106, 107, 108, 109, 110, 111, 112, 113, and 114, 119 and 120.

The elements 102, 106, 107, 108, 109, 110, 111, 112, 113, 114, 119, 120 can be realized in the circuit topologies shown in FIG. 4. The topologies comprise the inductor 401, the capacitor 402, the transmission line 403, the series network 404 consisting of the inductor 401 and the capacitor 402, the series network 405 consisting of the transmission line 403 and the capacitor 402, the parallel network 406 consisting of the inductor 401 and the capacitor 402, and the parallel network 407 consisting of the transmission line 403 and the capacitor 402. The reference ground of the transmission line 403 connects with the node 999.

Figure 5:
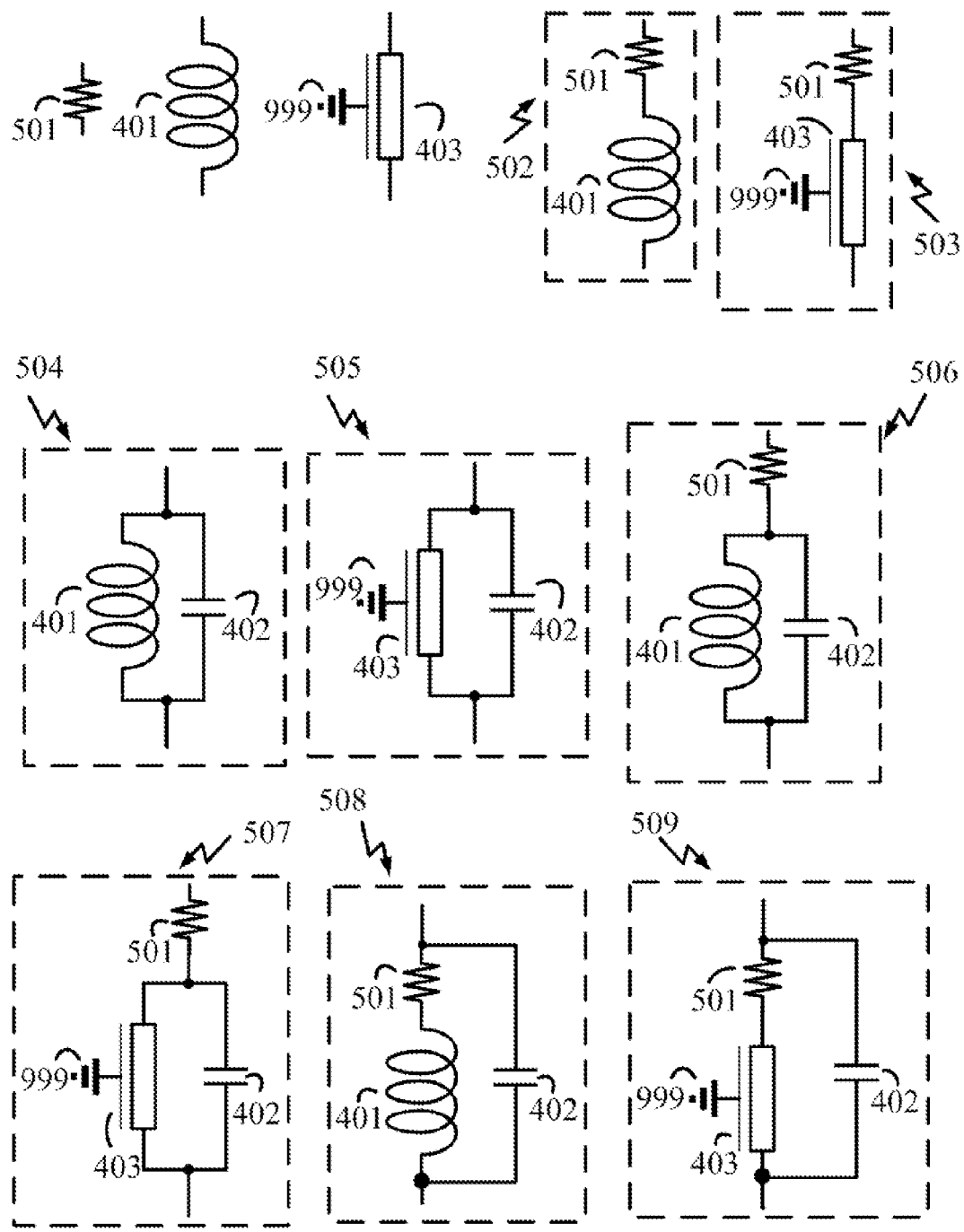
FIG. 5 is a schematic diagram of circuit topologies of the elements 126 and 127.

The elements 126 and 127 can be realized in the circuit topologies shown in FIG. 5. The topologies comprise the resistor 501, the inductor 401, the transmission line 403, the series network 502 consisting of the resistor 501 and the inductor 401, the series network 503 consisting of the resistor 501 and the transmission line 403, the parallel network 504 consisting of the inductor 401 and the capacitor 402, the parallel network 505 consisting of the transmission line 403 and the capacitor 402, the series network 506 consisting of the resistor 501 and the network 504, the series network 507 consisting of the resistor 501 and the network 505, the parallel network 508 consisting of the capacitor 402 and the network 502, the parallel network 509 consisting of the capacitor 402 and the network 503. If the impedance between the nodes 128 and 999 is higher than 300.0 ohm, the elements 126 and 127 can be omitted. If the impedance between the nodes 202b and 999 is higher than 300 ohm, the elements 126 and 127 can be omitted. The inductance of the inductor 401 is between 0.01 nH and 8 nH. The capacitance of the capacitor 402 is between 0.01 pF and 30 pF. The characteristic impedance of the transmission line 403 is between 10.0 ohm and 300.0 ohm. The physical length of the transmission line 403 is between 0.01 times and 3 times of the guided wavelength at the operating frequency of the variable attenuator. The resistance of the resistor 501 is between 1.0 ohm and 10000.0 ohm.

Figure 6:
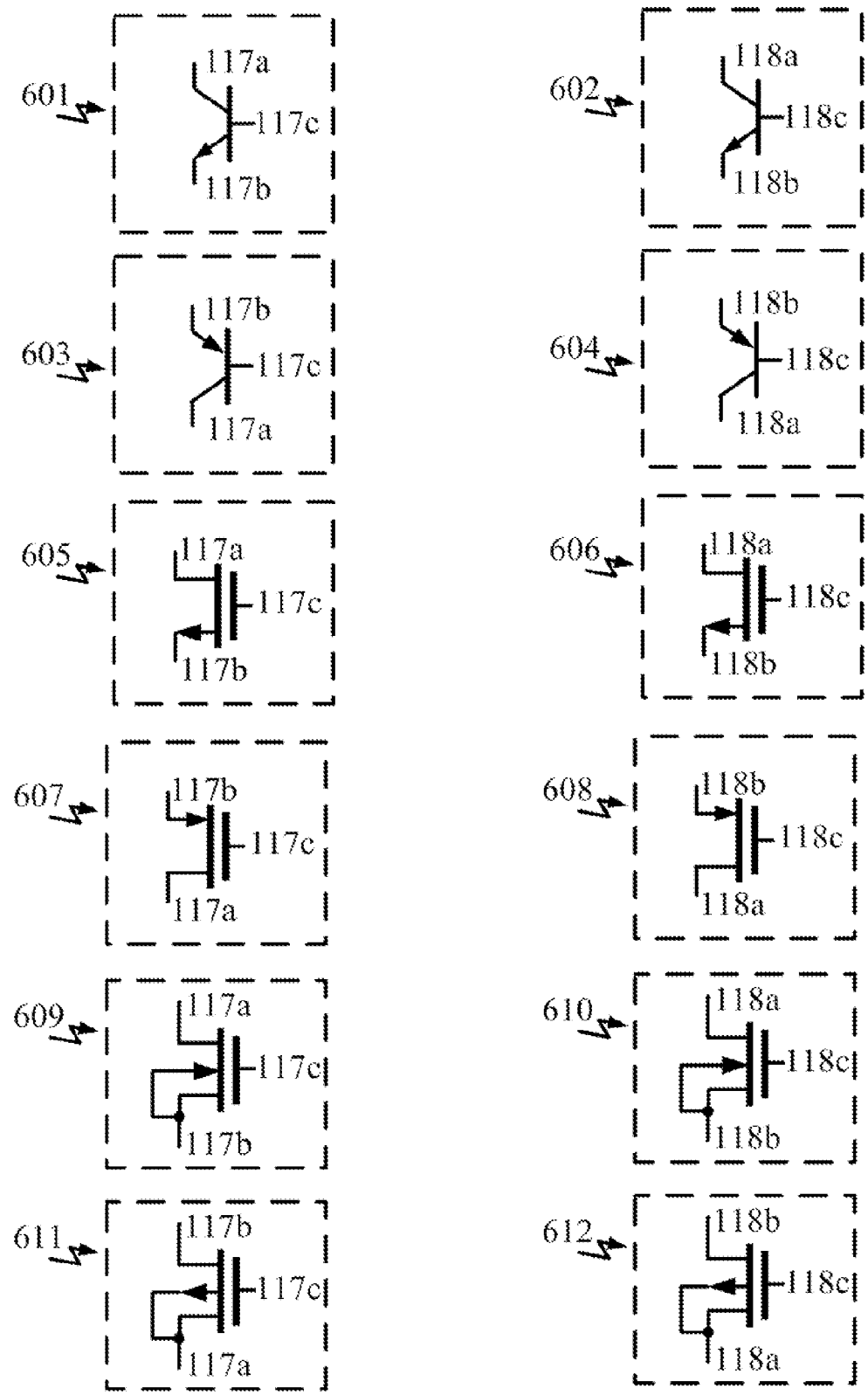
FIG. 6 is a schematic diagram of the circuit topologies of the elements 117 and 118.

The elements 117 and 118 can be realized in the circuit topologies shown in FIG. 6. The topologies comprise the NPN bipolar junction transistor (BJT) 601, and 602, the PNP BJT 603 and 604, n-channel field effect transistor (FET) 605 and 606, p-channel FET 607 and 608, n-channel FET with four terminals 609 and 610, p-channel FET with four terminals 611 and 612. The NPN BJT consists of a layer P-doped semiconductor between two N-doped layers. The PNP BJT consists of a layer N-doped semiconductor between two P-doped layers. When the elements 117 and 118 are the BJT 601, 602, 603, and 604, the nodes 117a and 118a are regarded as the collector-terminals of the BJT 601, 602, 603 and 604. The nodes 117b and 118b are the emitter-terminals of the BJT 601, 602, 603, and 604. The nodes 117c and 118c are the base-terminals of the BJT 601, 602, 603, and 604. When the elements 117 and 118 are in the FET 605, 606, 607, 608, 609, 610, 611, and 612, the nodes 117a and 118a are regarded as the drain-terminals of the FET 605, 606, 607, 608, 609, 610, 611 and 612. The nodes 117b and 118b are the source-terminals of the FET 605, 606, 607, 608, 609, 610, 611 and 612. The nodes 117c and 118c are the gate-terminals of the FET 605, 606, 607, 608, 609, 610, 611 and 612. When element 117 is in the FET 609 or 611, the bulk-terminals of FET 609 and 611 connect with the node 117b. When element 118 is in the FET 610 or 612, the bulk-terminals of FET 610 and 612 connect with the node 118b. The ratio of the finger width to the finger length of the FET 605, 606, 607, 608, 609, 610, 611 and 612 is between 0.1 and 5000. The elements 117 and 118 can be identical or non-identical to each other.

If the elements 117 and 118 are realized in the forms of FET 605, 606, 607, 608, 609, 610, 611 and 612, the variable attenuator 101 consumes zero power. If the elements 117 and 118 are realized in the forms of BJT 601, 602, 603, and 604, the variable attenuator 101 consumes power.

Figure 7:
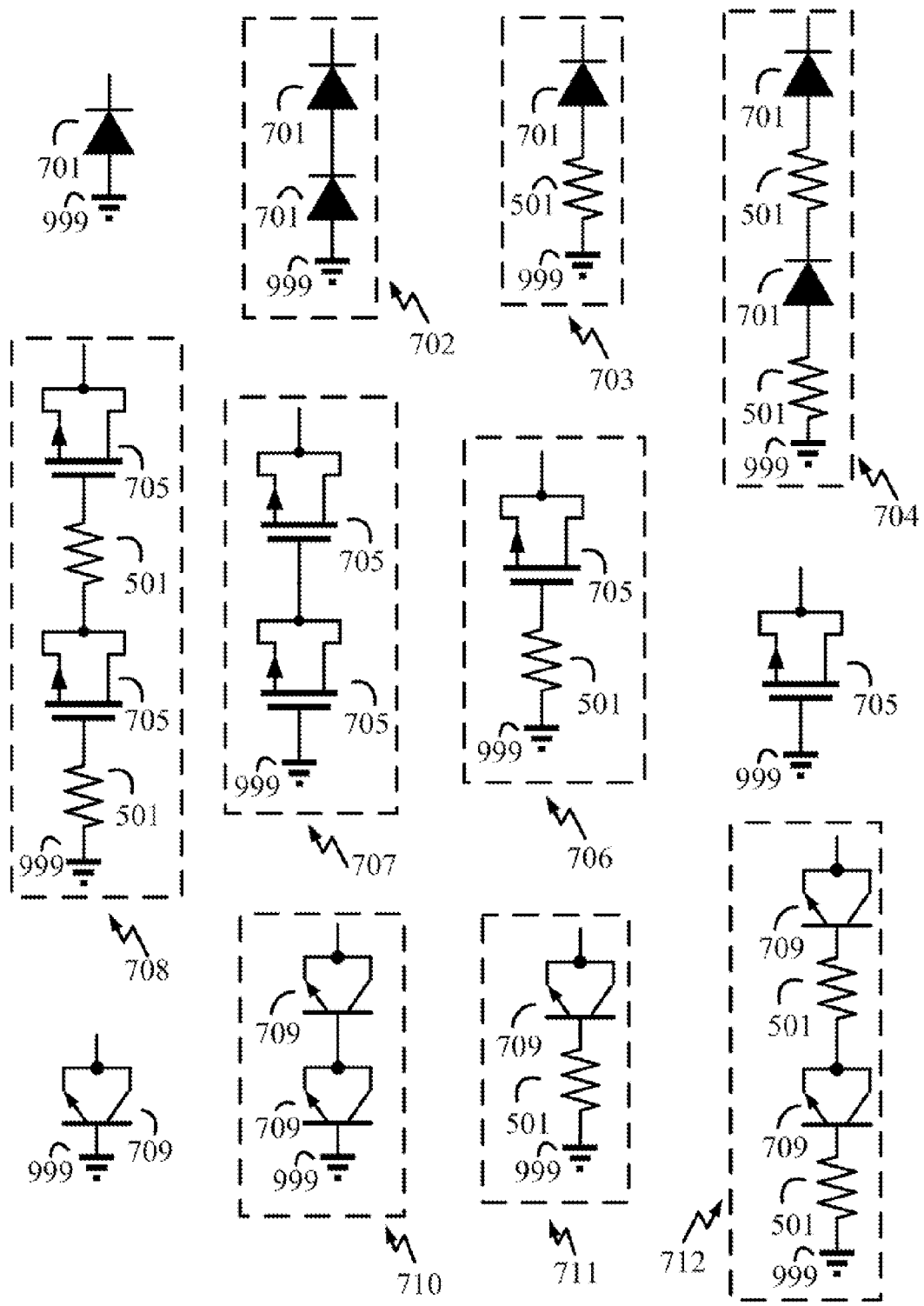
FIG. 7 is a schematic diagram of the circuit topologies of the elements 122 and 123 when the amplitude of the signal at node 128 or 202a is higher than zero.
Figure 8:
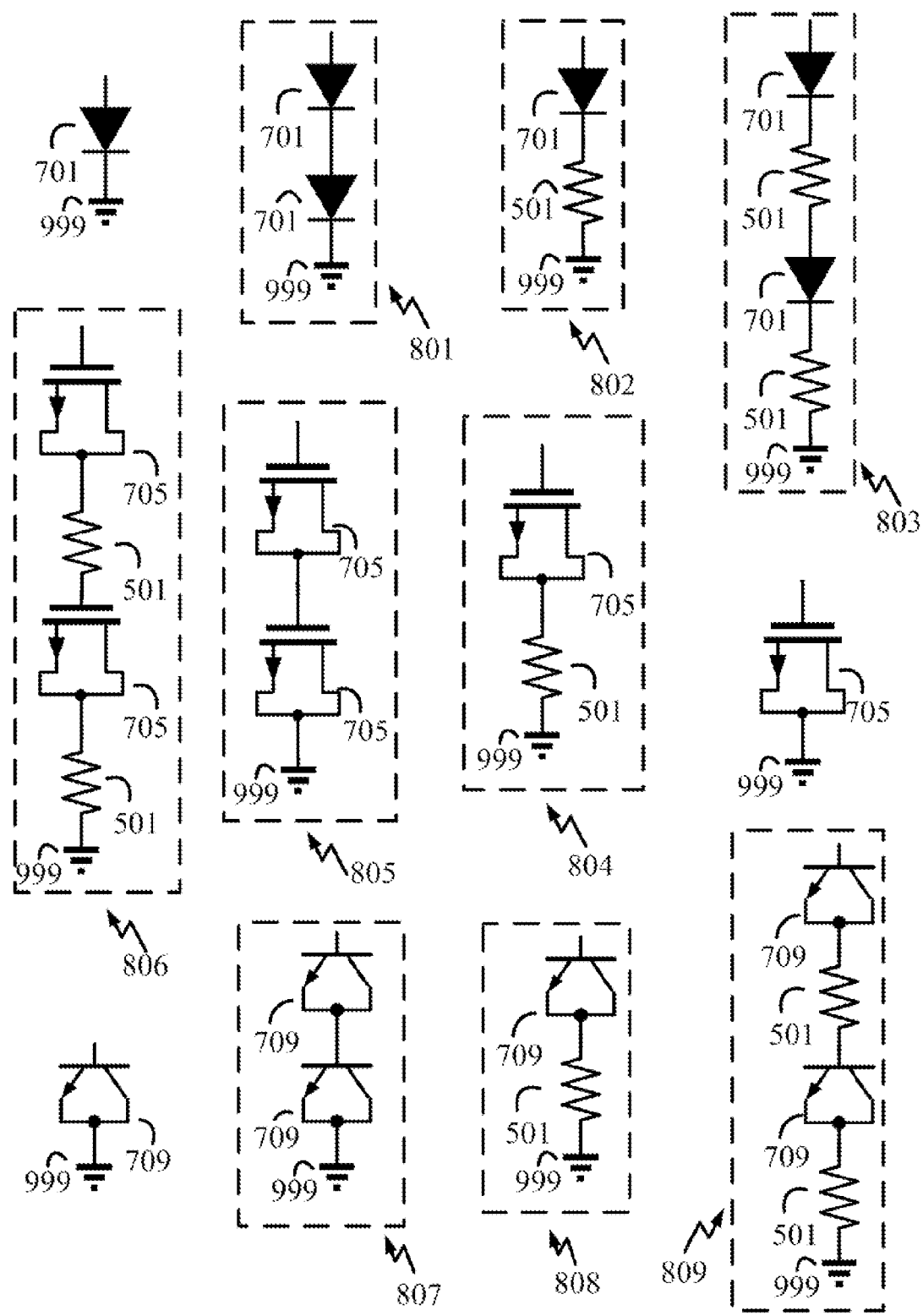
FIG. 8 is a schematic diagram of the circuit topologies of the elements 122 and 123 when the amplitude of the signal at node 128 or 202a is lower than zero.

The signal at the nodes 128 and 202a can be in the forms comprising the current and the voltage. The signal at the nodes 128 and 202a can be dependent or independent on the time. When the elements 117 and 118 are the FET 605, 606, 609, 610, and the BJT 601 and 602, the magnitude of the signal at node 128 is greater than zero. When the elements 117 and 118 are the FET 607, 608, 611 and 612, the magnitude of the signal at node 128 is less than zero. When the magnitude of the signal at the nodes 128 or 202a is higher than zero, the elements 122 and 123 are in the circuit topologies shown in FIG. 7. The topologies comprise the diode 701, the series network 702 consisting of the diodes 701, the series network 703 consisting of the diode 701 and the resistor 501, the series network 704 consisting of the networks 703, the element 705, the series network 706 consisting of the element 705 and resistor 501, the series network 707 consisting of the elements 705, the series network 708 consisting of the network 706, the element 709, the series network 710 consisting of the elements 709, the series network 711 consisting of the element 709 and the resistor 501, and the series network 712 consisting of the networks 711. In FIG. 7, the p-terminal of the diode 701, the gate-terminal of the element 705, the base-terminal of the element 709, the one terminal of the resistor 501 in the networks 703, 704, 706, 708, 711, and 712 connect with the node 999. When the magnitude of the signal at nodes 128 or 202a is lower than zero, the elements 122 and 123 can be in the circuit topologies shown in FIG. 8, comprising the networks 801, 802, 803, 804, 805, 806, and 807. In FIG. 8, the n-terminal of the diode 701, the source and drain terminals of the element 705, the collector and emitter terminals of the element 709, the one terminal of the resistor 501 in the networks 802, 803, 804, 806, 808 and 809 connect with the node 999.

The minimum absolute value of the magnitude of the signal at nodes 128 and 202a is equal to zero volt. When the elements 117 and 118 are NPN-type BJT, the maximum absolute value of the voltage at node 128 is equal to the breakdown voltage between the base and emitter terminals of the BJT 601 and 602. When the elements 117 and 118 are in PNP-type BJT, the maximum absolute value of the voltage at the node 128 and 202a are equal to the breakdown voltage between the base and collector terminals of the BJT 603 and 604. When the elements 117 and 118 are in n-channel FET, the maximum absolute values of the voltage at the node 128 and 202a are equal to the breakdown voltage between the gate and source terminals of the FET 605, 606, 609, and 610. When the elements 117 and 118 are p-channel FETs, the maximum absolute value of the voltage at the node 128 and 202a is equal to the breakdown voltage between the gate and drain terminals of the FET 607, 608, 611, and 612.

The elements 117 and 118, which operate in the ohmic mode, behave as the passive components with the complex impedances. The complex impedances of the elements 117 and 118 can be identical or non-identical to each other. When the elements 117 and 118 are FET 605, 606, 607, 608, 609, 610, 611 and 612, the voltages at nodes 117c and 118c are identical to the voltage at node 128 or 202b. The loading impedances between the nodes 104b and 999 and the loading impedances between the node 104c and 999 can be identical or non-identical to each other. The resistances of the resistors 115 and 116 can be identical or non-identical to each other. The resistances of the resistors 115 and 116 are between 20 ohm and 500 ohm. When the values of the elements 111 to 116 are fixed, the real part of the loading impedances at 104b and 104c can be controlled by the voltage at nodes 128 or 202b. The value of the real part of the loading impedance at the nodes 104b and 104c is between 5.0 ohm and 350.0 ohm. When the coupler 104 has loss, the reference impedances of the coupler 104 are the complex numbers. The value of the real part of the reference impedance is between 10.0 ohm and 200.0 ohm.

The elements 401, 402, 403, 501, 601, 602, 603, 604, 605, 606, 607, 608, 609, 610, 611, 612, 701, 705, 709 can be implemented on a semiconductor substrate, comprising the silicon substrate with a resistivity less than 0.1 ohm-meter, the silicon substrate with a resistivity greater than 100 ohm-meter, the silicon-insulator-silicon substrate, the sapphire substrate with the silicon layer, the gallium arsenide (GaAs) substrate, the gallium nitride (GaN) substrate, the silicon substrate with the germanium layers, and the indium phosphide substrate. The processes for fabricating the semiconductor substrate comprise the complementary metal-oxide-semiconductor (CMOS) process, the silicon-germanium (SiGe) process, the silicon on insulator (SOI) process, the silicon on sapphire (SOS) process, the GaAs pseudomorphic High electron mobility transistor (pHEMT) process, the GaAs heterojunction bipolar transistor (HBT) process.

The elements 102, 103, 104, 105, 106, 107, 108, 109, 110, 111, 112, 113, 114, 115, 116, 117, 118, 119, 120, 122, 123, 124, 125, 126, 127, and 202 can be integrated on a semiconductor chip by using the system-on-a-chip (SOC) techniques. Alternately, the elements 102, 103, 104, 105, 106, 107, 108, 109, 110, 111, 112, 113, 114, 115, 116, 117, 118, 119, 120, 122, 123, 124, 125, 126, 127, and 202 can be realized on the multiple semiconductor chips and integrated on a carrier by using the multi-chip module (MCM) techniques. The semiconductor substrates comprise the silicon substrate with a resistivity less than 0.1 ohm-meter, the silicon substrate with a resistivity greater than 100 ohm-meter, the silicon-insulator-silicon substrate, the sapphire substrate with the silicon layer, the gallium arsenide (GaAs) substrate, the gallium nitride (GaN) substrate, the silicon substrate with the germanium layers, and the indium phosphide substrate. The processes for fabricating the semiconductor substrate comprise the complementary metal-oxide-semiconductor (CMOS) process, the silicon-germanium (SiGe) process, the silicon on insulator (SOI) process, the silicon on sapphire (SOS) process, the GaAs pseudomorphic High electron mobility transistor (pHEMT) process, the GaAs heterojunction bipolar transistor (HBT) process, the microelectromechanical systems (MEMS) process, and the nanoelectromechanical systems (NEMS) process.

The carriers, which can be used by the MCM techniques, comprise the lead frame made by aluminum, the laminated substrate, the organic substrate, the low temperature co-fired ceramic (LTCC) substrate, and liquid crystal polymer (LCP) substrate.

Figure 9:
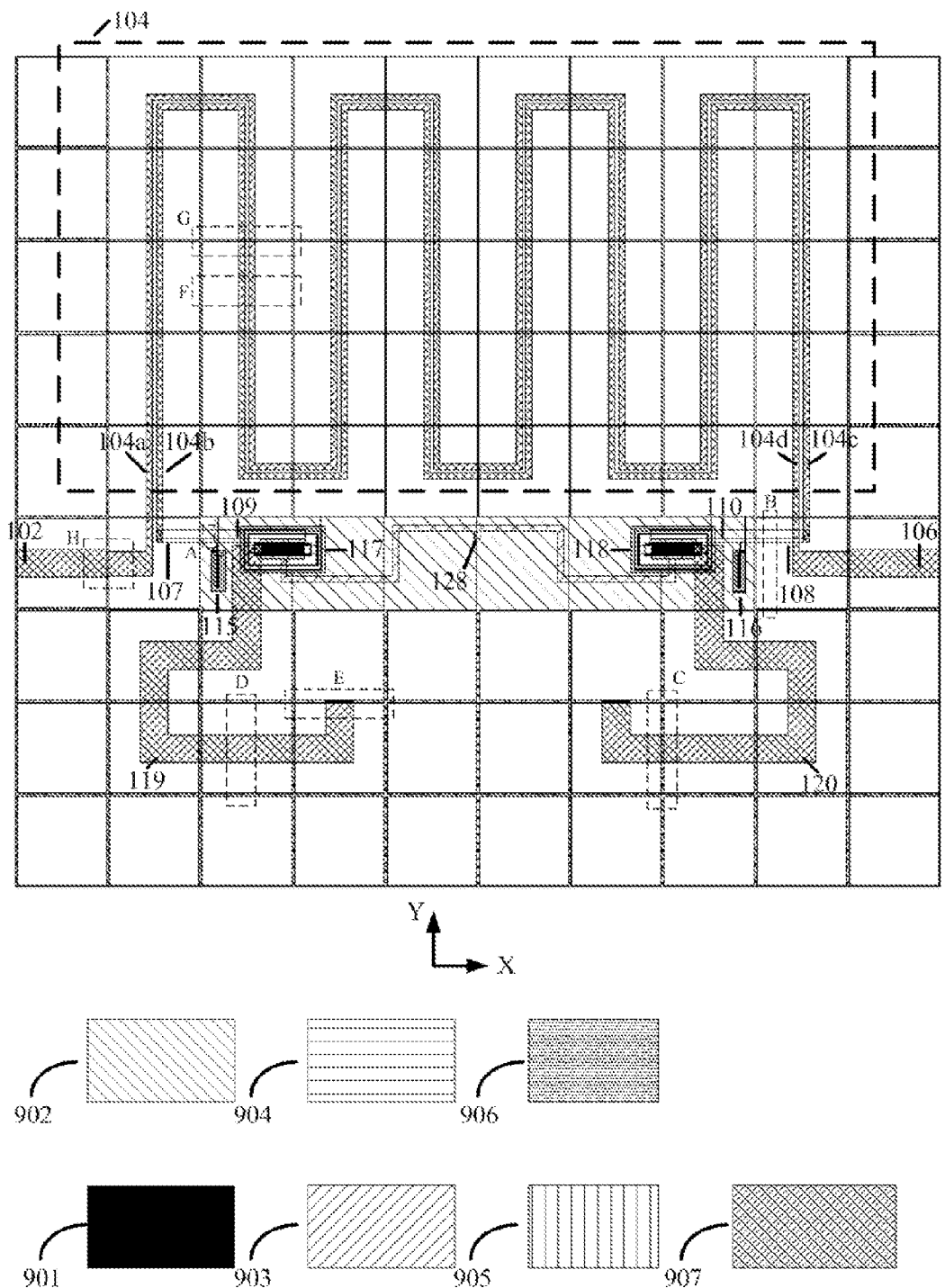
FIG. 9 is a schematic diagram of the appearance of the variable attenuator on a semiconductor chip.
Figure 10A:
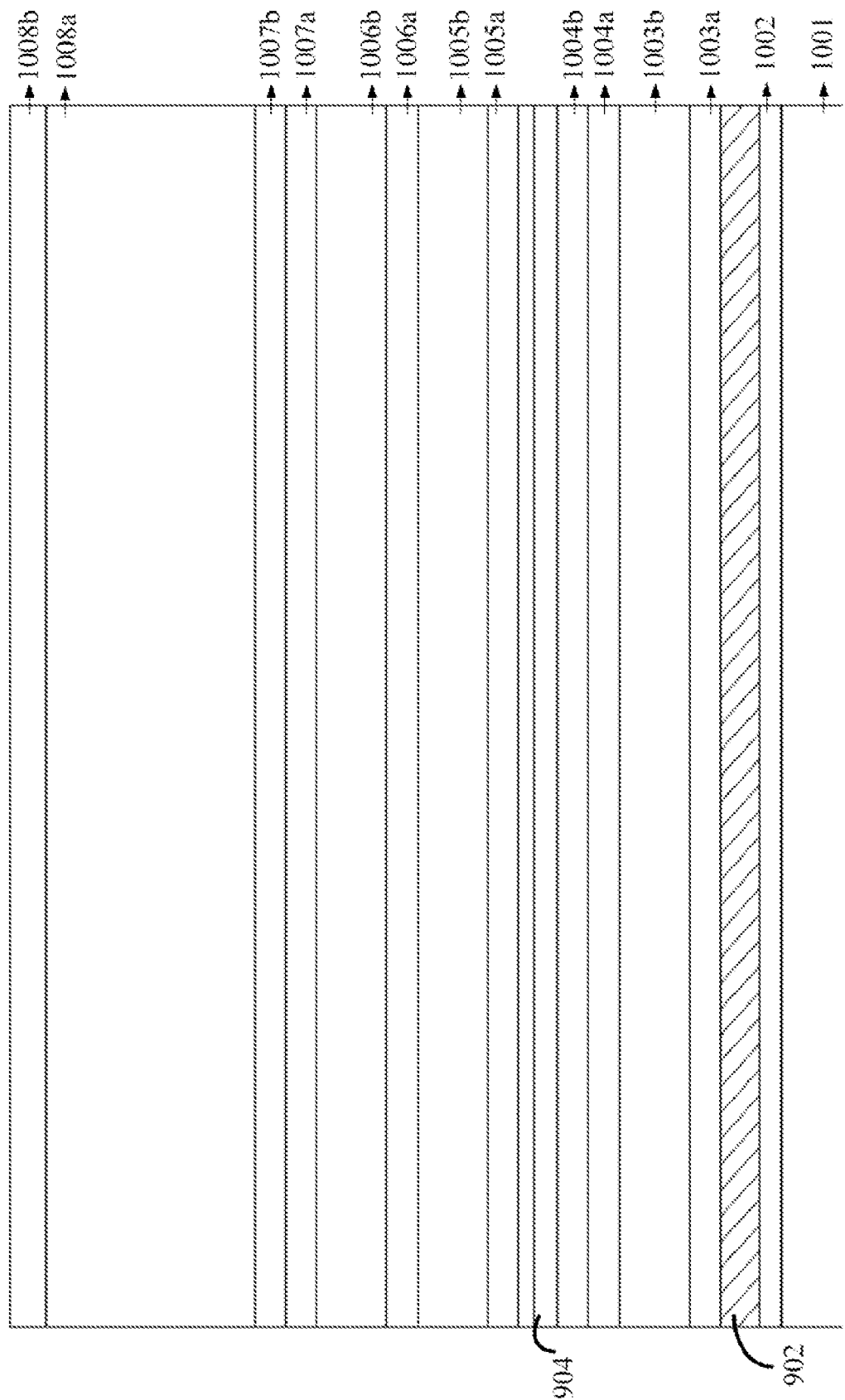
FIG. 10a is a schematic diagram of the cross-section view along the direction X in the region A of FIG. 9.
Figure 10B:
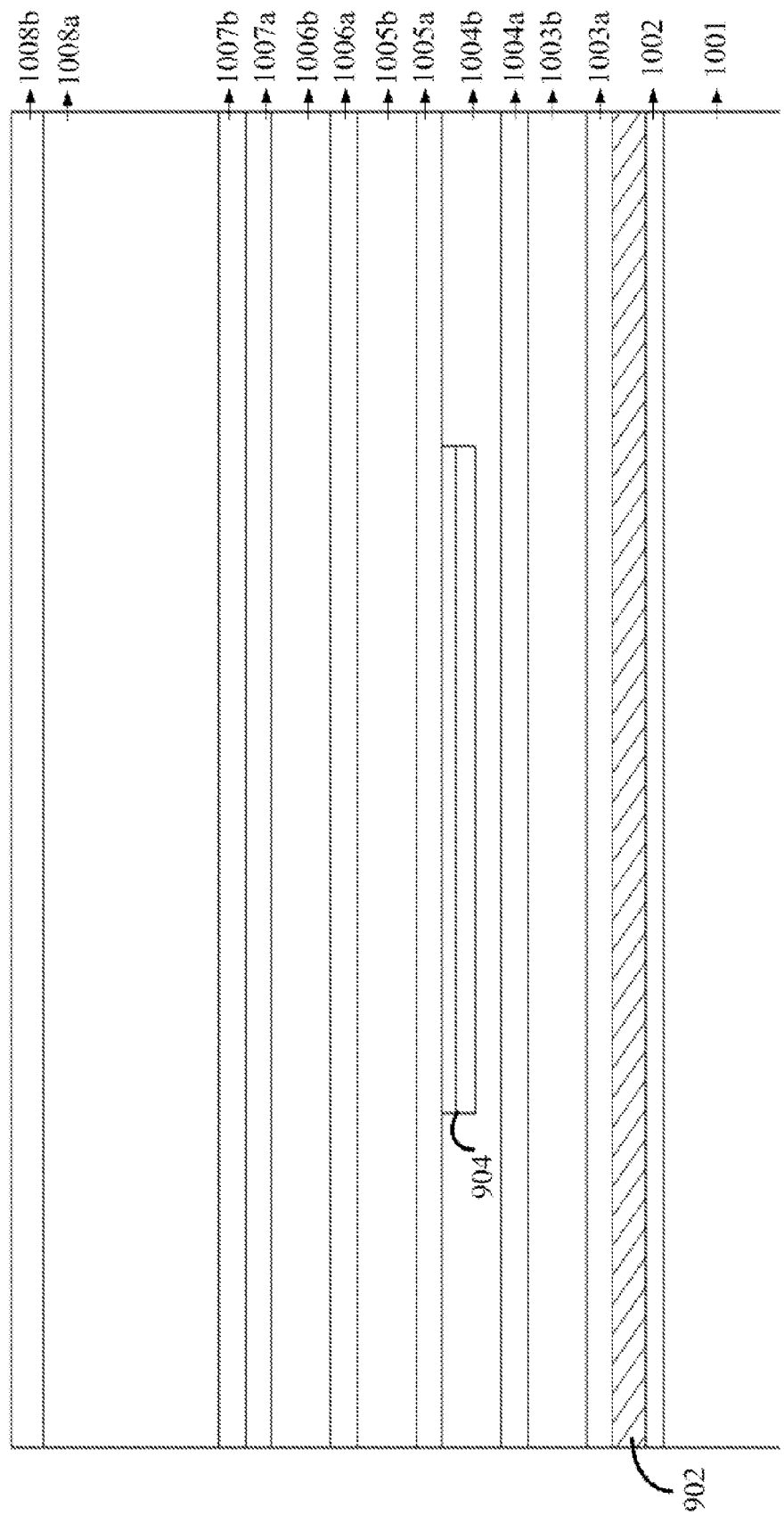
FIG. 10b is a schematic diagram of the cross-section view along the direction Y in the region A of FIG. 9.

FIG. 9 shows an integrated circuit of a variable attenuator on a semiconductor chip. The resistor 501 is realized by the poly layer 901. The sheet resistance of the poly layer 901 is between 5.0 ohm per square and 500.0 ohm per square. The first, second, third, fourth, fifth, and sixth metal layer are represented by the metal layer 902, 903, 904, 905, 906, and 907. The metal layer 902 is the bottom metal layer, and the metal layer 907 is the top metal layer. As shown in FIG. 9, a mesh metal plane, which is realized by the metal layer 902, shield the variable attenuator from the substrate of the semiconductor chip. The thickness of the metal layer 902, 903, 904, 905, and 906 is between 0.1 micrometers and 2.0 micrometers. The thickness of the metal layer 907 is between 0.6 micrometers and 5.0 micrometers. The line width of the metal layer 902, 903, 904, 905, 906, and 907 is between 0.1 micrometers and 100.0 micrometers. The metal layer 902, 903, 904, 905, 906, and 907 can be made by metal, comprising aluminum, copper, electroplating copper, sputtering copper, and gold. The metal layer 902 is the reference ground plane of the variable attenuator. The elements 102, 104, 106, 107, 108, 109, 110, 111, 112, 115, 116, 117, 118, 119, and 120 are either covered by metal layer 902 or above the metal layer 902. The resistors 115 and 116 are made of poly layer 901. When the elements 102, 104, 106, 107, 108, 109, 110 are realized in the form of the transmission line 403, the transmission line 403 can be realized either by two metal layers or more than two metal layers. As shown in FIG. 9, the elements 104, 109 and 110 are realized by two metal layers. The elements 102, 106, 107, 108, 119, and 120 are realized by six metal layers. FIGS. 10a and 10b shows the cross-section views along the direction X and Y in the region A of FIG. 9. The signal traces and reference ground plane of the elements 109 and 110 are realized by the metal layer 904 and 902, respectively. The width of the signal traces are between 0.5 micrometers and 20.0 micrometers. The layer 1001 and 1002 represent the semiconductor substrate and oxide layer. The layer 1003, 1004, 1005, 1006, and 1007 represent the inter media dielectric (IMD). Each IMD consists of two dielectric layers. The relative dielectric constant of 1003a, 1004a, 1005a, 1006a, and 1007a is between 3 and 10. The relative dielectric constant of 1003b, 1004b, 1005b, 1006b, and 1007b is between 3 and 10. The thickness of the layer 1003 to 1007 is between 0.3 micrometers and 1.0 micrometers. The 1008, which is the passivation of the semiconductor chip, has two layers, including 1008a and 1008b. The thickness of the 1008a and 1008b is between 0.5 micrometers and 7 micrometers. The relative dielectric constant of 1008a and 1008b is between 3 and 10. 1002 is above 1001. All the metal layer and IMD layers are above 1002. IMD layer 1003 is inserted between the metal layer 902 and 903. IMD layer 1004 is inserted between the metal layer 903 and 904. IMD layer 1005 is inserted between the metal layer 904 and 905. IMD layer 1006 is inserted between the metal layer 905 and 906. IMD layer 1007 is inserted between the metal layer 906 and 907. IMD layer 1008 covers the metal layer 907.

Figure 11A:
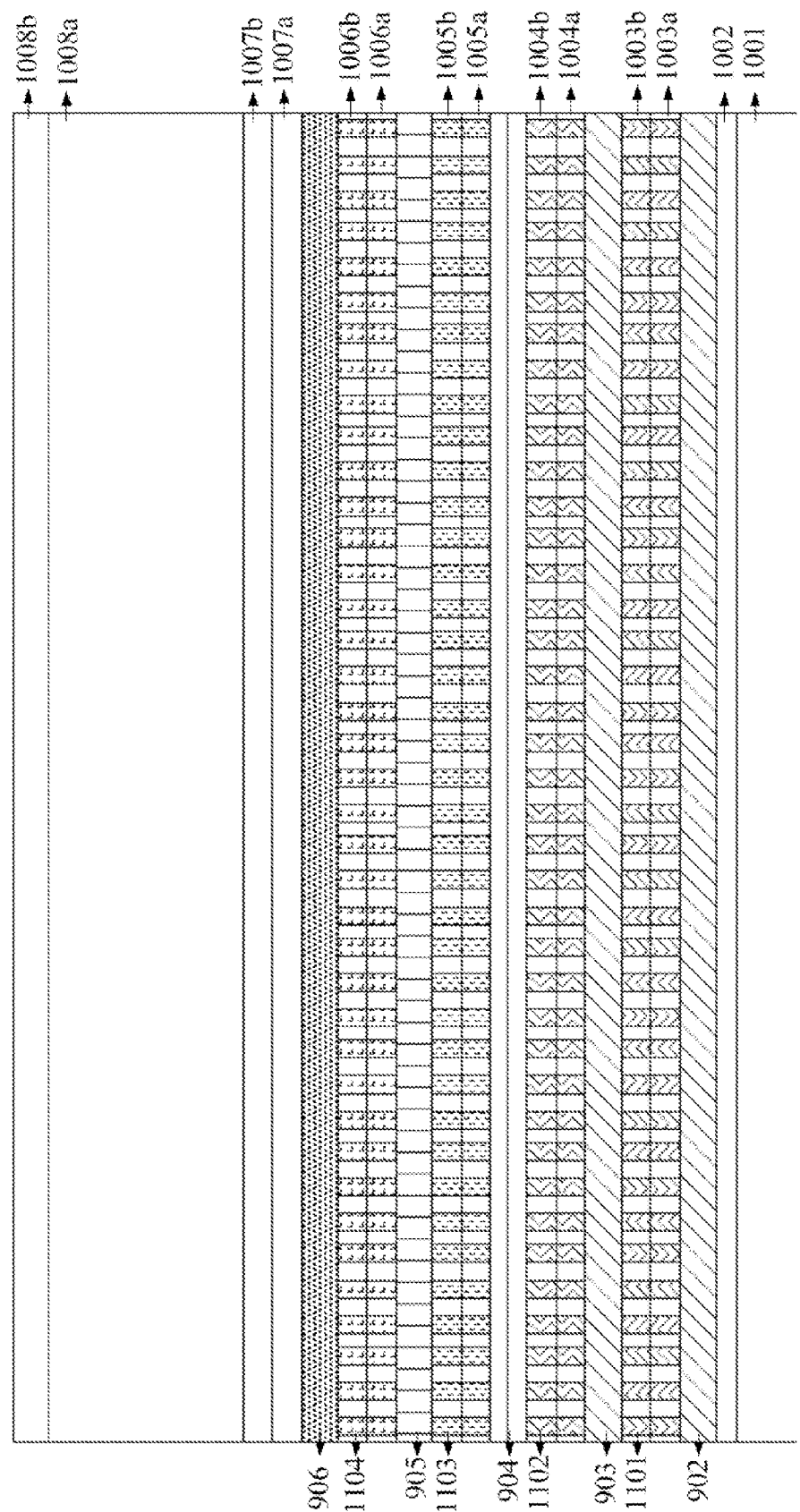
FIG. 11a is a schematic diagram of the cross-section view along the direction X in the region B of FIG. 9.
Figure 11B:
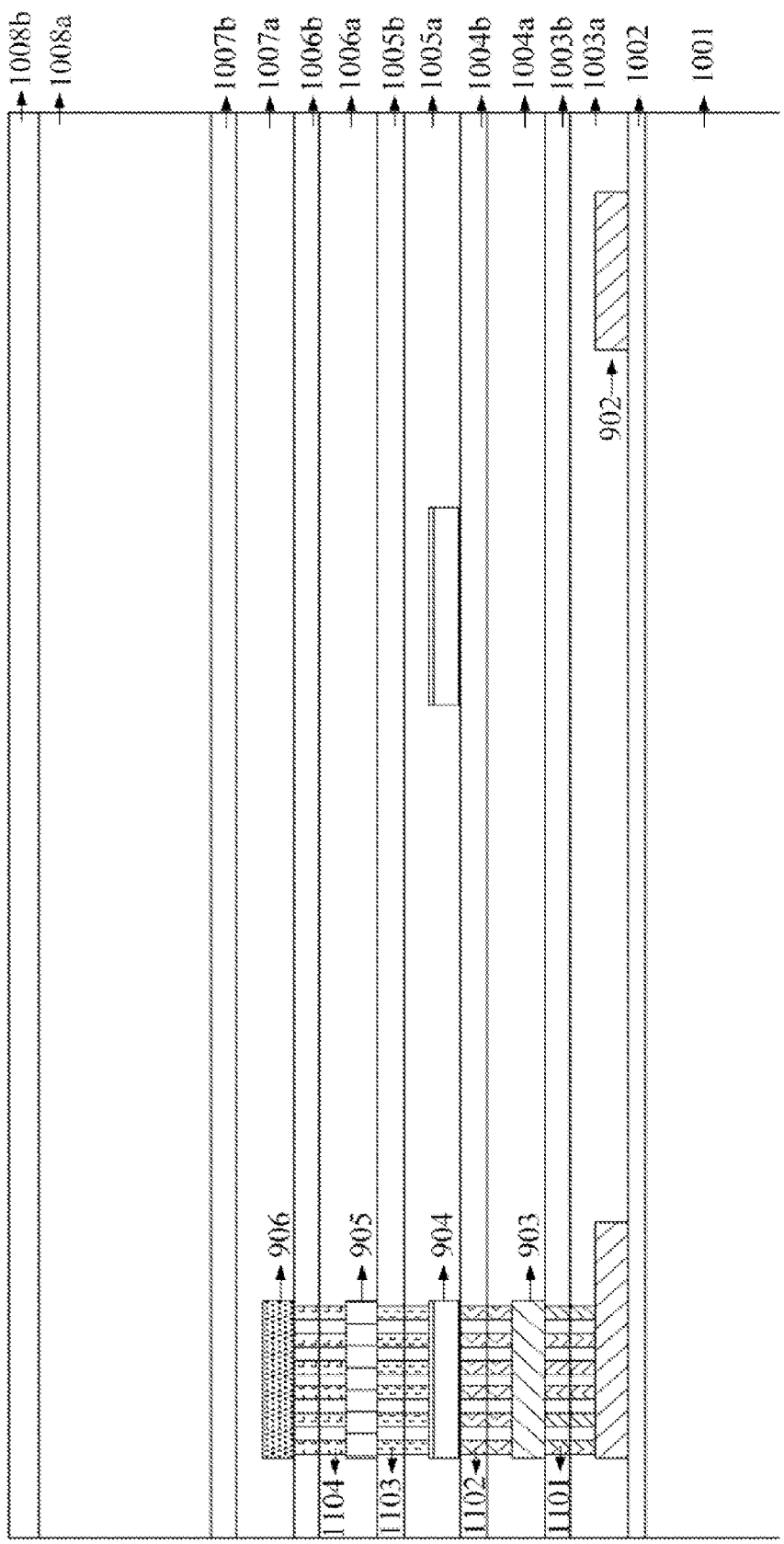
FIG. 11b is a schematic diagram of the cross-section view along the direction X in the region B of FIG. 9.
Figure 12A:
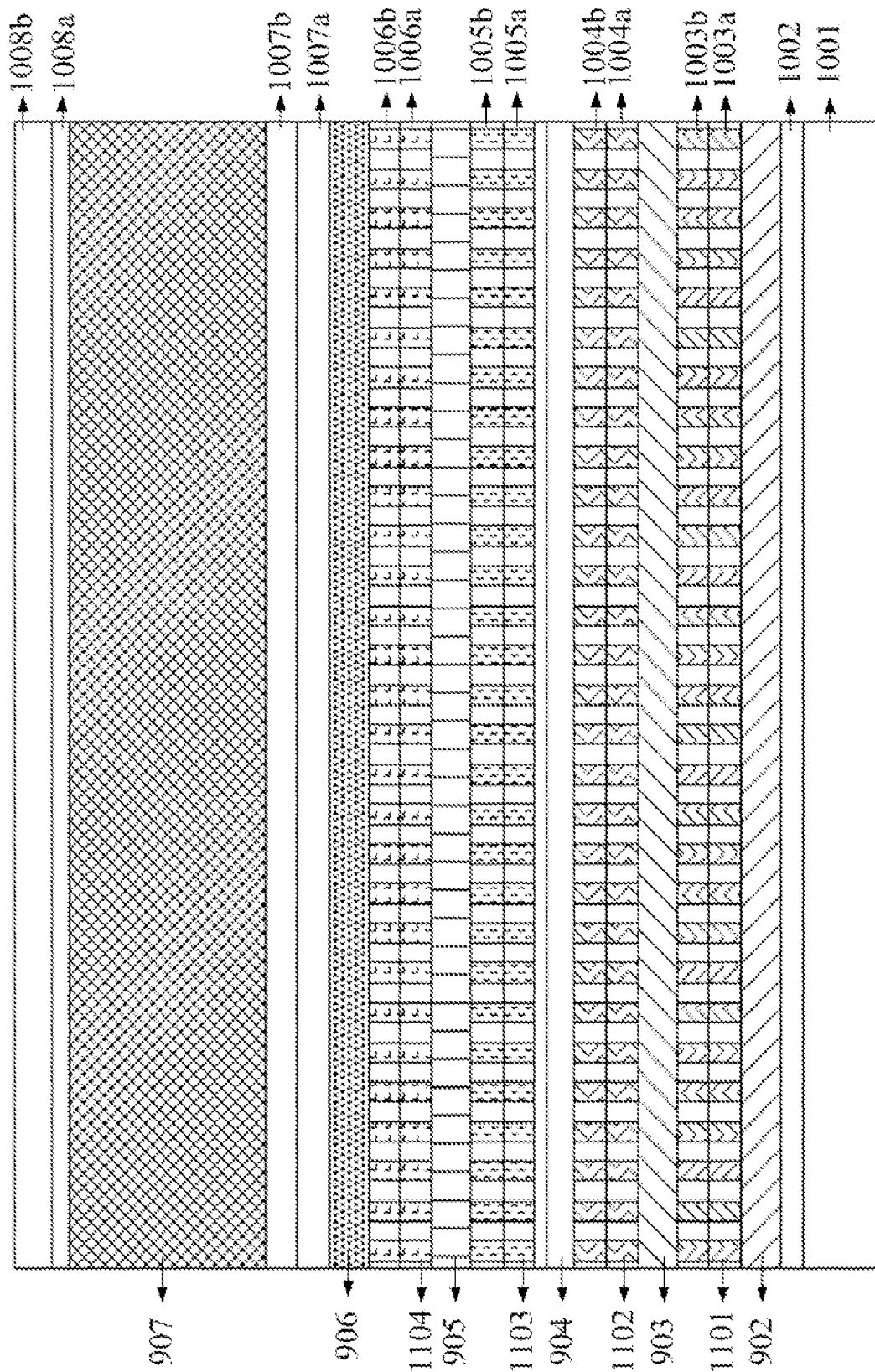
FIG. 12a is a schematic diagram of the cross-section view along the direction X in the region C of FIG. 9 for the elements 120.
Figure 12:
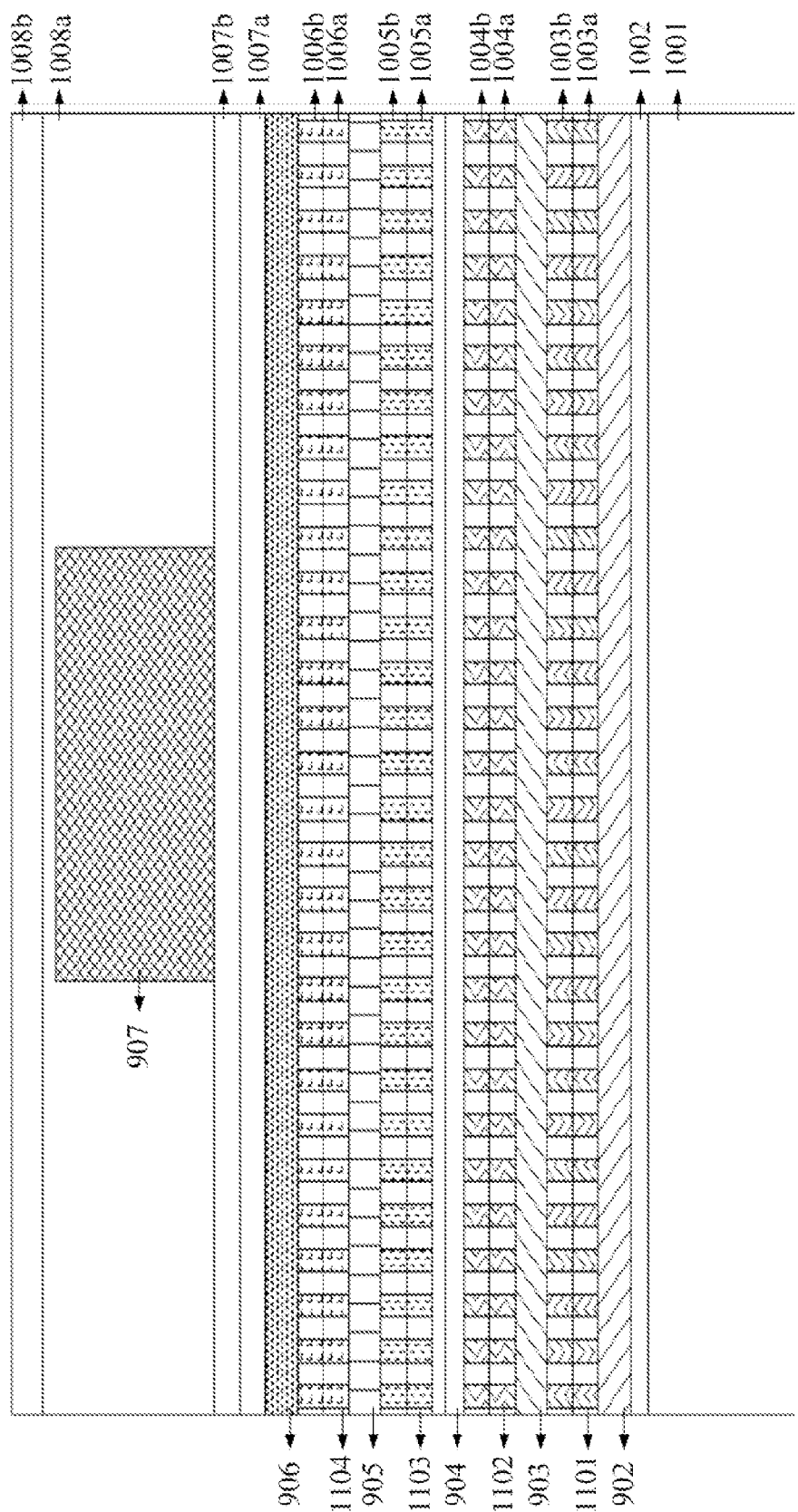
FIG. 12b is a schematic diagram of the cross-section view along the direction Y in the region C of FIG. 9 for the elements 120.
Figure 13A:
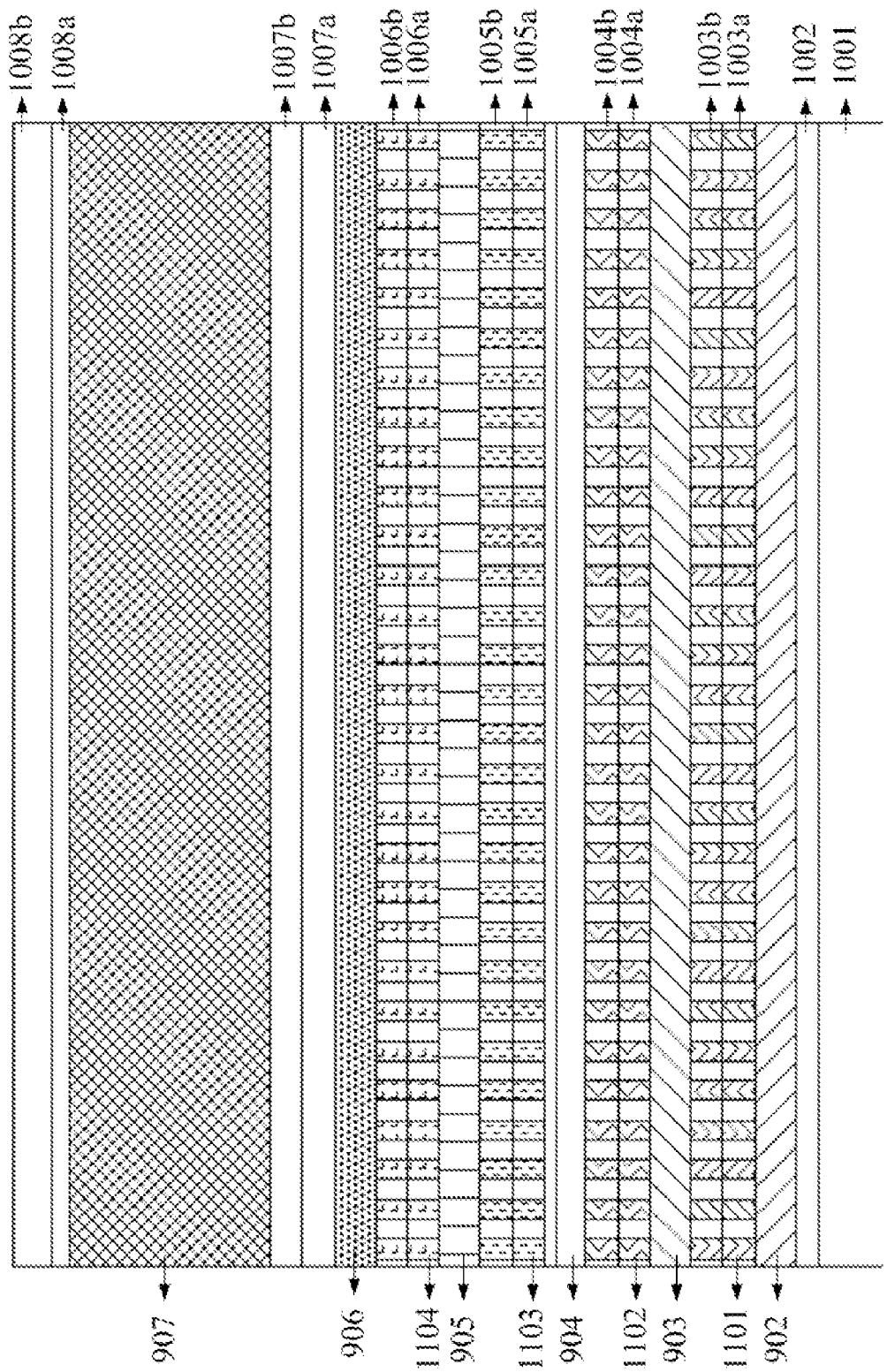
FIG. 13a is a schematic diagram of the cross-section view along the direction X in the region D of FIG. 9 for the elements 120.
Figure 13B:
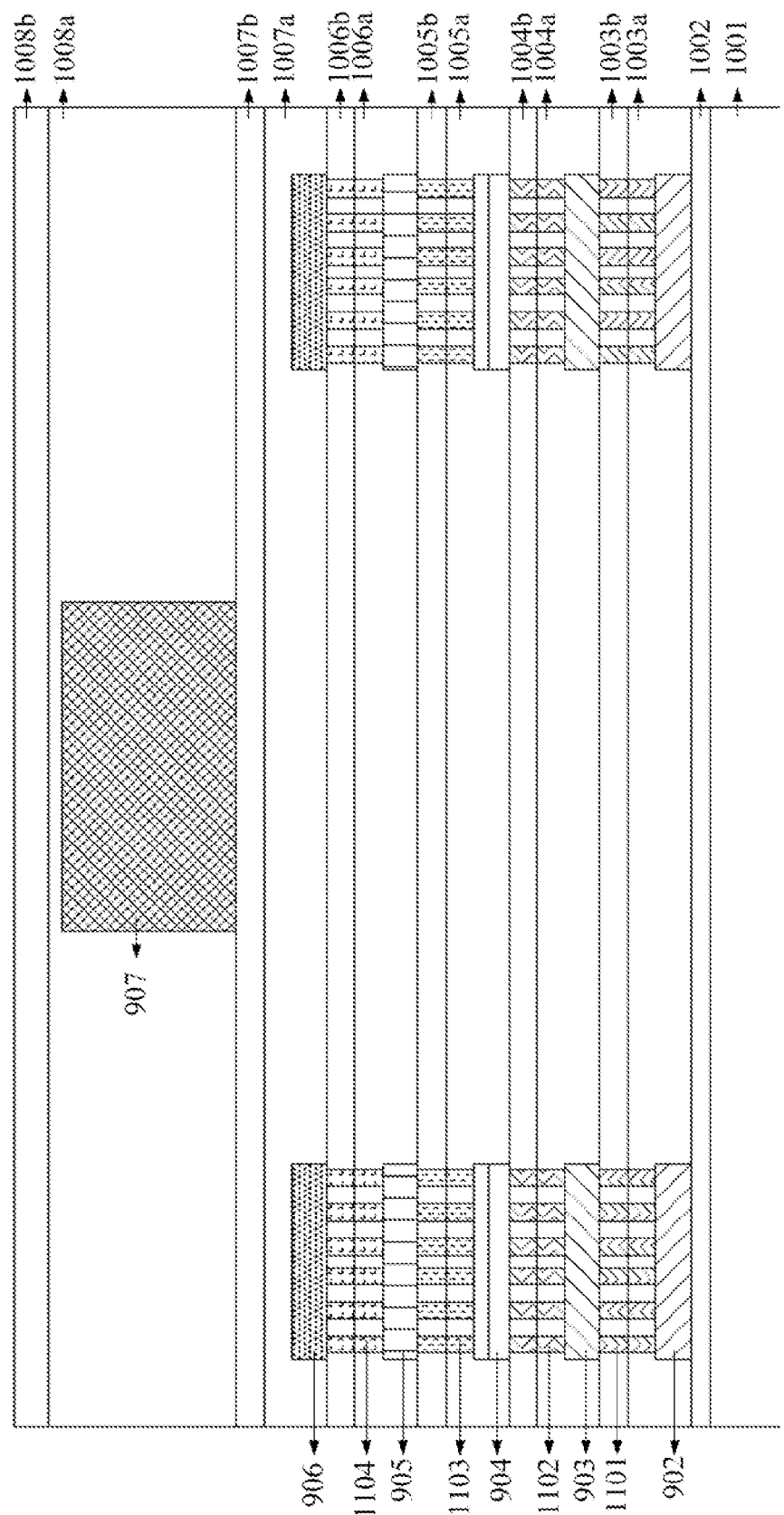
FIG. 13b is a schematic diagram of the cross-section view along the direction Y in the region D of FIG. 9 for the elements 120.
Figure 14A:
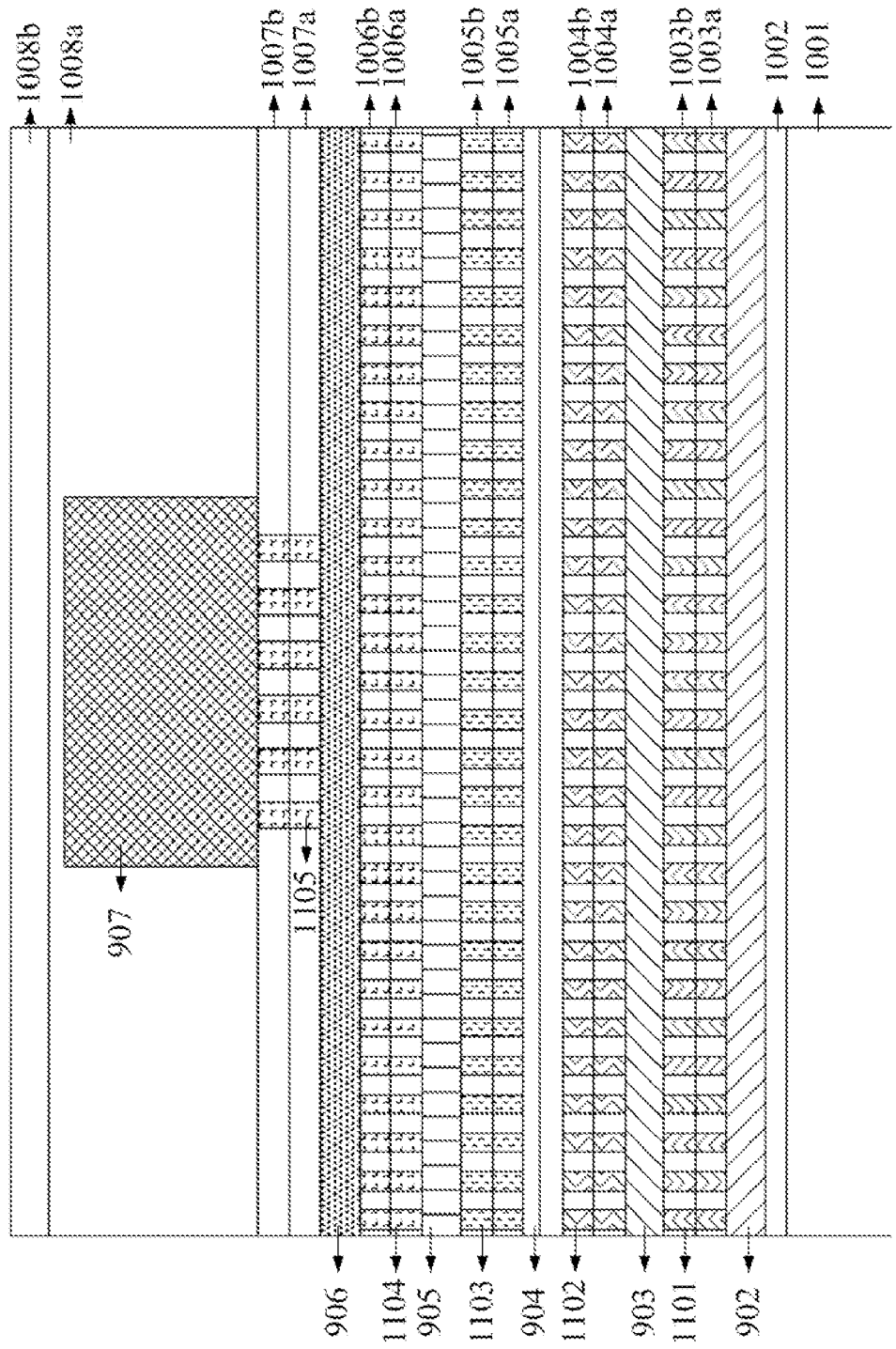
FIG. 14a is a schematic diagram of the cross-section view along the direction X in the region E of FIG. 9 for the elements 120.
Figure 14B:
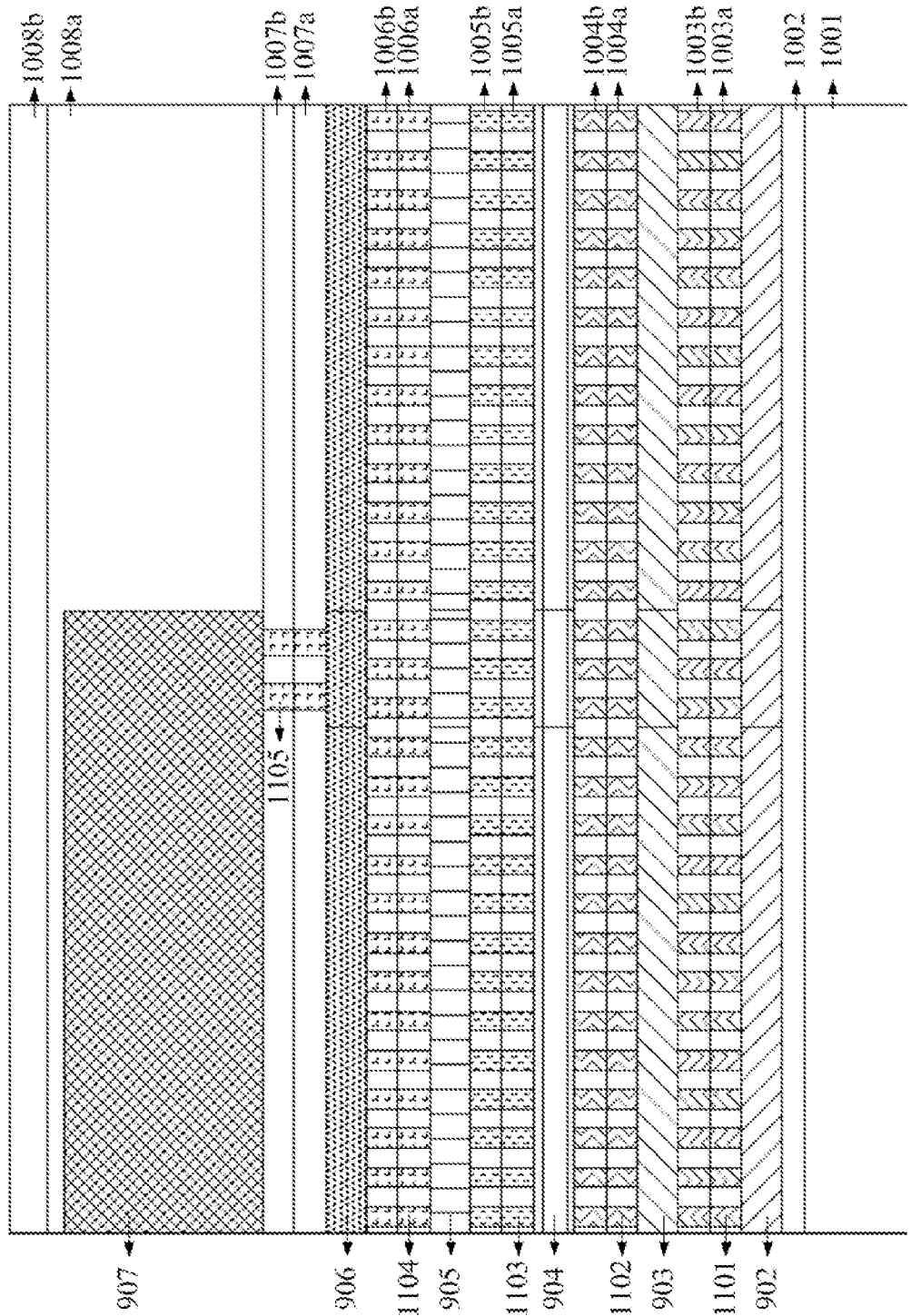
FIG. 14b is a schematic diagram of the cross-section view along the direction Y in the region E of FIG. 9 for the elements 120.
Figure 15A:
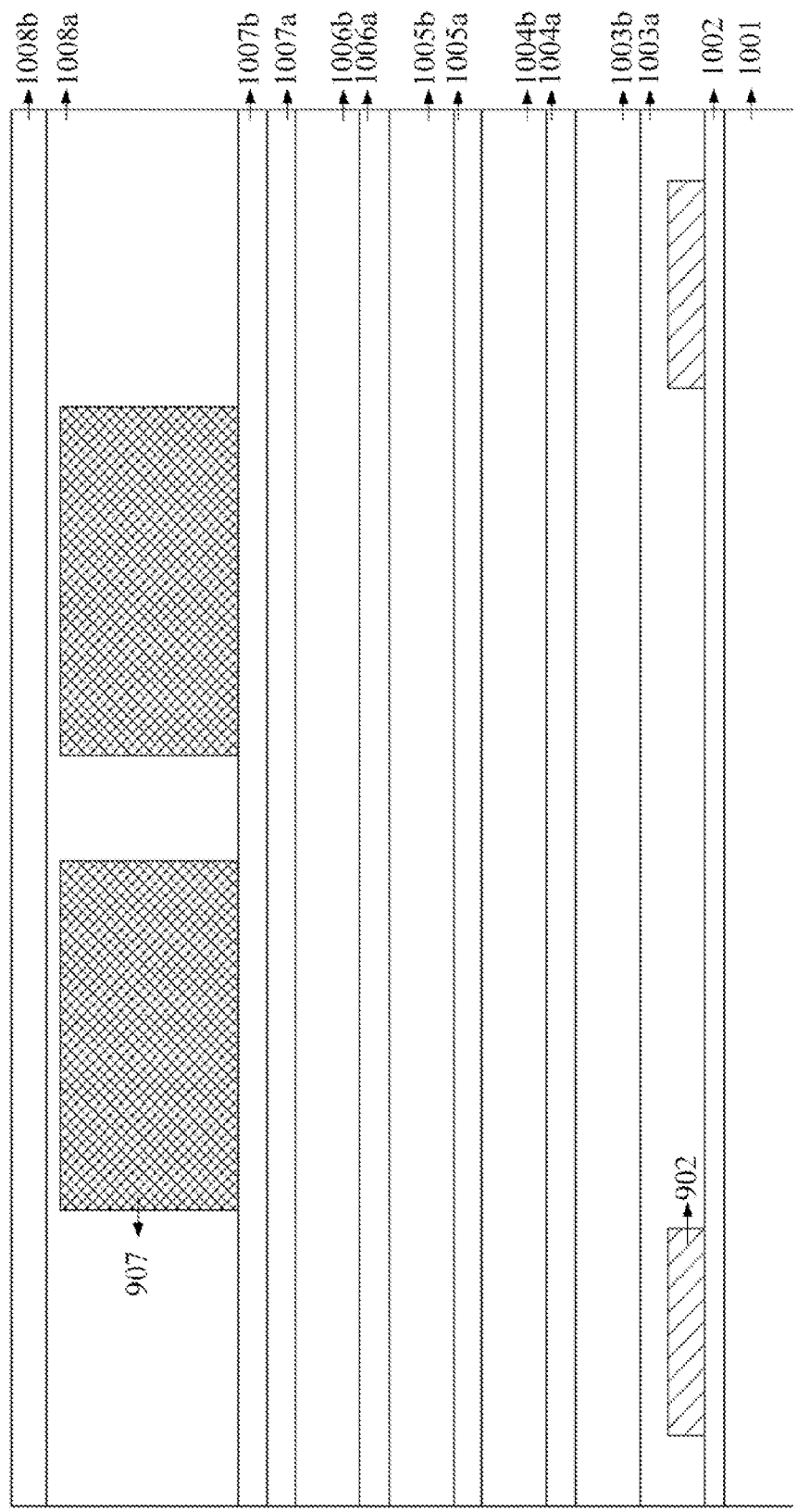
FIG. 15a is a schematic diagram of the cross-section view along the direction X in the region F of FIG. 9 for the elements 104.
Figure 15B:
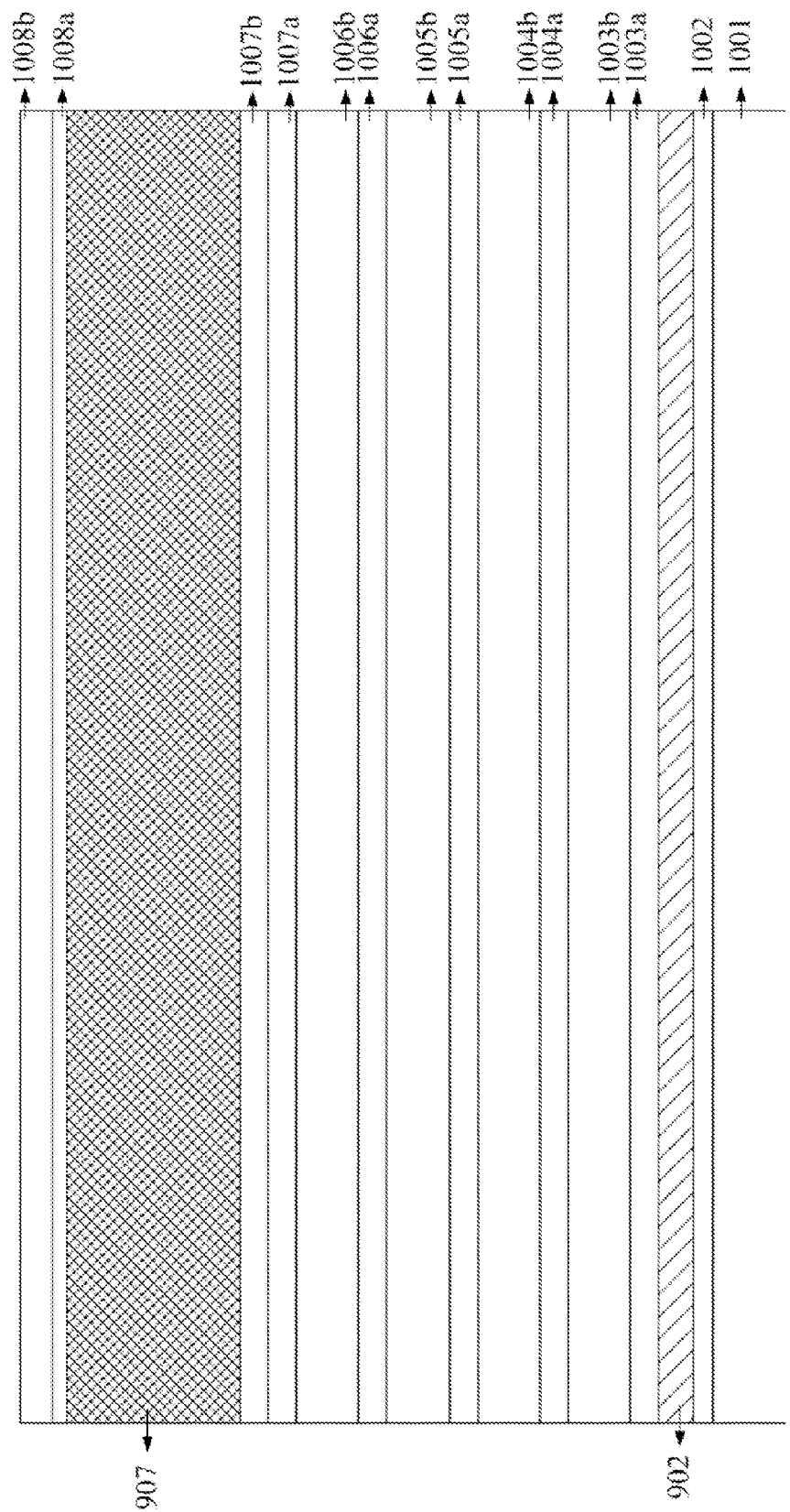
FIG. 15b is a schematic diagram of the cross-section view along the direction Y in the region F of FIG. 9 for the elements 104.
Figure 16A:
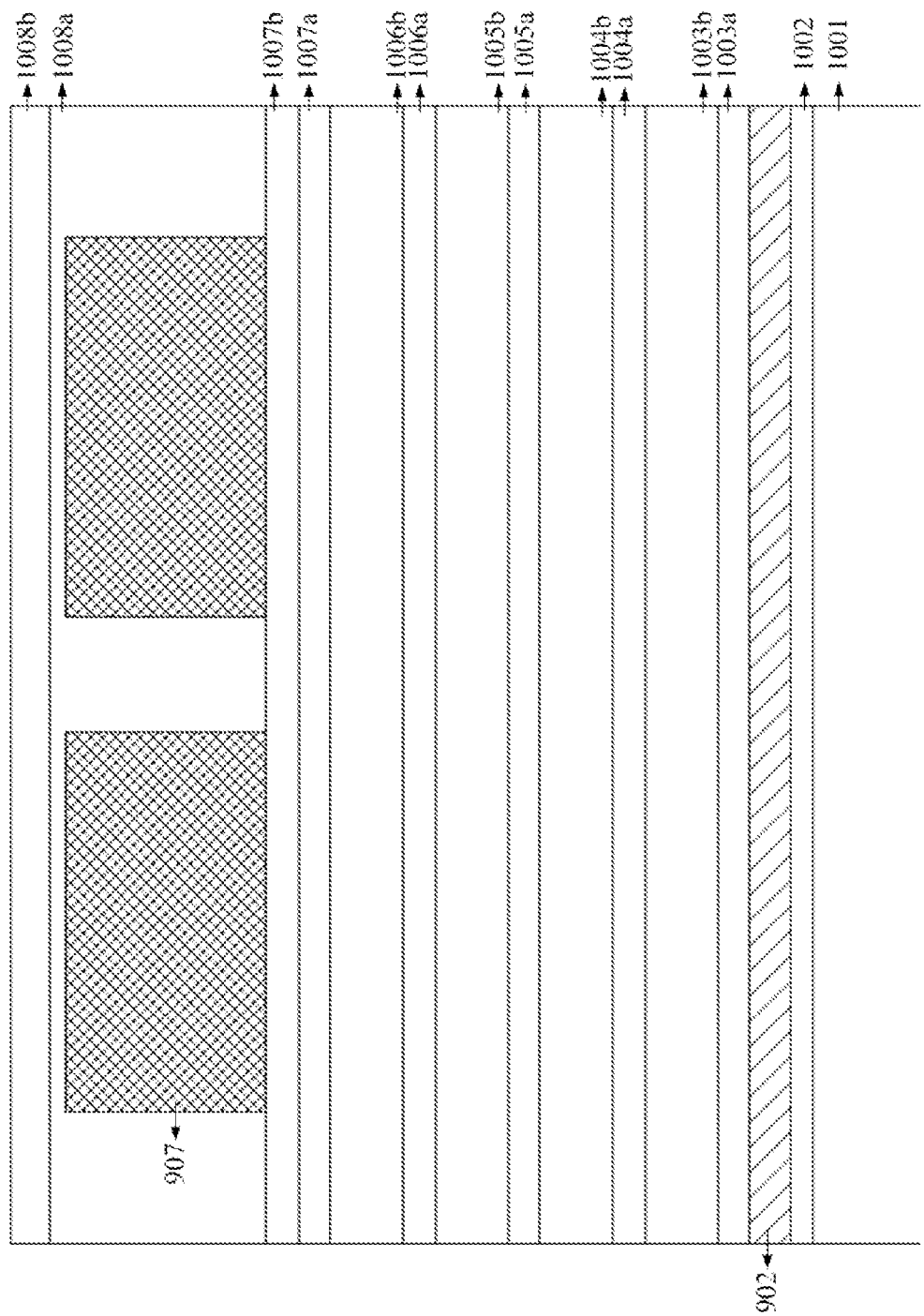
FIG. 16a is a schematic diagram of the cross-section view along the direction X in the region G of FIG. 9 for the element 104.
Figure 16B:
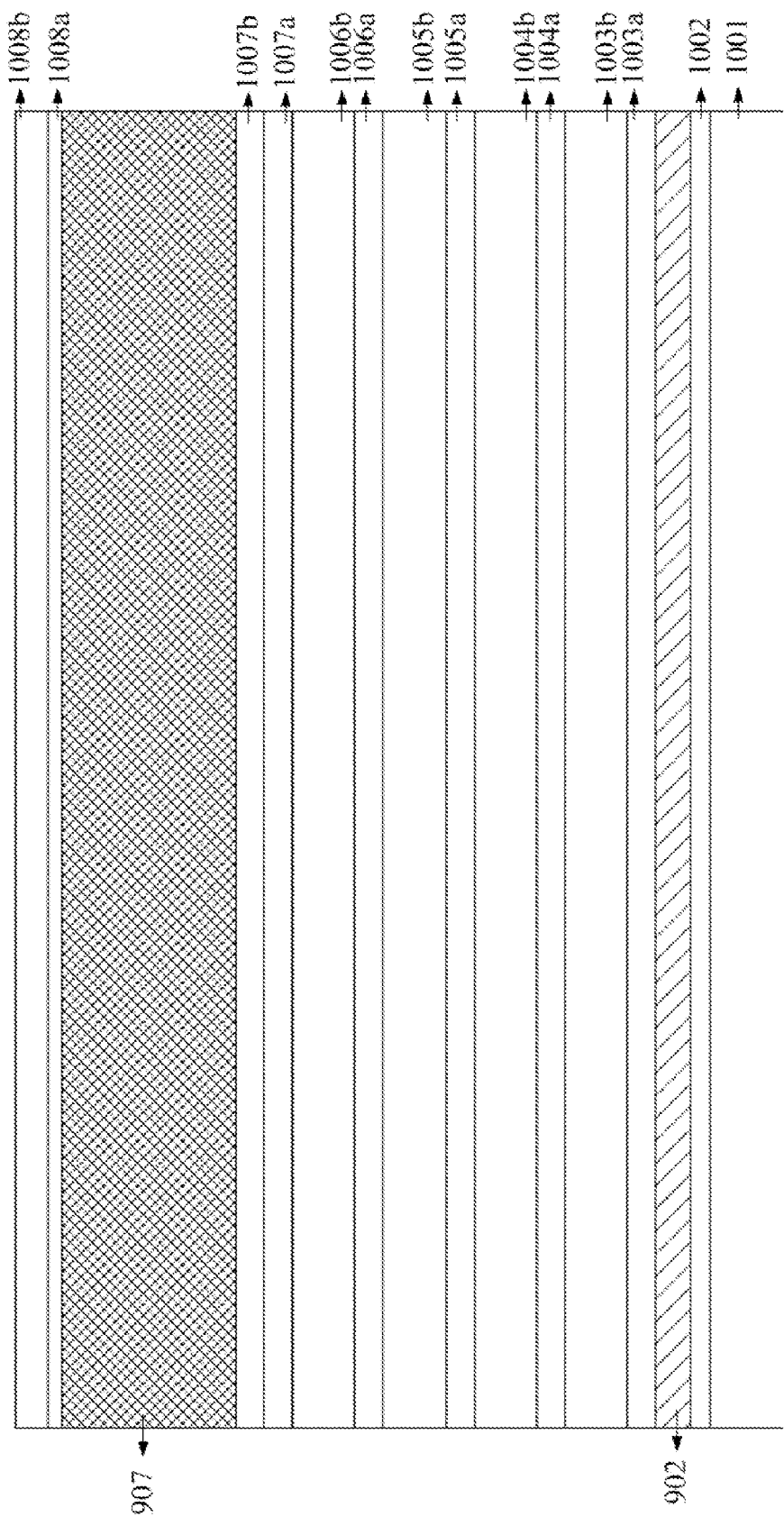
FIG. 16b is a schematic diagram of the cross-section view along the direction Y in the region G of FIG. 9 for the element 104.
Figure 17A:
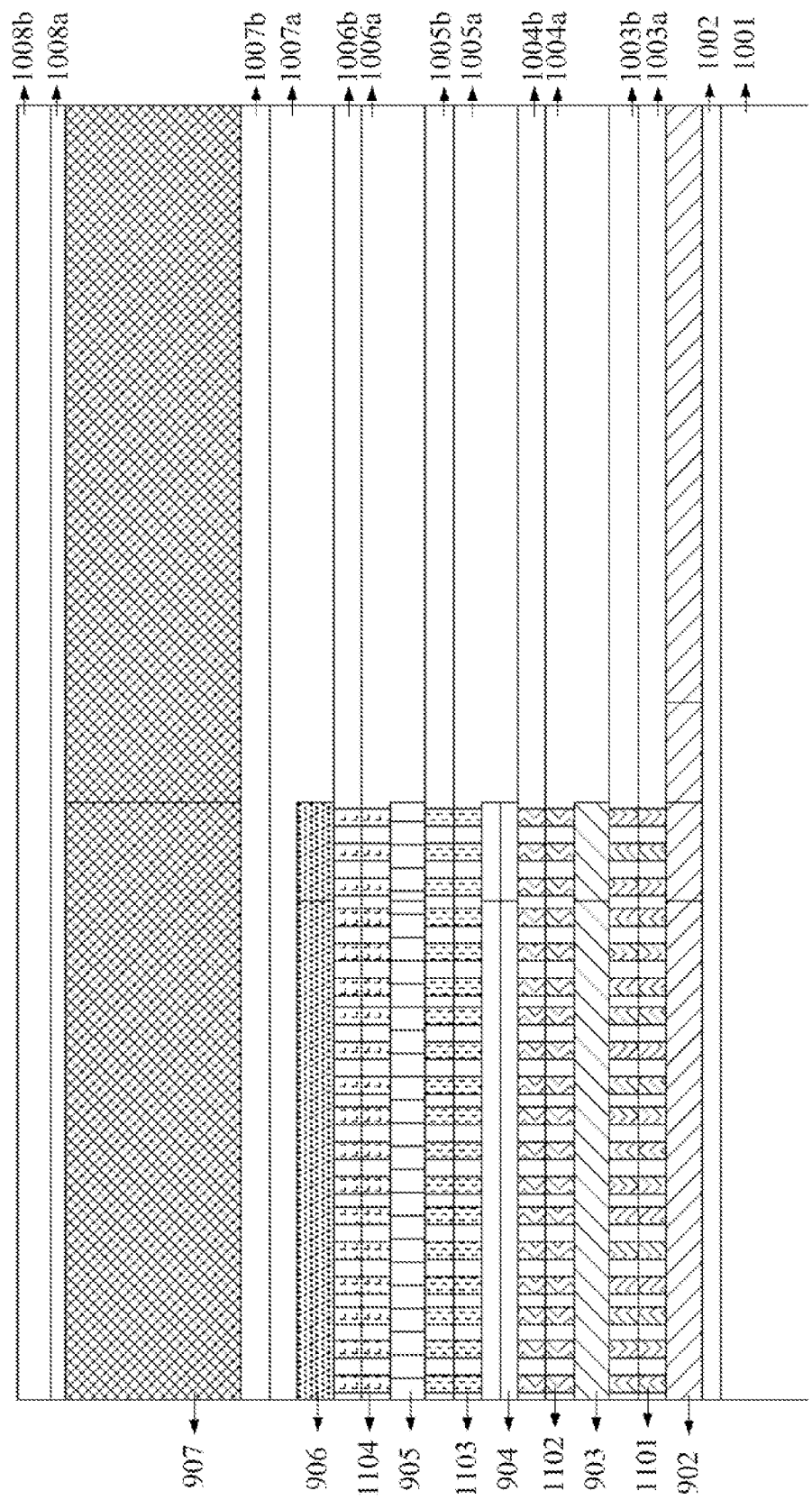
FIG. 17a is a schematic diagram of the cross-section view along the direction X in the region H of FIG. 9.
Figure 17B:
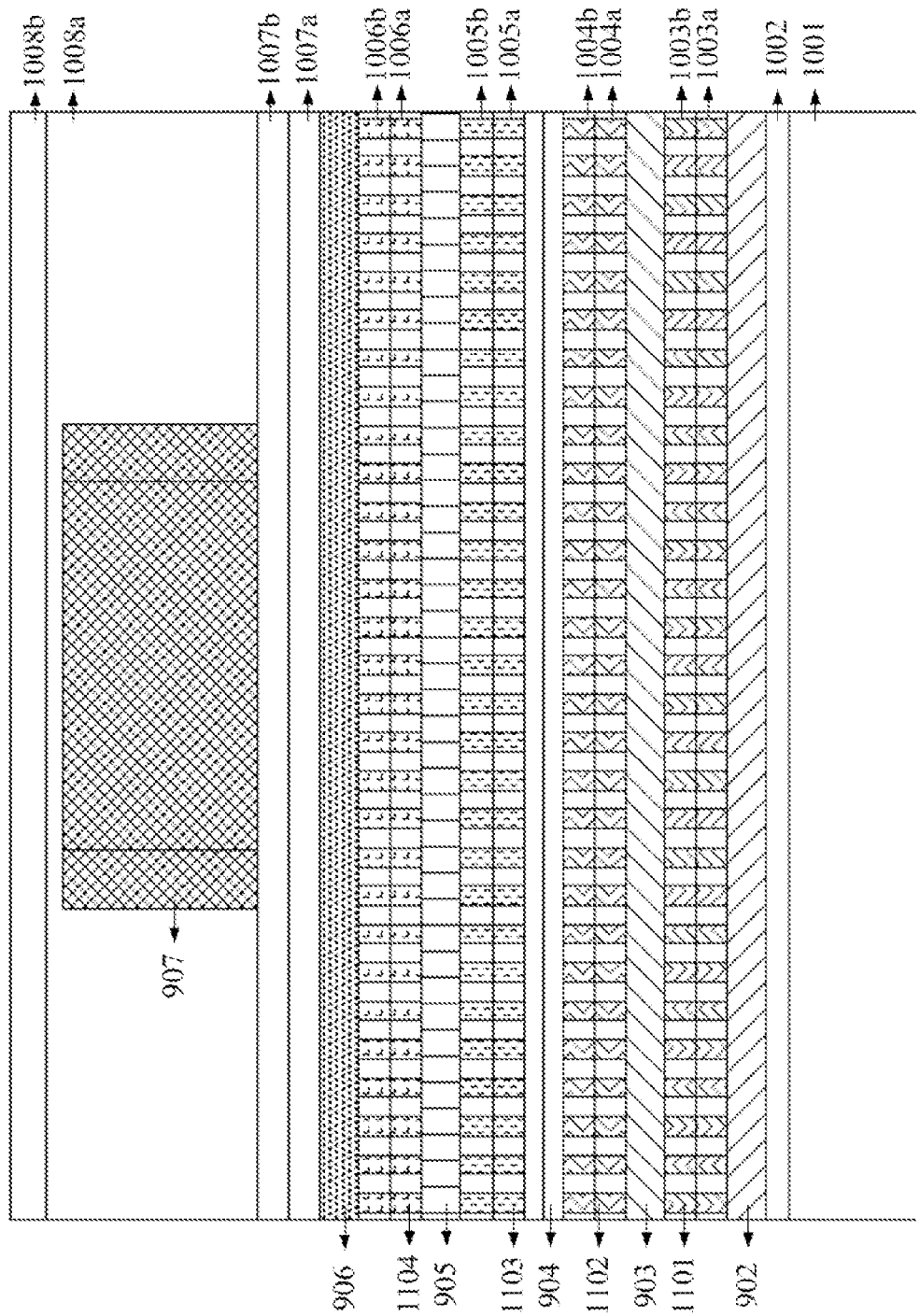
FIG. 17b is a schematic diagram of the cross-section view along the direction Y in the region H of FIG. 9.
Figure 18:
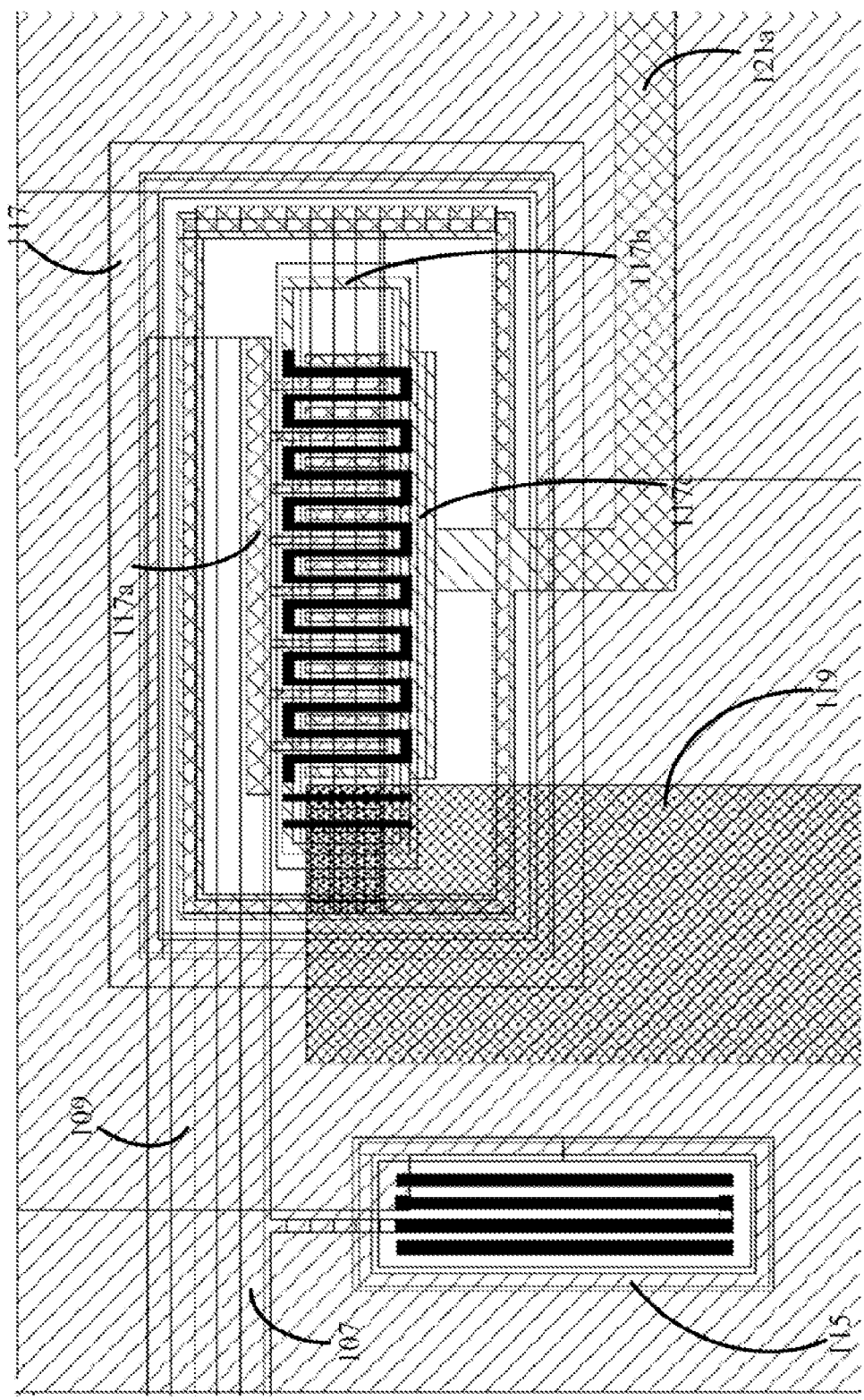
FIG. 18 is a schematic diagram of the connections between the element 107, 109, 115, 117, and node 128.

In FIG. 9, the element 107 and 108 are in the form of the transmission line 403. FIGS. 11a and 11b show the cross-section views along the direction X and Y in the region B of the FIG. 9. Via layer 1101, 1102, 1103, 1104, are the first, second, third, and fourth via layer. The metal layer 903 can connect with the metal layer 902 through 1101. The metal layer 904 can connect with metal layer 903 through 1102. The metal layer 905 can connect with the metal layer 904 through via layer 1103. The metal layer 906 can connect with the metal layer 905 through via layer 1104. The metal layer 902 realizes the signal trace of the transmission line 403. The reference ground of the transmission line 403 is realized by the metal layer 902, 903, 904, 905, and 906. As shown in FIG. 11, the signal trace does not connect with the reference ground. The signal width of element 107 and 108 is 4.0 micrometers. The elements 102, 106, 119, and 120 are in the form of the transmission line 403 in FIG. 9. FIGS. 12 and 13 show the cross-section views in the region C and D of the FIG. 9 for the elements 102, 106, 119, and 120. The signal trace is realized by the metal layer 907. The reference ground is realized by stacking the metal layer 902, 903, 904, 905, and 906. The 1101, 1102, 1103, and 1104 are applied to interconnection between the metal layer 902, 903, 904, 905, and 906. The signal width of the elements 102, 106, 119, and 120 is 9.0 micrometers. The overlapping area between the signal trace and reference ground is 9.0 micrometers by 1.0 micrometers. FIGS. 14a and 14b shows the cross-section view in the region E of the FIG. 9, revealing the method for the elements 119 and 120 connecting with the node 999. The metal layer 907 connects with the metal layer 906 through via layer 1105. Since metal layer 906 can connect with the metal layer 902 through 1104, 1103, 1102, and 1101, the metal layer 907 can connect with the metal layer 902. The element 104 in FIG. 9 is the edge-coupled coupler. FIGS. 15 and 16 shows the cross-section views in the region F and G of the FIG. 9 for the element 104. The signal trace and reference ground of the element 104 are realized by the metal layer 907 and 902. The line width and line spacing of the signal grace of the element 104 are 2.0 micrometers and 1.2 micrometers, respectively. The overlapping area between the signal trace and reference ground is 4.0 micrometers by 0.5 micrometers. FIG. 17 shows the cross-section views in the region H of the FIG. 9, illustrating the interconnection between the element 102 and 104. The signal traces and reference ground of the two elements are connected via the metal layer 907 and 902, respectively. The overlapping area between the signal trace and reference in the connection between the element 102 and 104 is 2.0 square micrometers. FIG. 18 shows the connections between the element 117, 107, 119, and the resistor 115. The resistor 115 connects with the element 107 through the metal layer 902, 903, 904, and via layer 1101, and 1102. The resistor 115 connects with the note 999 through the metal layer 902. The gate of the element 117 is made by poly layer 901. The bulk-terminal of the element 117 connects with the node 117b through the metal layer 904. The node 117c connects with node 128 through the metal layer 902, via layer 1101, and the metal layer 903. The node 117a connects with the element 109 through the metal layer 902, via layer 1101, metal layer 903, via layer 1102, and metal layer 904. The node 117b connects with element 119 through the metal layer 904, via layer 1103, metal layer 905, via layer 1104, metal layer 906, via layer 1105, and metal layer 907. The element 118 connects with the elements 108, 110, 116, and node 128 through the identical metal layers and via layers to those of the element 117. Via layer 1101, 1102, 1103, 1104, and 1105 can be made by metal, comprising aluminum, copper, electroplating copper, sputtering copper, and gold. Via on via layer 1101 1102, 1103, 1104, and 1105 are square, and the size of via is between 0.1 micrometers and 5.0 micrometers. The spacing of via is between 0.1 micrometers and 5.0 micrometers.

Figure 19A:
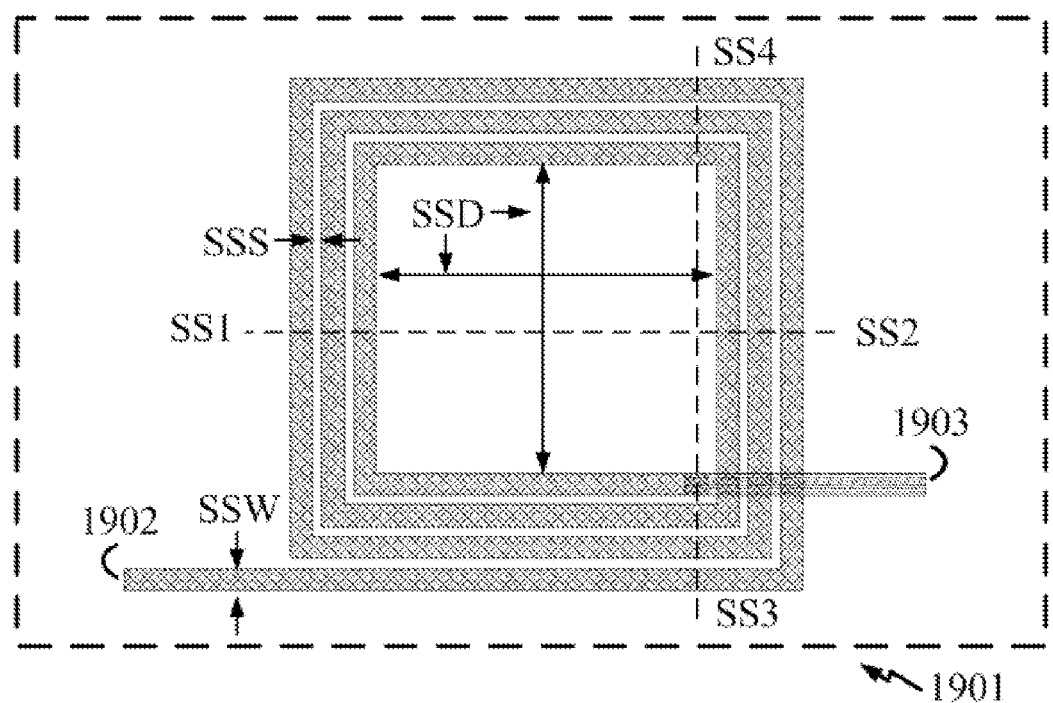
FIG. 19 is a schematic diagram of the appearance of the element 401 on a semiconductor chip.
Figure 19B:
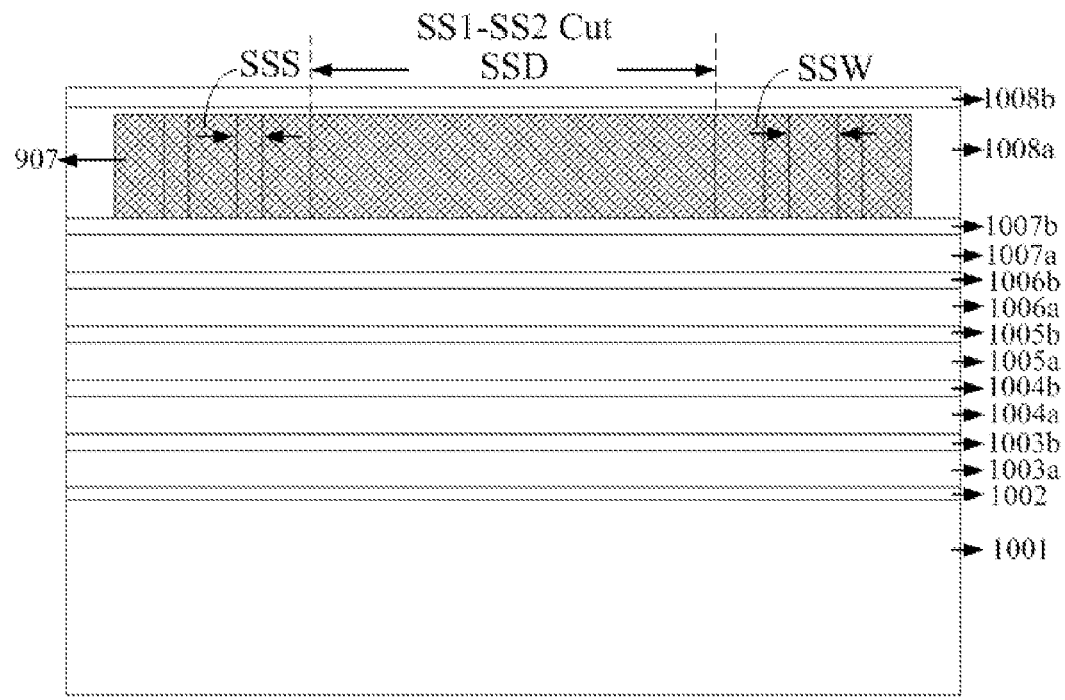
Figure 19B:
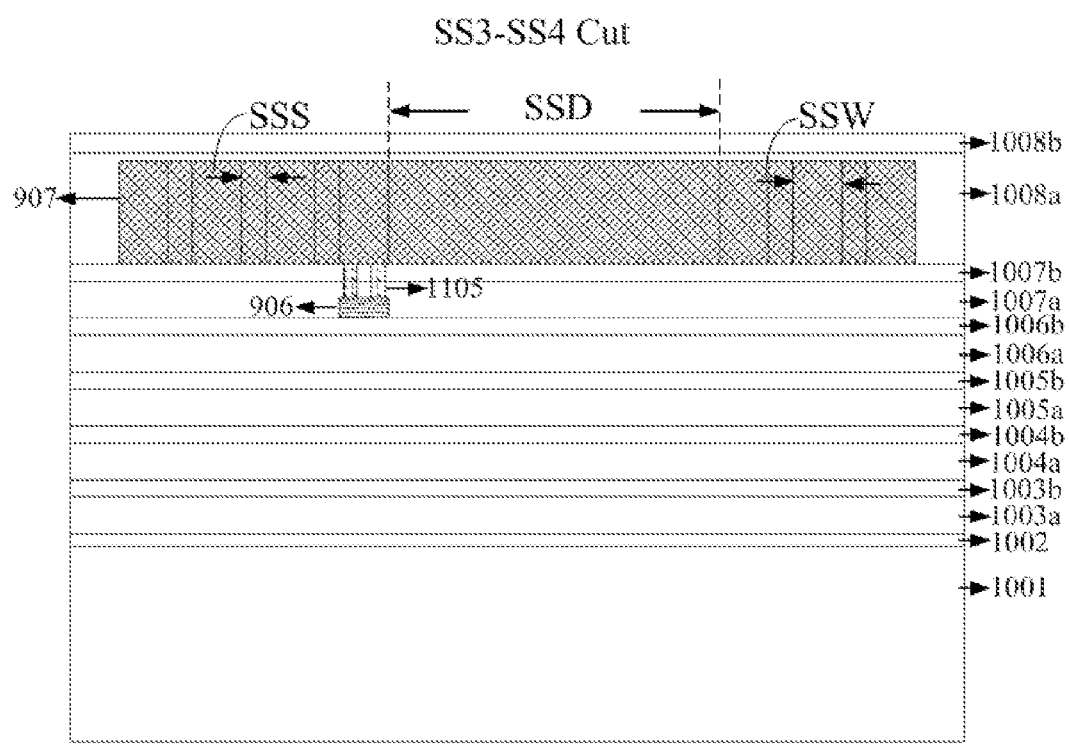
Figure 20A:
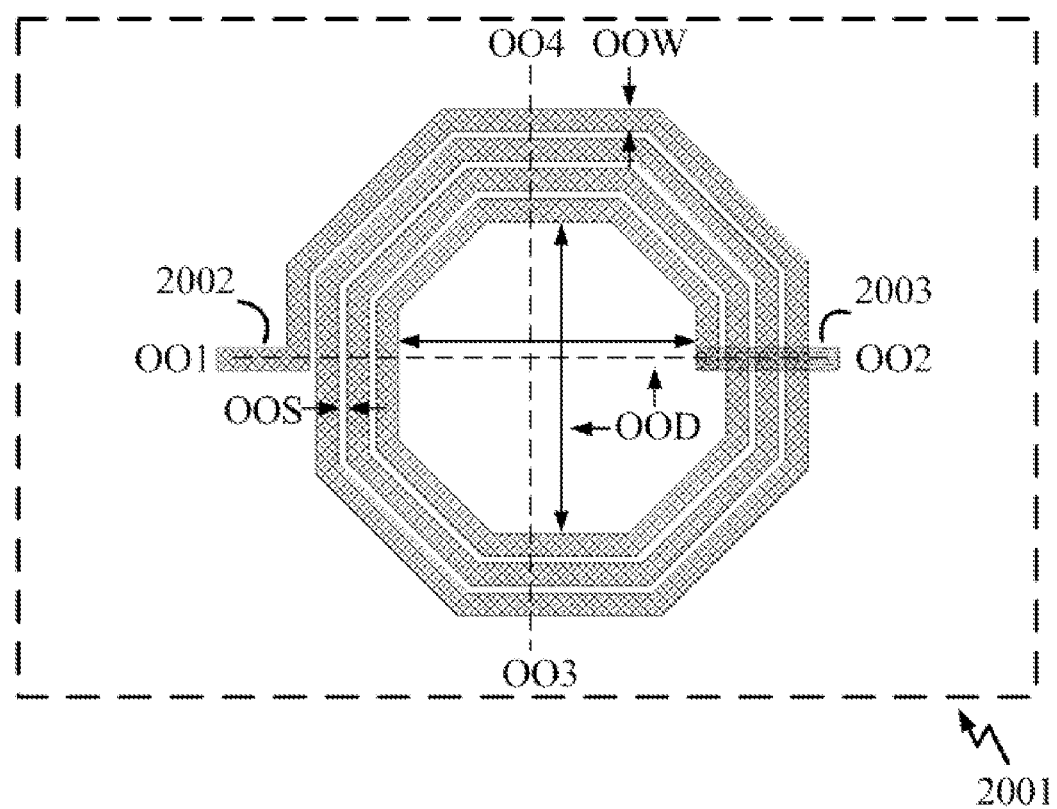
FIG. 20 is a schematic diagram of another appearance of the element 401 on a semiconductor chip.
Figure 20B:
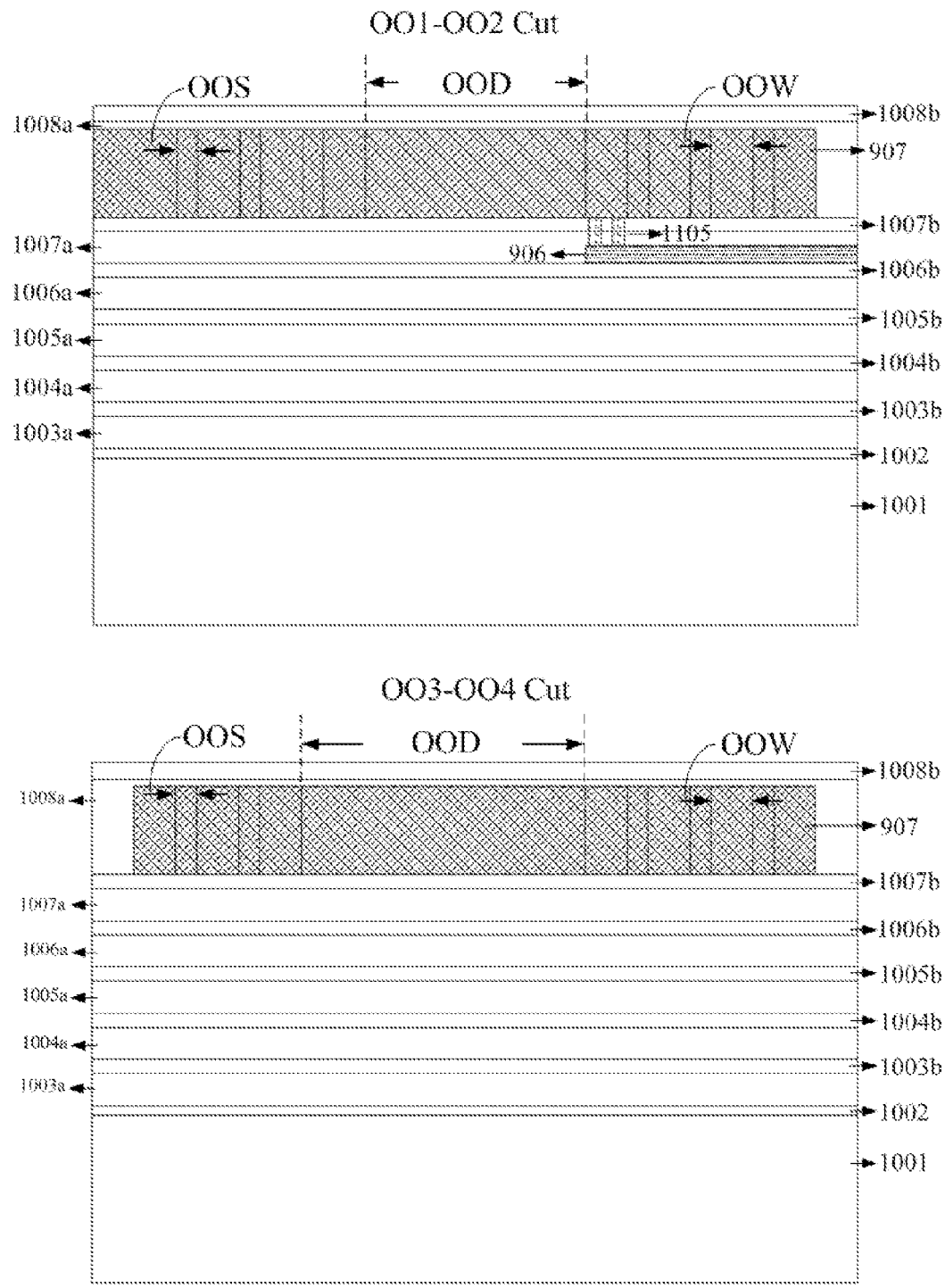
Figure 21A:
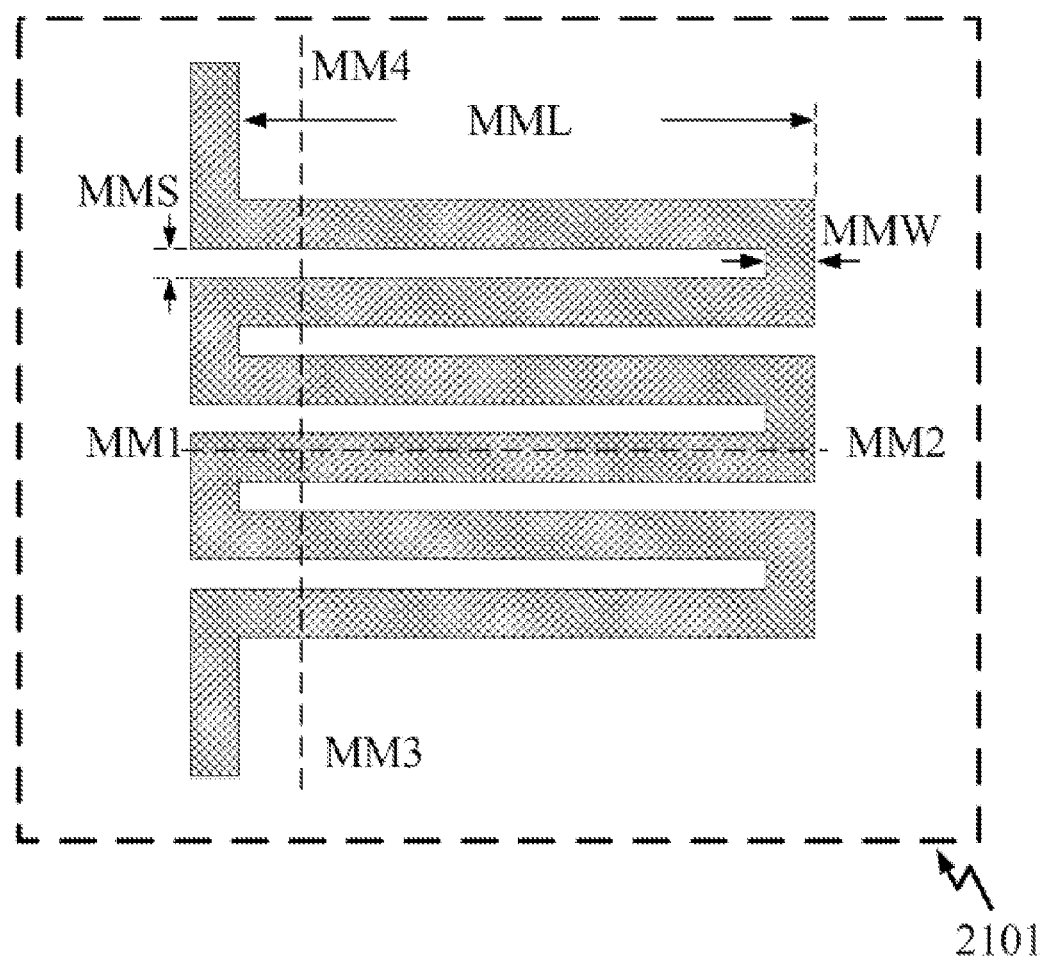
FIG. 21 is a schematic diagram of another appearance of the element 401 on a semiconductor chip.
Figure 21B:
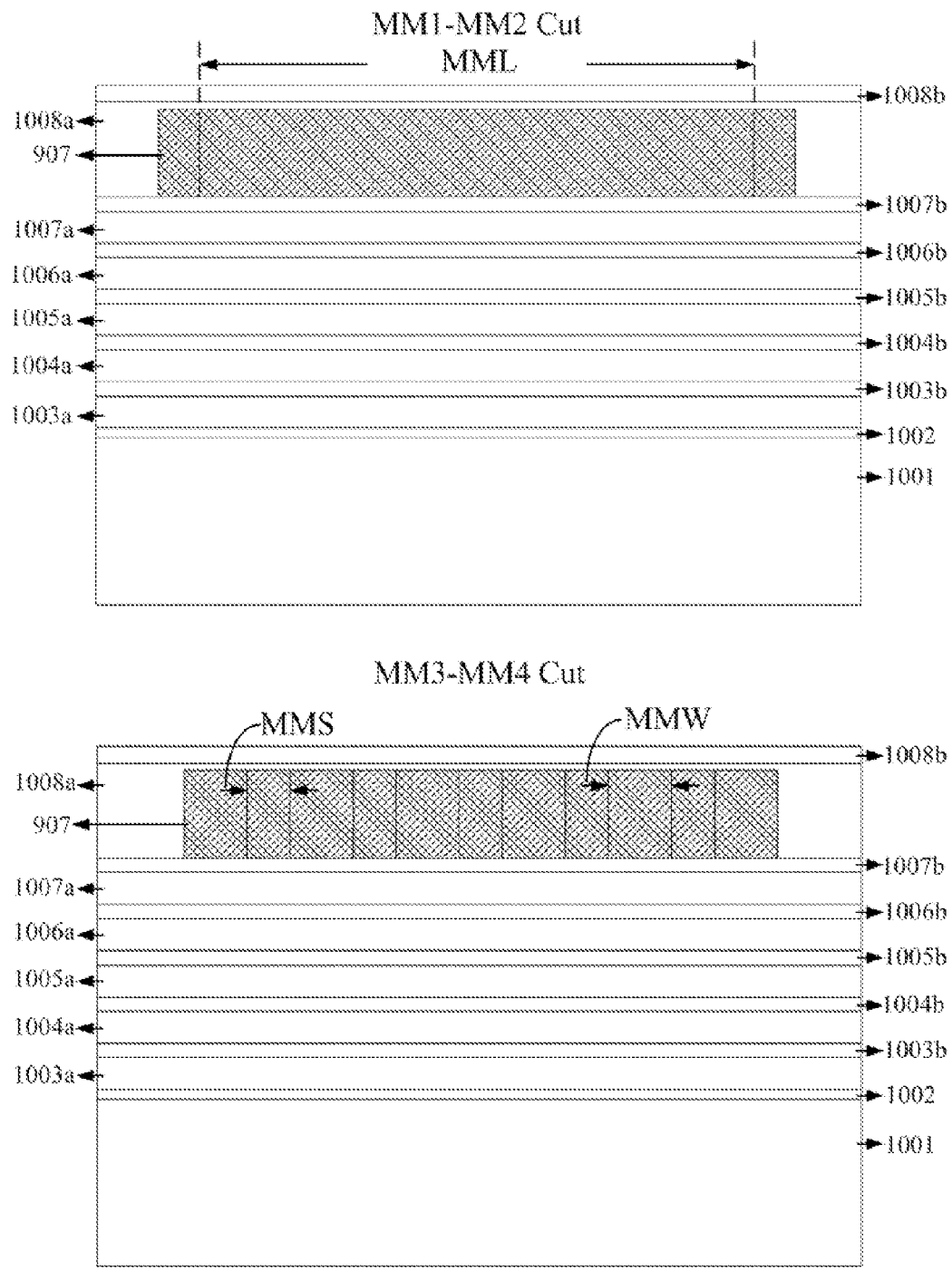
Figure 22A:
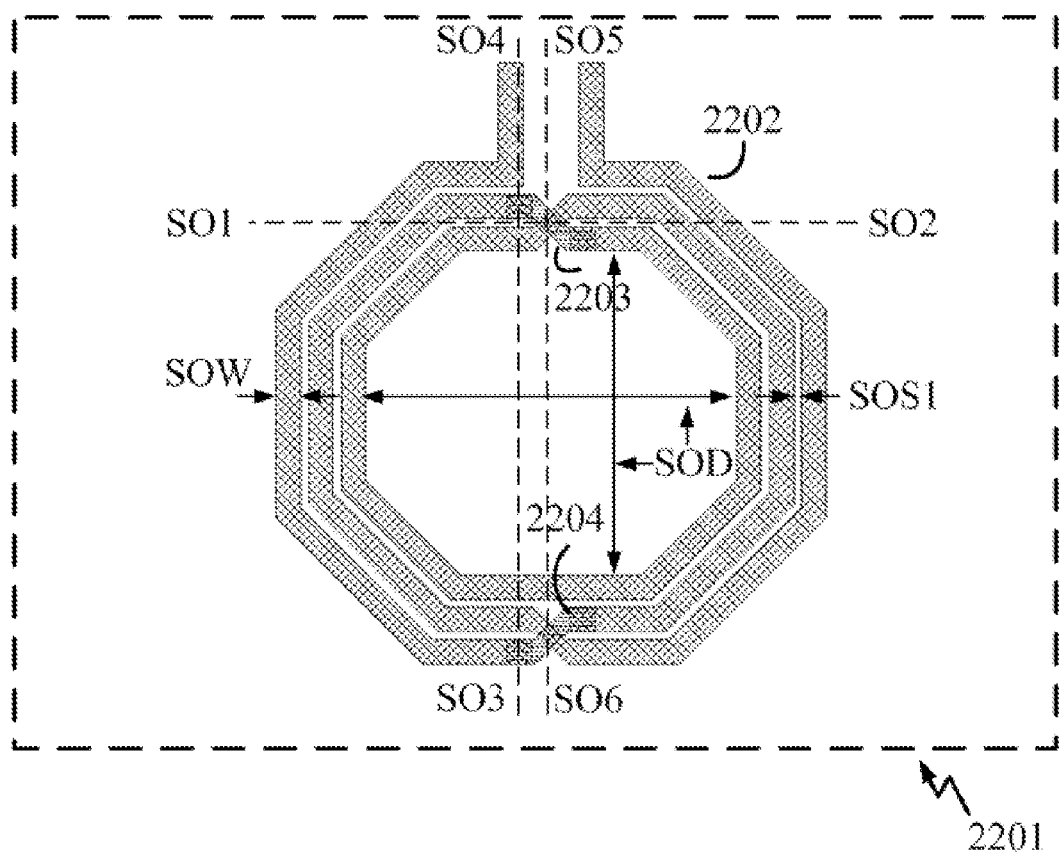
FIG. 22 is a schematic diagram of another appearance of the element 401 on a semiconductor chip.
Figure 22B:
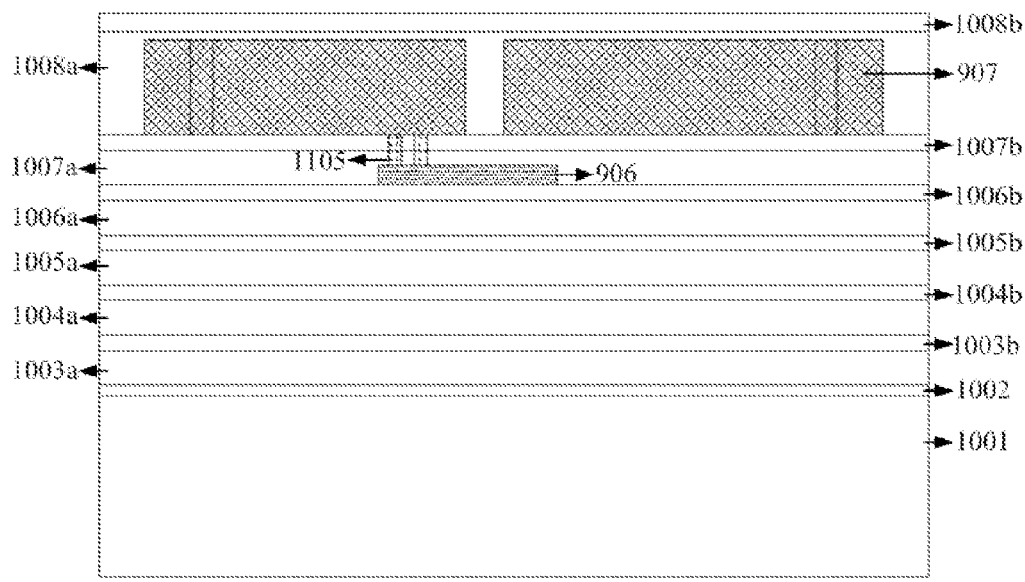
Figure 22B:
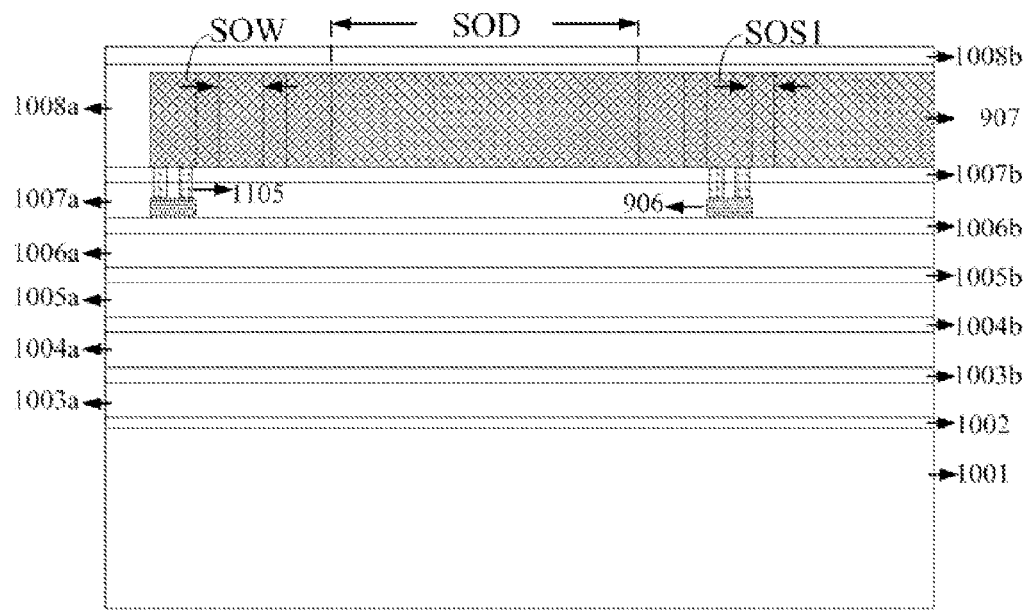
Figure 23A:
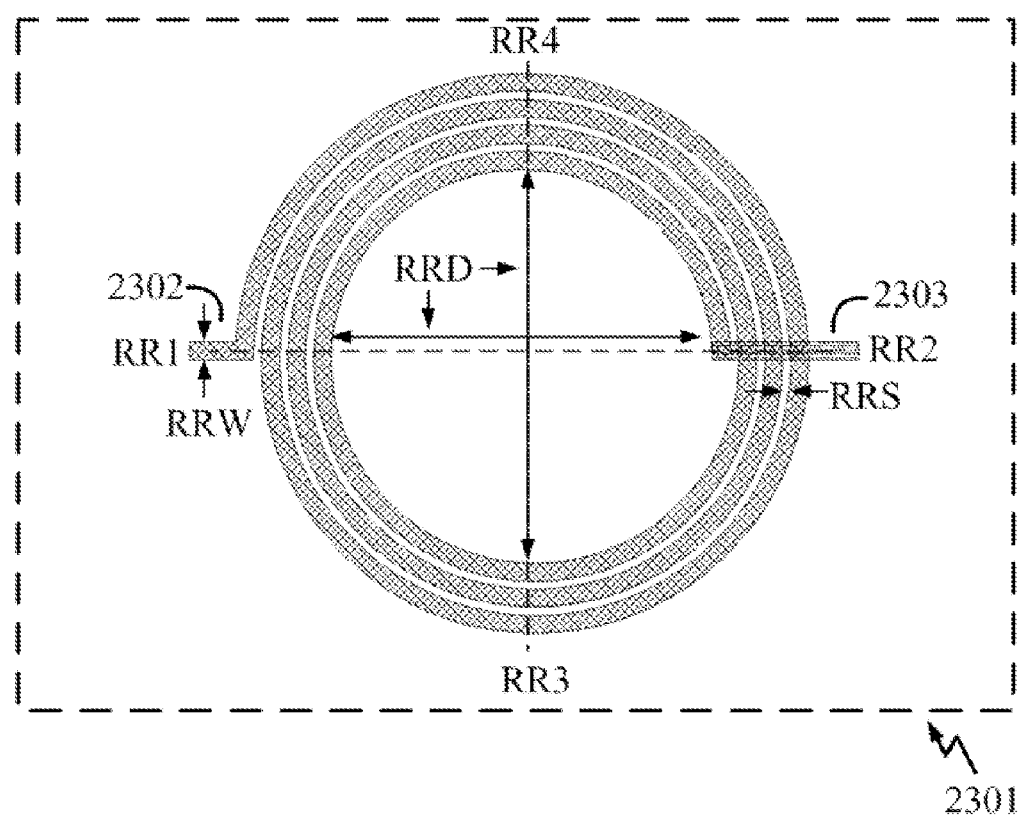
FIG. 23 is a schematic diagram of another appearance of the element 401 on a semiconductor chip.
Figure 23B:
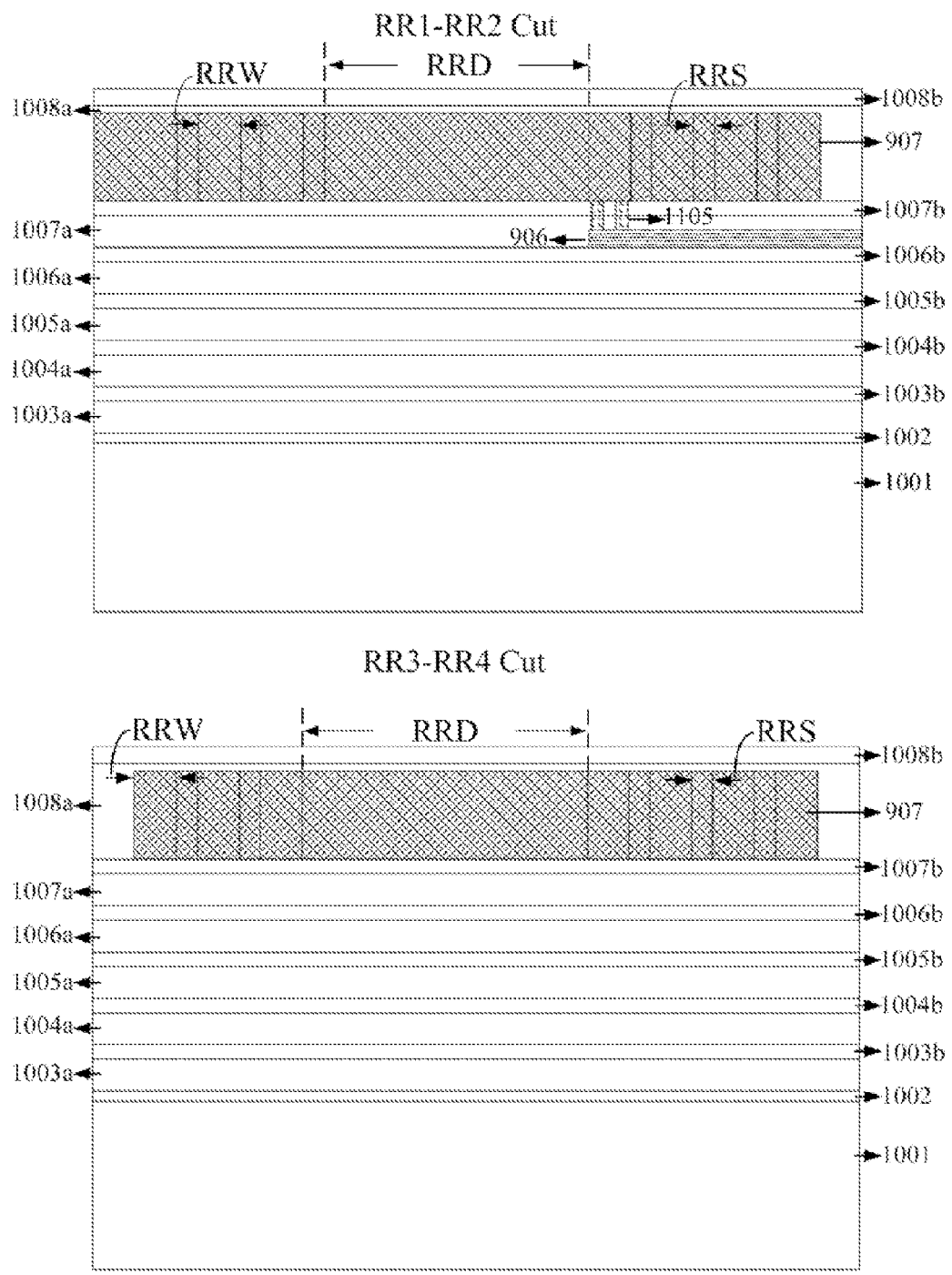

FIG. 19 shows the inductor 401 on a semiconductor chip with a form of the rectangular spiral. The rectangular spiral inductor 1901 is realized by the metal layer 907 and 906. The element 1903 connects with the 1902 through via layer 1105. The trace of element 1901 is arranged in the form of the rectangular spiral. The line width SSW is between 3.0 micrometers and 30.0 micrometers. The line space SSS is between 1.2 micrometers and 5.0 micrometers. The number of turn of the rectangular spiral inductor 1901 is between 1.5 and 6.5. The inner diameter SSD is between 20.0 micrometers and 150.0 micrometers. In FIG. 20, the inductor 401 is on the semiconductor chip with a form of the octagonal spiral. The octagonal spiral inductor 2001 is realized by the metal layer 907 and 906. The element 2003 connects with 2002 through via layer 1105. The signal line of octagonal spiral inductor 2001 is arranged in an octagonal spiral. The line width OOW is between 3.0 micrometers and 30.0 micrometers. The line space OOS is between 1.2 micrometers and 5.0 micrometers. The number of turn of the octagonal spiral inductor 2001 is between 1.5 and 6.5. The inner diameter OOD is between 20.0 micrometers and 150.0 micrometers. In FIG. 21, the inductor 401 is on a semiconductor chip with a form of meandered line. The meandered inductor 2101 is realized by a metal layer 907. The signal trace of element 2101 is arranged in the meandered form. The segment width MMW is between 3.0 micrometers and 30.0 micrometers. The segment spacing MMS is between 1.2 micrometers and 5.0 micrometers. The segment length MOML is between 5.0 micrometers and 50.0 micrometers. The number of the segment of the meandered inductor 2101 is between 1.0 and 10.0. In FIG. 22, the inductor 401 is on a semiconductor chip with a form of symmetrical octagonal spiral. The symmetrical octagonal spiral inductor 2201 is realized by the metal layer 907 and 906. The elements 2203 and 2204 connect with 2202 through via layer 1105. The inductor 2201 is symmetrical along the SO5-SO6 cut. The line width SOW is between 3.0 micrometers and 30.0 micrometers. The line space SOS1 is between 1.2 micrometers and 5.0 micrometers. The number of turn of the symmetrical octagonal spiral inductor 2201 is between 1.5 and 6.5. The inner diameter SOD is between 20.0 micrometers and 150.0 micrometers. In FIG. 23, the inductor 401 is on a semiconductor chip with a form of round spiral. The round spiral inductor 2301 is realized by metal layer 907 and 906. The element 2303 connects with 2302 through via layer 1105. The signal trace of the round spiral inductor 2301 is arranged in a round spiral. The line width RRW is between 3.0 micrometers and 30.0 micrometers. The line space RRS is between 1.2 micrometers and 5.0 micrometers. The number of turn of the round spiral inductor 2301 is between 1.5 and 6.5. The inner diameter RRD is between 20 micrometers and 150.0 micrometers.

Figure 24A:
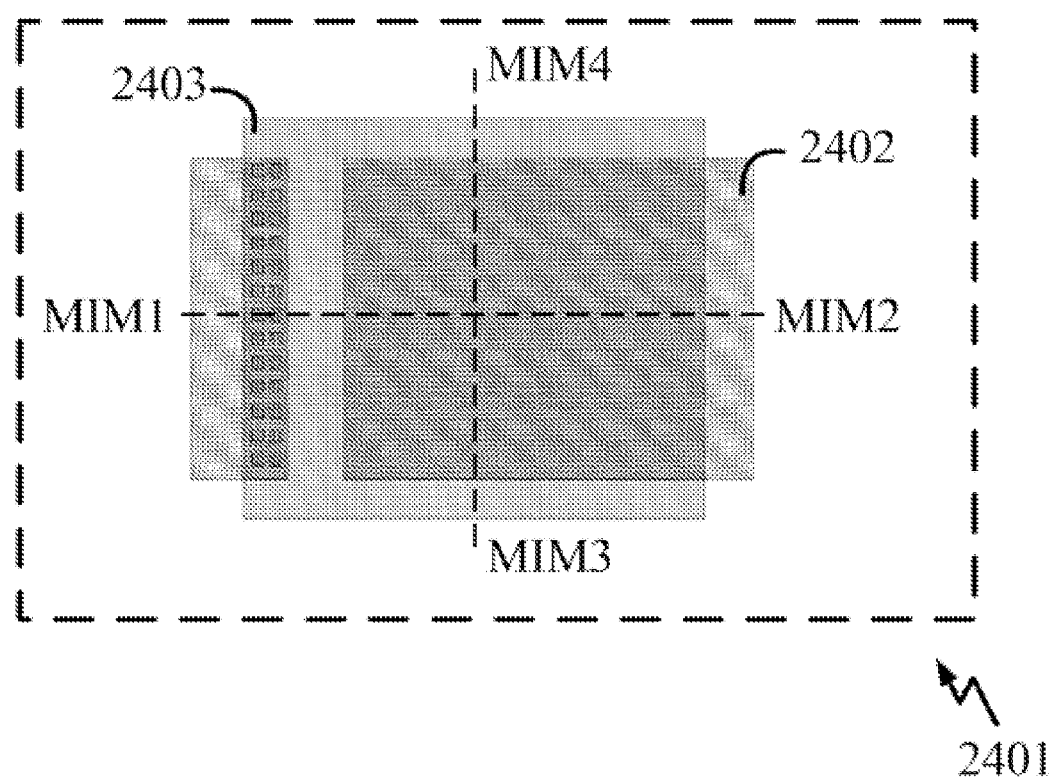
FIG. 24 is a schematic diagram of the appearance of the element 402 on a semiconductor chip.
Figure 24B:
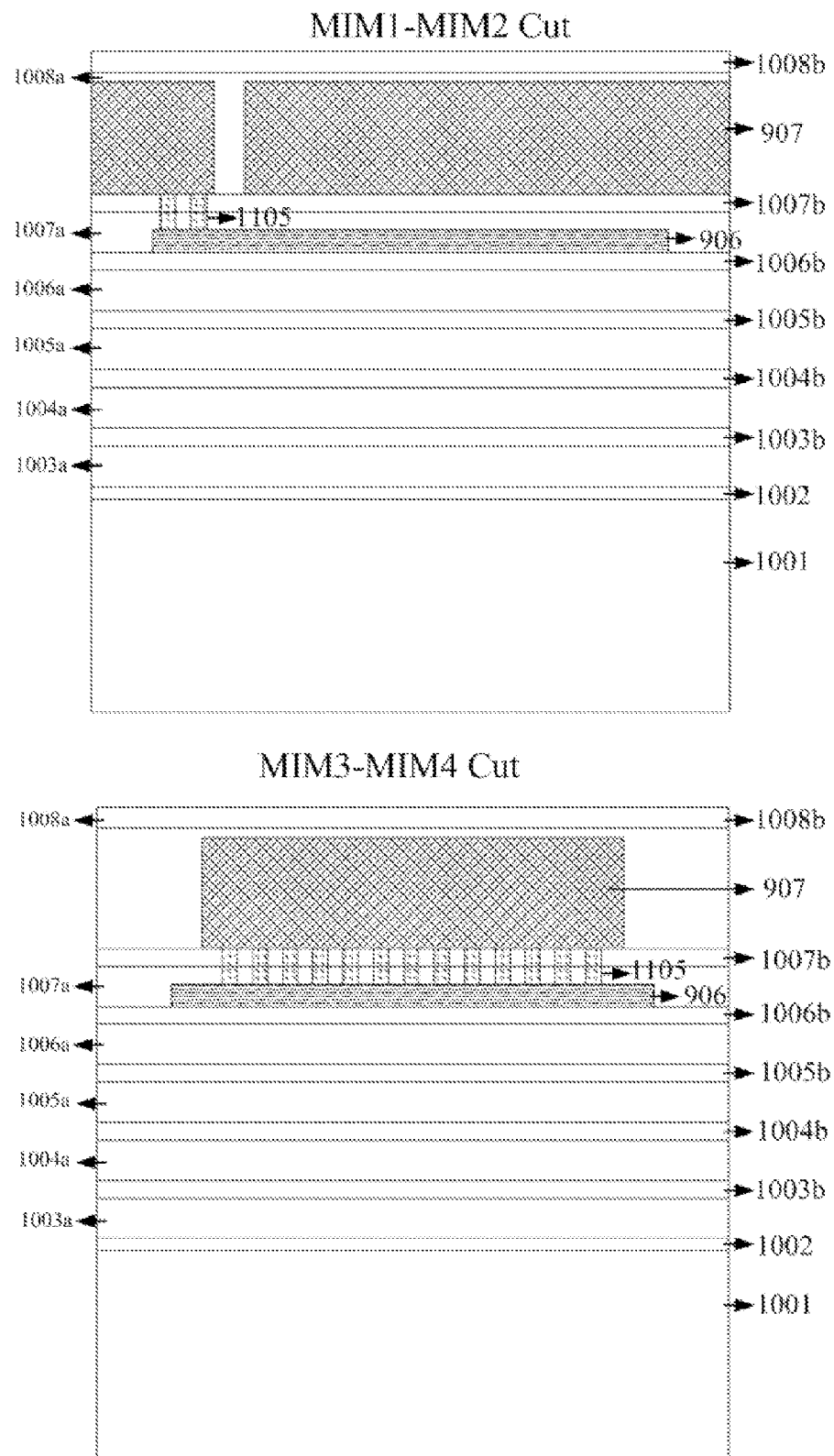
Figure 25A:
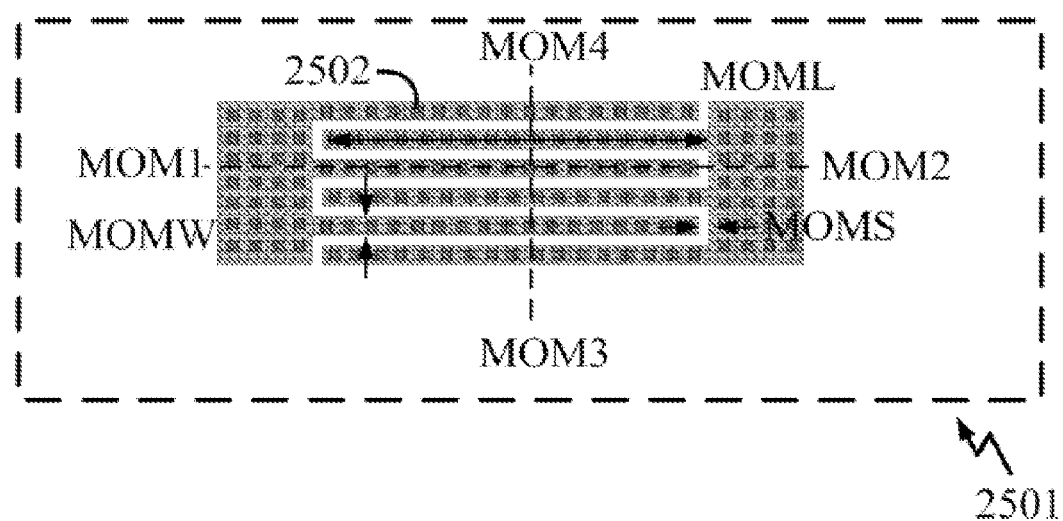
FIG. 25 is a schematic diagram of another appearance of the element 402 on a semiconductor chip.
Figure 25B:
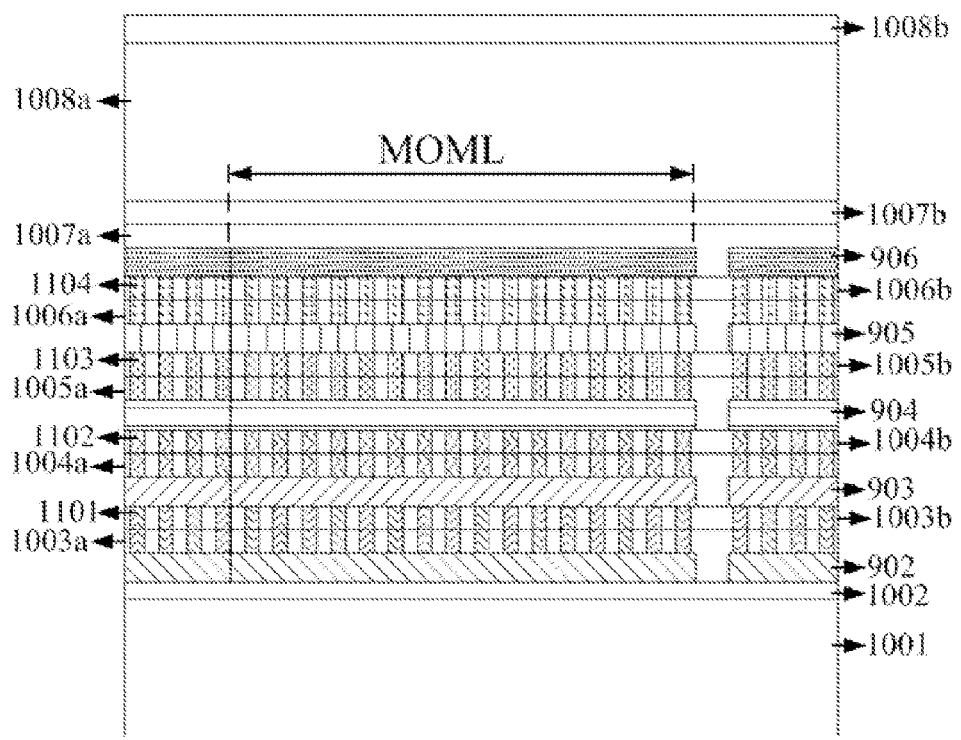
Figure 25B:
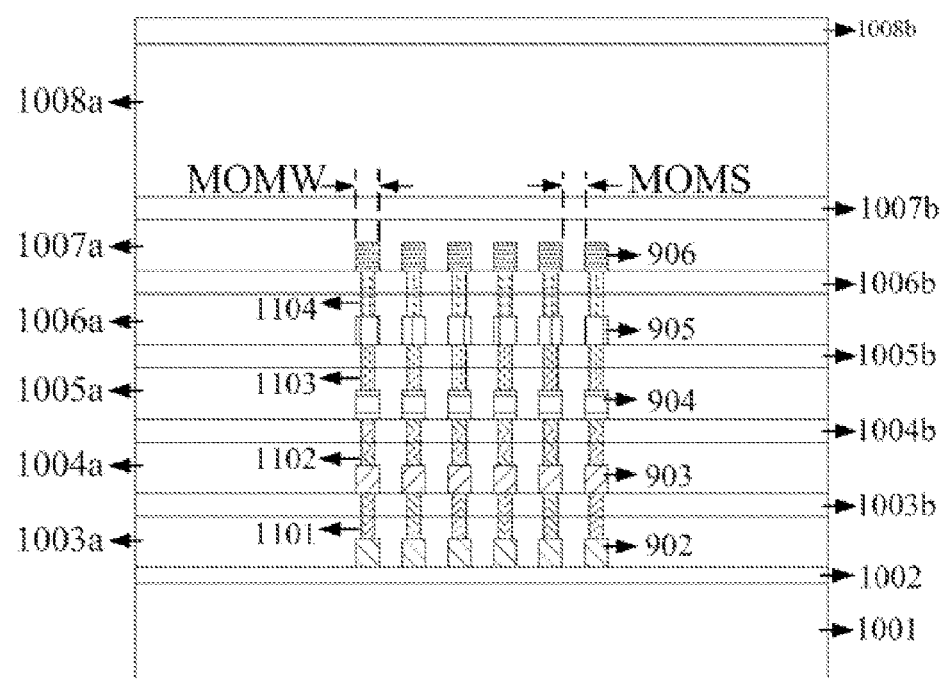

FIG. 24 shows the capacitor 402 on a semiconductor chip with a form of the metal-insulator-metal (MIM) capacitor. The MIM capacitor 2401 consists of two metal sheets. The top plate 2402 is realized by metal layer 907. The bottom plate 2403 is realized by metal layer 906 and connects with the metal layer 907 through 1105. No DC current can be conducted between 2402 and 2403. The overlapping area between 2402 and 2403 is between 1.0 square micrometer and 10000.0 square micrometers. FIG. 25 shows the capacitor 402 on a semiconductor chip with a form of the metal-oxide-metal (MOM) capacitor. The MOM capacitor 2501, which is constructed by the MOM finger 2502, is realized by metal layer 906, 905, 904, 903, 902 and via layer 1101, 1102, 1103, and 1104. All MOM finger 2502 are arranged interdigitally. The finger width MOMW is between 0.5 micrometers and 10.0 micrometers. The finger length MOML is between 1.0 micrometers and 100.0 micrometers. The finger spacing MOMS is between 0.1 micrometers and 5.0 micrometers. The number of the MOM finger 2502 is between 2 and 100.

Figure 26:
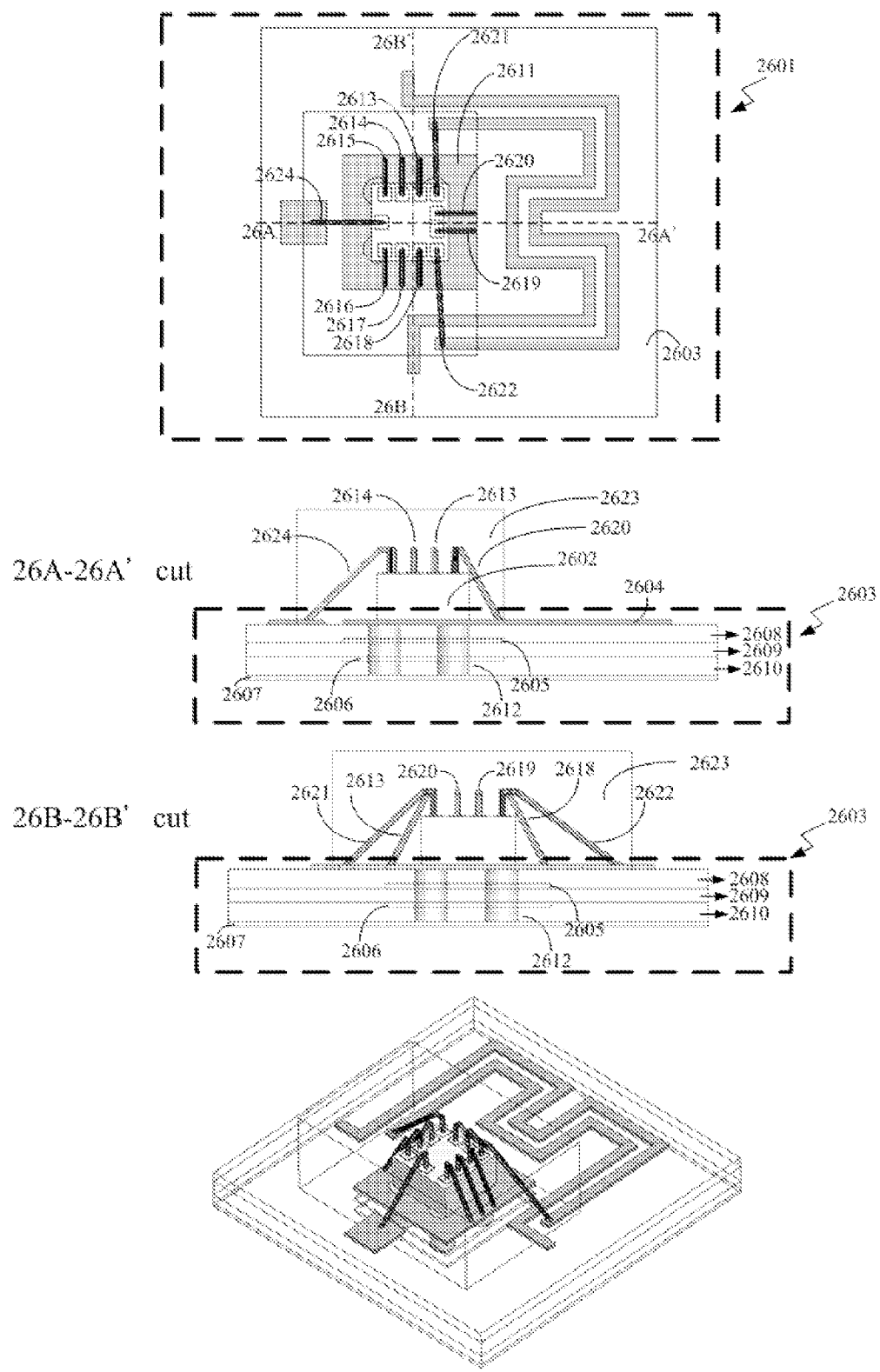
FIG. 26 is a schematic diagram of the appearance of a module for a variable attenuator.

FIG. 26 shows a module 2601 to realize the variable attenuator. The module 2601 consists of a semiconductor chip 2602 and a carrier 2603. The semiconductor chip 2602 can be made by the substrates, comprising the silicon substrate with a resistivity less than 0.1 ohm-meter, the silicon substrate with a resistivity greater than 100.0 ohm-meter, the silicon-insulator-silicon substrate, the sapphire substrate with the silicon layer, the gallium arsenide (GaAs) substrate, the gallium nitride (GaN) substrate, the silicon substrate with germanium layers, and the indium phosphide substrate. The processes for fabricating the semiconductor substrate comprise the complementary metal-oxide-semiconductor (CMOS) process, the silicon-germanium (SiGe) process, the silicon on insulator (SOI) process, the silicon on sapphire (SOS) process, the GaAs pseudomorphic High electron mobility transistor (pHEMT) process, the GaAs heterojunction bipolar transistor (HBT) process. The carrier 2603 can be made by the substrates, comprising the aluminium frame, the laminated substrate, the organic substrate, the low temperature co-fired ceramic (LTCC) substrate, and liquid crystal polymer (LCP) substrate.

Figure 27:
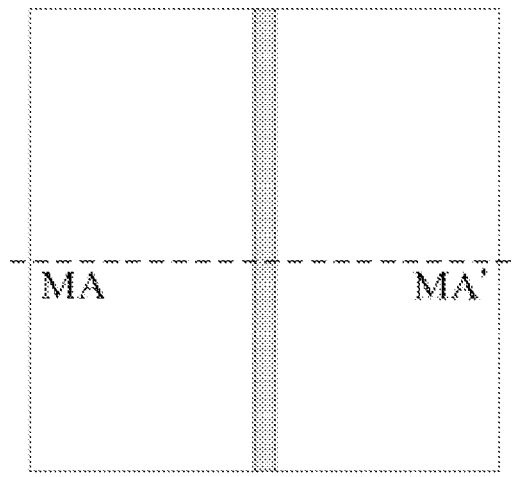
FIG. 27 is a schematic diagram of the appearance of the element 403 on a multi-layer dielectric substrate.
Figure 27:
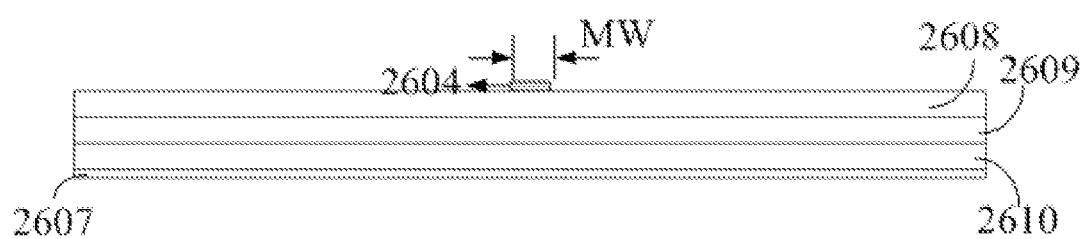
Figure 28:
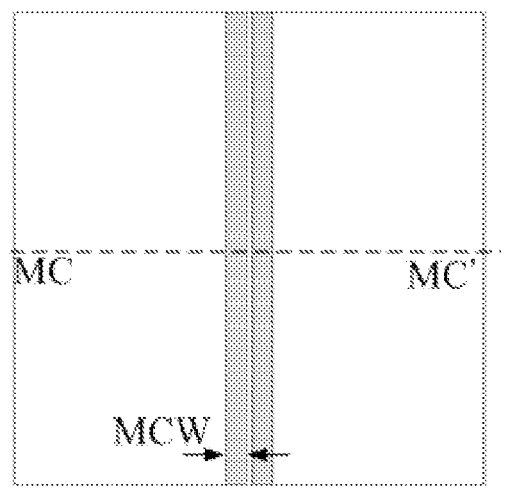
FIG. 28 is a schematic diagram of another appearance of the element 403 on a multi-layer dielectric substrate.
Figure 28:
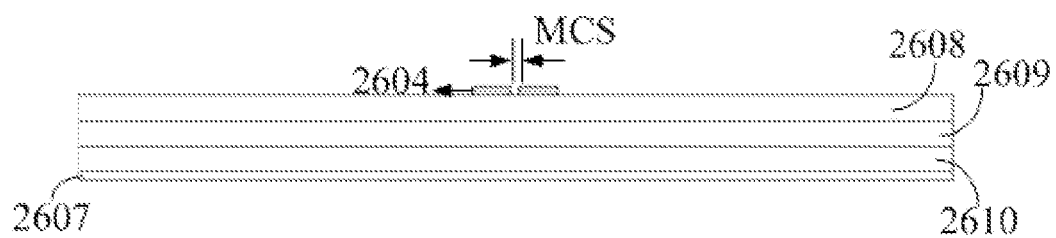

As shown in FIG. 26, the carrier 2603 consists of four metal layers and three dielectric layers. The metal layer 2606 is above 2607, the metal layer 2605 is above 2606, and metal layer 2604 is above the 2605. The metal layer 2607 is regarded as the reference ground plane of the module 2601. Each point on the metal layer 2607 is regarded as the node 999. The dielectric layer 2608 is between the metal layer 2604 and 2605. The dielectric layer 2609 is between metal layer 2605, and 2606. The dielectric layer 2610 is inserted between 2606 and 2607. The element 2611, which is realized by the metal layer 2604, is beneath the semiconductor chip 2602 and connects with the metal layer 2607 through via layer 2612. The semiconductor chip 2602 forms an integrated circuit consisting of elements 109, 110, 111, 112, 113, 114, 115, 116, 117, 118, 119, 120, 122, 123, 124, 125, 126, 127. The element 104 is realized by the metal layer 2604 on the carrier 2603. The elements 113, 114, 115, 116, 119, 120, 122, 123, 124, and 125 connect with the element 2611 through the wires 2613, 2614, 2615, 2616, 2617, 2618, 2619, and 2620. The elements 107 and 108 are realized by the wires 2621 and 2622. The node 128 connects with the semiconductor chip 2602 through the wire 2624. The thickness of the semiconductor chip 2602 is between 80.0 micrometers and 300.0 micrometers. The element 2623 is made by a dielectric material with a relative dielectric constant between 2.0 and 20.0. The element 2623 covers the semiconductor chip 2602 and the wires 2613, 2614, 2615, 2616, 2617, 2618, 2619, 2620, 2621, 2622, and 2624. The thickness of the element 2623 is between 250.0 micrometers and 900.0 micrometers. The elements 102 and 106 are realized in the form of the transmission line 403. The transmission line 403 is realized in the form of the microstrip line. The element 104 is realized in the form of the edge-coupled microstrip line. FIG. 27 shows the top-view and cross-section view of the microstrip line. The signal trace and reference ground plane of the microstrip line is realized by the metal layer 2604 and 2607, respectively. The line width MW is between 40.0 micrometers and 5000.0 micrometers. The element 104 is realized by the metal layer 2604. FIG. 28 shows the top-view and the cross-section view of the edge-coupled microstrip line. The signal trace and reference ground plane of the edge-coupled microstrip line is realized by the metal layer 2604 and 2607. The line width MCW is between 40.0 micrometers and 5000.0 micrometers. The line spacing MCS is between 40.0 micrometers and 3000.0 micrometers.

The thickness of the metal layer 2605, 2606, and 2607 is between 1.0 micrometers and 300.0 micrometers. The metal layer 2605, 2606, 2607 and via layer 2612 can be made by the metal, comprising copper, electroplating copper, sputtering copper, silver, and gold. The thickness of the dielectric layer 2608, 2609, and 2610 is between 40.0 micrometers and 2000.0 micrometers. The relative dielectric constant of the dielectric layer 2608, 2609, and 2610 is between 2.0 and 20.0. The wire 2613, 2614, 2615, 2616, 2617, 2618, 2619, 2620, 2621, 2622, and 2624 can be made by metal, comprising gold, and aluminum. The diameter of the wire is between 17.0 micrometers and 50.0 micrometers. The diameter of via on via layer 2612 is between 40.0 micrometers and 2000.0 micrometers. The semiconductor chip 2602 is attached on the carrier 2603 through the diebonding processes. The wire 2613, 2614, 2615, 2616, 2617, 2618, 2619, 2620, 2621, 2622, and 2624 can be produced through the wirebonding processes.

Figure 29:
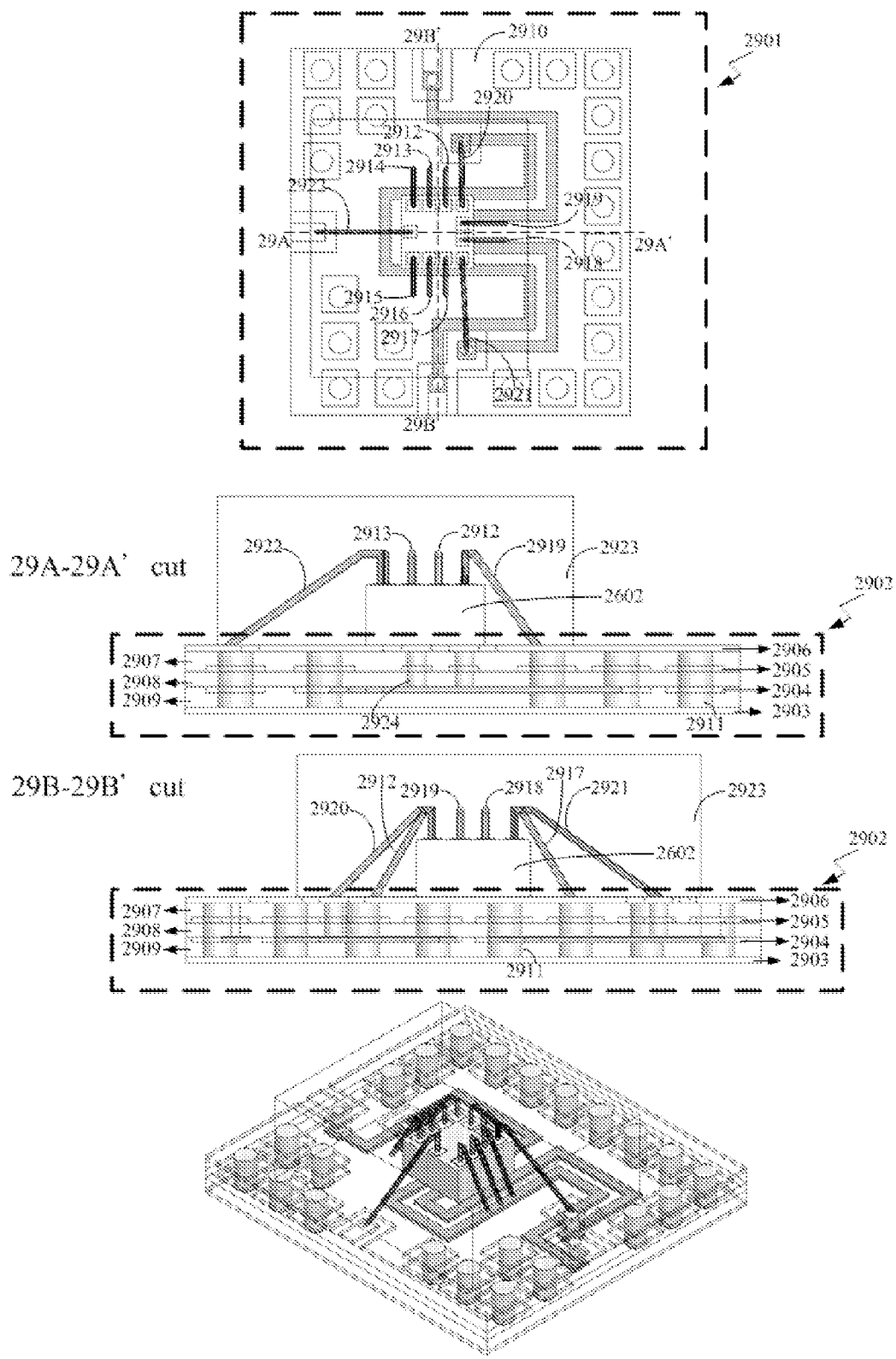
FIG. 29 is a schematic diagram of another appearance of a module for a variable attenuator.
Figure 30:
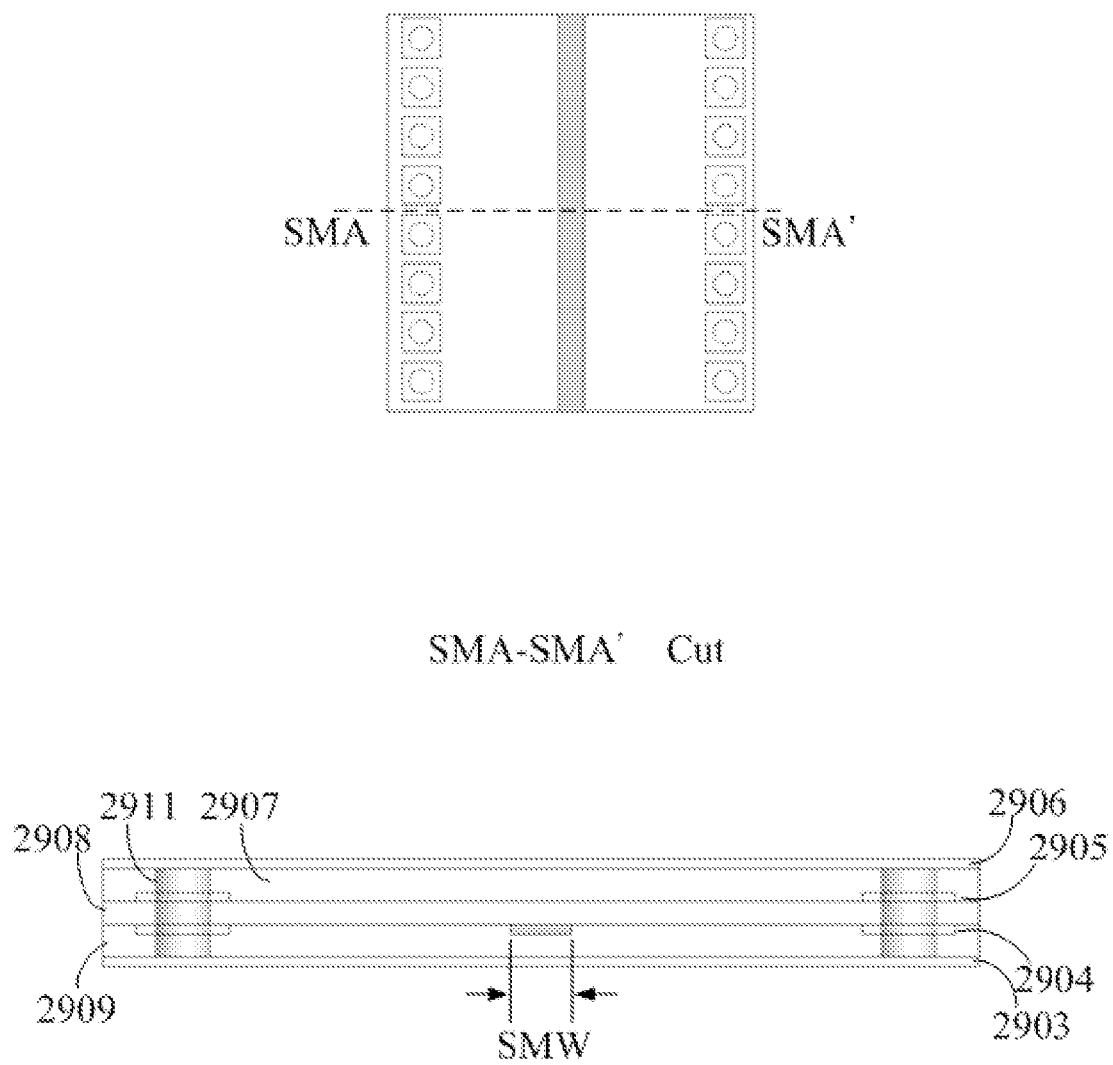
FIG. 30 is a schematic diagram of the appearance of the element 403 embedded in a multi-layer dielectric substrate.
Figure 31:
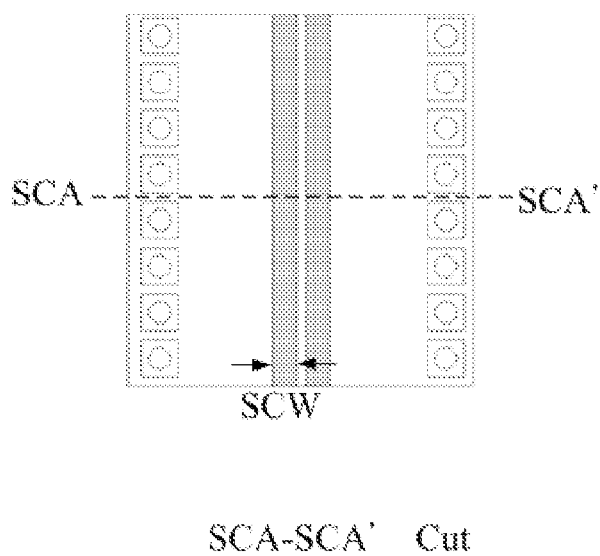
FIG. 31 is a schematic diagram of another appearance of the element 403 embedded in a multi-layer dielectric substrate.
Figure 31:
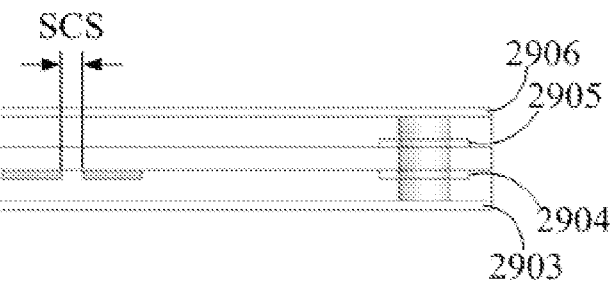

FIG. 29 shows a module 2901 to realize the variable attenuator. The module 2901 consists of a semiconductor chip 2602 and a carrier 2902. The carrier 2902 consists of four metal layers and three dielectric layers. The metal layer 2904 is above 2903, the metal layer 2905 is above the metal layer 2904, and the metal layer 2906 is above the metal layer 2905. The metal layer 2903 is regarded as the reference ground plane of the module 2901. Each point on the metal layer 2903 is regarded as the node 999. The dielectric layer 2907 is inserted between the metal layer 2906 and 2905. The dielectric layer 2908 is inserted between the metal layer 2905 and 2904. The dielectric layer 2909 is inserted between the metal layer 2904 and 2903. The element 2910, which is realized by the metal layer 2906, is beneath under the semiconductor chip 2602 and connects with the metal layer 2903 through via layer 2911. The metal layer 2906 can connect with the metal 2904 through via layer 2924. The metal layer 2906 can connect with the metal layer 2905 through via layer 2925. Each point on the element 2910 is regarded as the node 999. The semiconductor chip 2602 forms an integrated circuit consisting of elements 109, 110, 111, 112, 113, 114, 115, 116, 117, 118, 119, 120, 122, 123, 124, 125, 126, 127. The element 104 is embedded in the carrier 2902. The elements 113, 114, 115, 116, 119, 120, 122, 123, 124, and 125 connect with the element 2910 through the wires 2912, 2913, 2914, 2915, 2916, 2917, 2918, 2919. The elements 107 and 108 are realized by the wires 2920 and 2921. The node 128 connects with the semiconductor chip 2602 through the wire 2922. The element 2923 is made by a dielectric material with a relative dielectric constant between 2.0 and 20.0. The element 2923 covers the semiconductor chip 2602 and wires 2912, 2913, 2914, 2915, 2916, 2917, 2918, 2919, 2920, 2921, and 2922. The thickness of the element 2923 is between 250.0 micrometers and 900.0 micrometers. The elements 102 and 106 are realized in the form of the transmission line 403. The transmission line 403 is realized in the form of the stripline. The element 104 is realized in the form of the edge-coupled stripline. FIG. 30 shows the cross-section view of the stripline. The line width SMW is between 40.0 micrometers and 5000.0 micrometers. The signal trace of the element 104 is realized by the metal layer 2904. The ground planes of the element 104 are realized by the metal layer 2903 and 2906. FIG. 31 shows the edged-coupled stripline. The line width SCW is between 40.0 micrometers and 5000.0 micrometers. The line spacing SCS is between 40.0 micrometers and 3000.0 micrometers.

The thickness of the metal layer 2903, 2904, 2905, and 2906 is between 1.0 micrometers and 300.0 micrometers. The metal layer 2903, 2904, 2905, 2906 and via layer 2911 can be made by the metal, comprising copper, electroplating copper, sputtering copper, silver, and gold. The thickness of the dielectric layer 2907, 2908, and 2909 is between 40.0 micrometers and 2000.0 micrometers. The relative dielectric constant of the dielectric layer 2907, 2908, and 2909 is between 2.0 and 20.0. The wires 2912, 2913, 2914, 2915, 2916, 2917, 2918, 2919, 2920, 2921, and 2922 can be made by metals, comprising gold and aluminum. The diameter of the wire is between 17.0 micrometers and 50.0 micrometers. The diameter of via on via layer 2911, 2924, and 2925 is between 40.0 micrometers and 2000.0 micrometers. The semiconductor chip 2602 is attached on the carrier 2902 through the diebonding processes. The wire 2912, 2913, 2914, 2915, 2916, 2917, 2918, 2919, 2920, 2921, and 2922 can be produced through the wirebonding processes.

Figure 32:
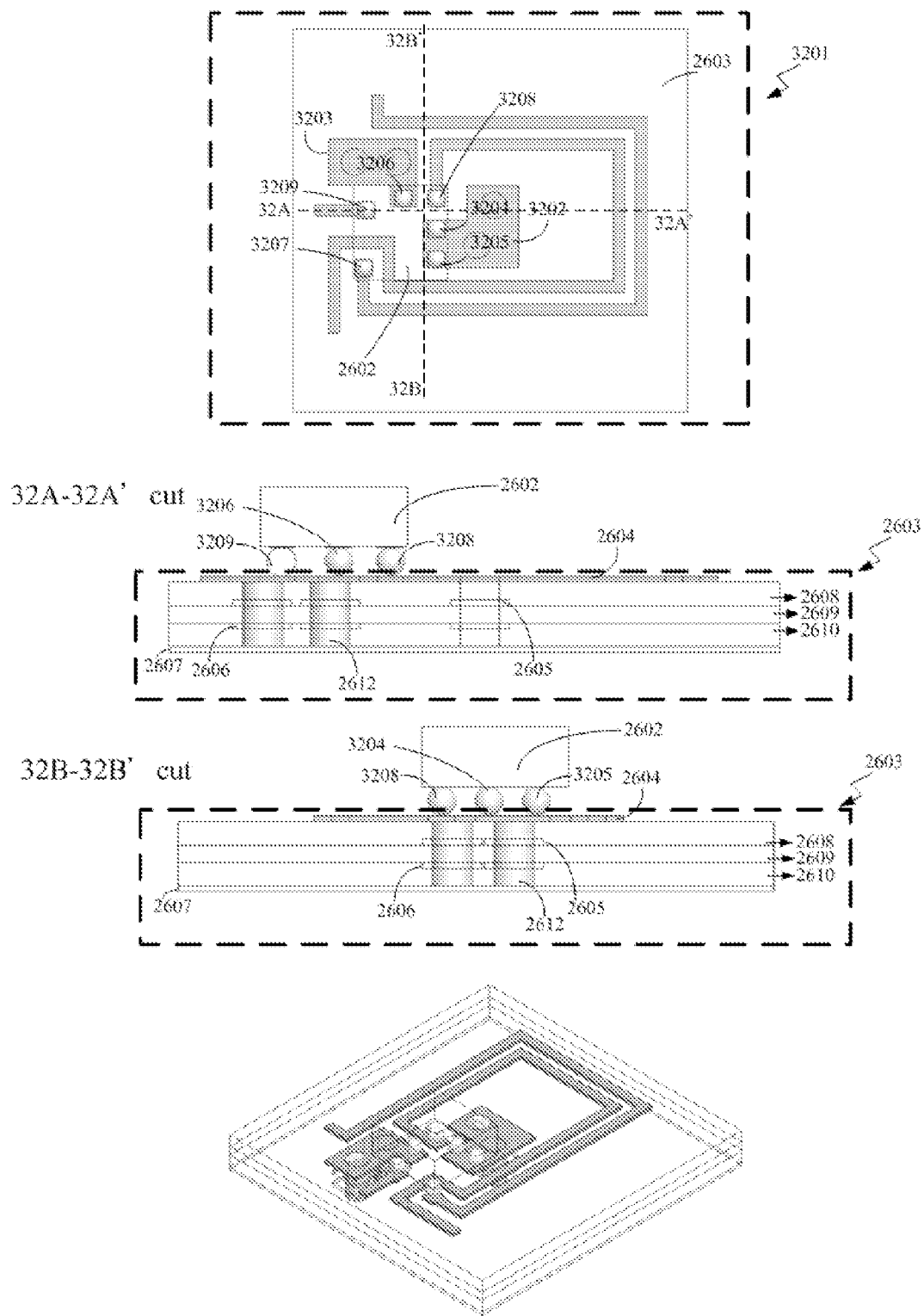
FIG. 32 is a schematic diagram of another appearance of a variable attenuator in a module.

FIG. 32 shows a module 3201 to realize the variable attenuator. The module 3201 consists of a semiconductor chip 2602 and a carrier 2603. The metal layer 2607 is regarded as the reference ground plane of the module 3201. Each point on the metal layer 2607 is regarded as the node 999. The elements 3202 and 3203 connect with the metal layer 2607 through via layer 2612. Each point on the elements 3202 and 3203 are regarded as the node 999. The elements 113, 114, 115, 116, 119, 120, 122, 123, 124, and 125 connect with the element 3202 through the bump 3204, 3205. The elements 113, 114, 115, 116, 119, 120, 122, 123, 124, and 125 connect with the element 3203 through the bump 3206. The elements 107 and 108 are realized by the bump 3207 and 3208. The node 128 connects with the semiconductor chip 2602 through the bump 3209.

The high of the bump 3204, 3205, 3206, 3207, 3208, and 3209 is between 1.0 micrometers and 300.0 micrometers. The bump 3204, 3205, 3206, 3207, 3207, 3208, and 3209 can be made by metal, comprising of gold, aluminum. In FIG. 32, the semiconductor chip 2602 is a flip-chip integrated circuit (IC). The semiconductor chip 2602 is attached on the carrier 2603 through the flip-chip processes. The bump 3204, 3205, 3206, 3207, 3207, 3208, and 3209 can be produced through the flip-chip processes.

Figure 33:
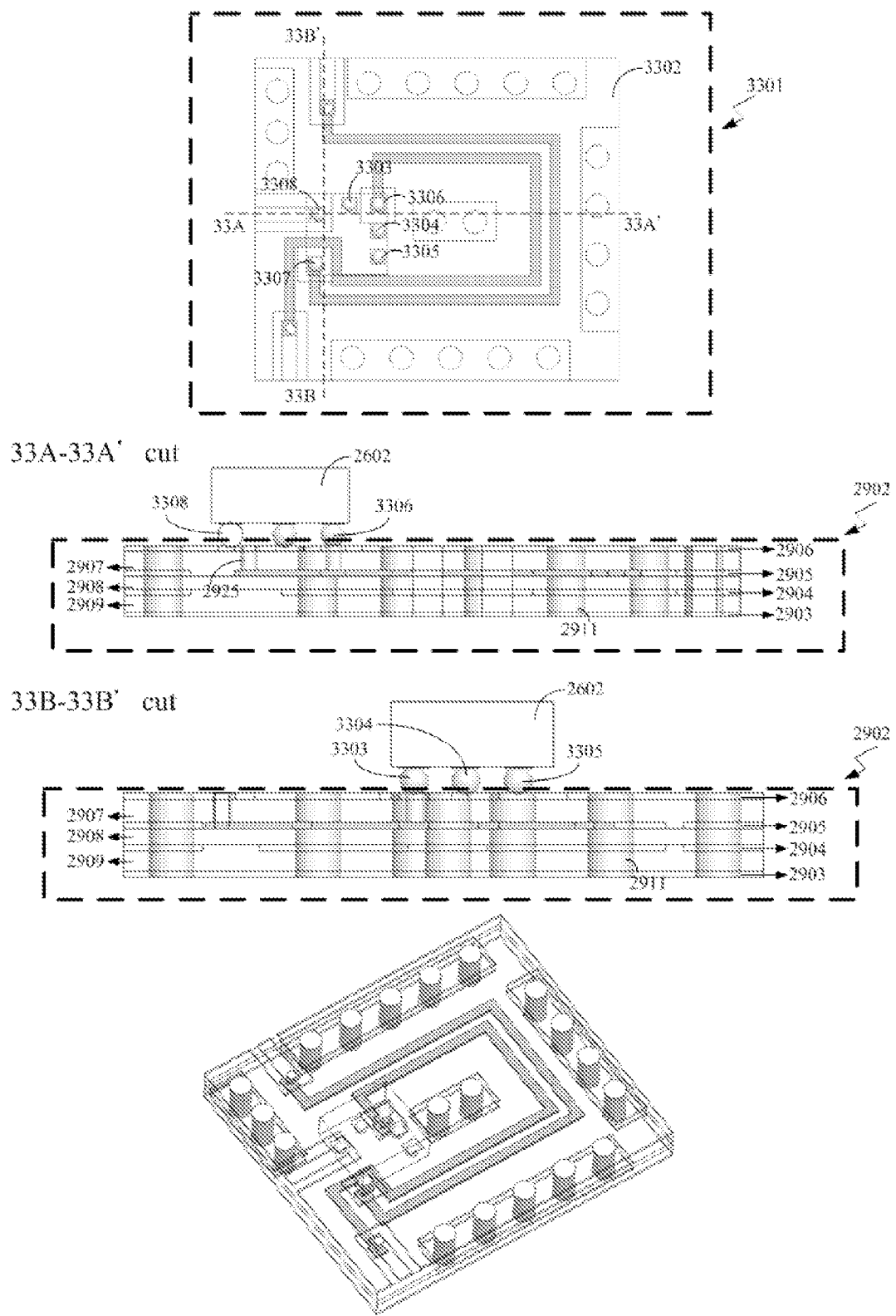
FIG. 33 is a schematic diagram of another appearance of a variable attenuator in a module.

FIG. 33 shows a module 3301 to realize the variable attenuator. The module 3301 consists of a semiconductor chip 2602 and a carrier 2902. The metal layer 2903 is regarded as the reference ground plane of the module 3301. Each point on the metal layer 2903 is regarded as the node 999. The element 3302 connects with the metal layer 2903 through via layer 2911. Each point on the elements 3302 is regarded as the node 999. The elements 113, 114, 115, 116, 119, 120, 122, 123, 124, and 125 connect with the element 3302 through the bump 3303, 3304, and 3305. The elements 107 and 108 are realized by the bump 3306 and 3307. The node 128 connects with the semiconductor chip 2602 through the bump 3308.

The spacing between the semiconductor chip 2602 and the carrier 2902 is between 1.0 micrometers and 300.0 micrometers. The bump 3303, 3304, 3305, 3306, 3307, and 3308 can be made by metal, comprising of gold, aluminum. The semiconductor chip 2602 is attached on the carrier 2603 through the flip-chip processes. The bump 3303, 3304, 3305, 3306, 3307, and 3308 can be produced through the flip-chip processes.

Figure 34:
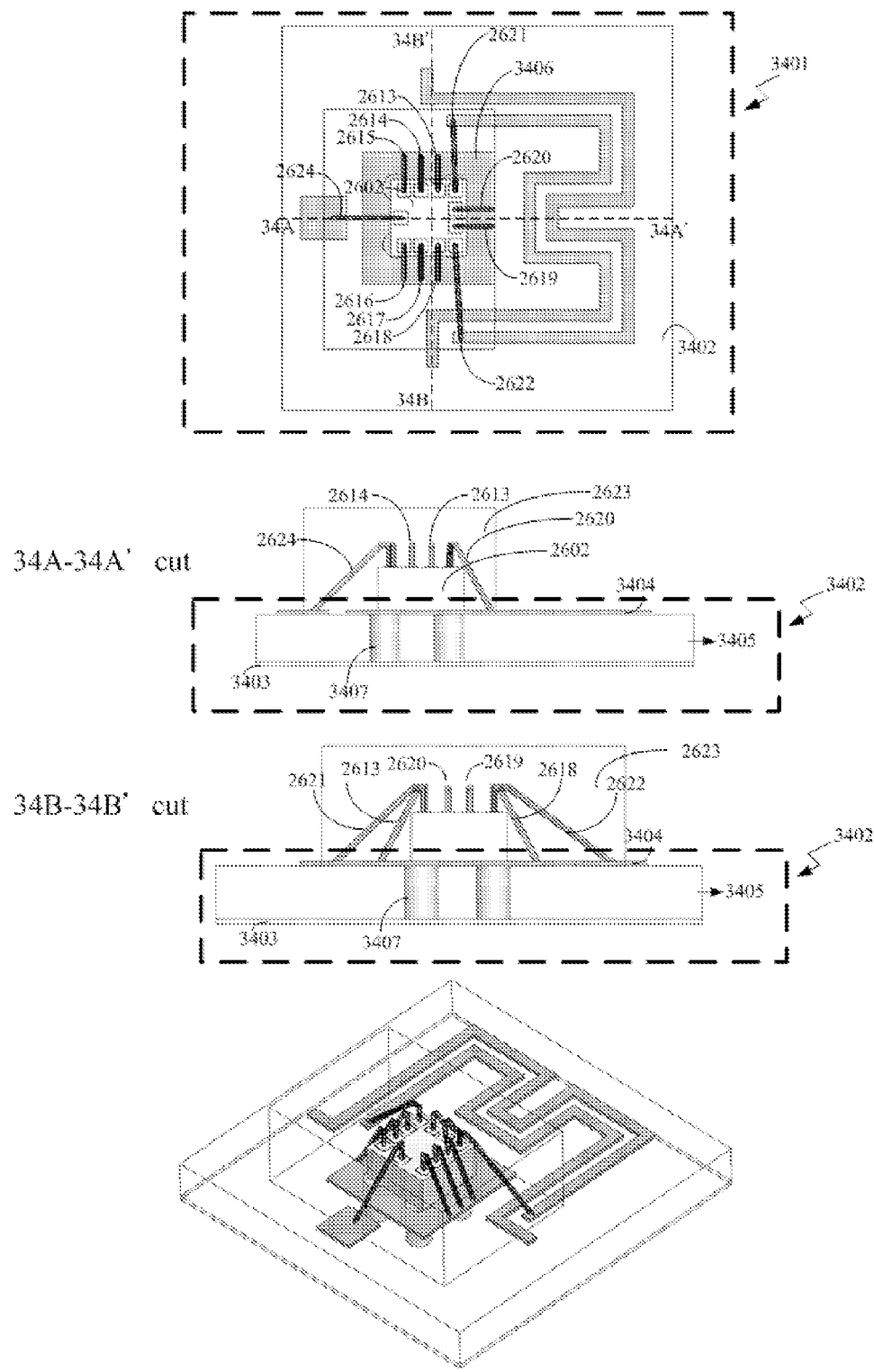
FIG. 34 is a schematic diagram of another appearance of a variable attenuator in a module.

FIG. 34 shows a module 3401 to realize the variable attenuator. The module 3401 consists of a semiconductor chip 2602 and a carrier 3402. The carrier 3403 consists of two metal layers and one dielectric layer. The metal layer 3404 is above 3403. The metal layer 3403 is regarded as the reference ground plane of the module 3401. Each point on the metal layer 3403 is regarded as the node 999. The dielectric layer 3405 is between the metal layer 3403 and 3404. The element 3406, which is realized by the metal layer 3404, is beneath the semiconductor chip 2602 and connects with the metal layer 3403 through via layer 3407. The element 104 is realized by the metal layer 3404 on the carrier 3402. The elements 113, 114, 115, 116, 119, 120, 122, 123, 124, and 125 connect with the element 3406 through the wires 2613, 2614, 2615, 2616, 2617, 2618, 2619, and 2620. The elements 107 and 108 are realized by the wires 2621 and 2622. The node 128 connects with the semiconductor chip 2602 through the wire 2624. The elements 102 and 106 are realized in the form of the transmission line 403. The transmission line 403 is realized in the form of the microstrip line. The element 104 is realized in the form of the edge-coupled microstrip line. The thickness of the metal layer 3403, 3404, and 3405 is between 1.0 micrometers and 300.0 micrometers. The metal layer 3403, 3404, 3405 and via layer 3407 can be made by the metal, comprising aluminum, copper, electroplating copper, sputtering copper, silver, and gold. The thickness of the dielectric layer 3405 is between 40.0 micrometers and 2000.0 micrometers. The relative dielectric constant of the dielectric layer 3405 is between 2.0 and 20.0. The diameter of via on via layer 3407 is between 40.0 micrometers and 2000.0 micrometers. The semiconductor chip 2602 is attached on the carrier 3402 through the diebonding processes.

Figure 35:
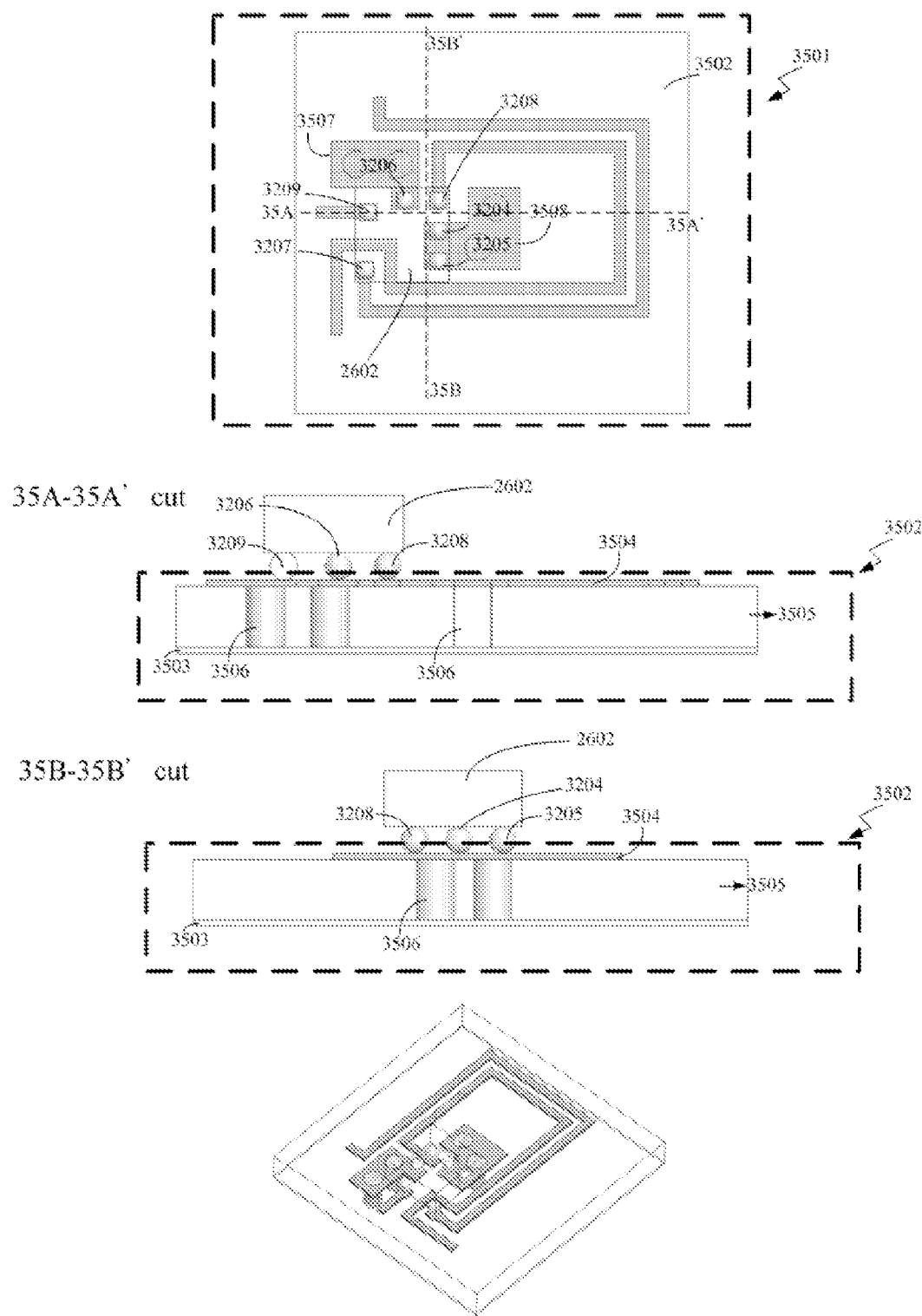
FIG. 35 is a schematic diagram of another appearance of a variable attenuator in a module.

FIG. 35 shows a module 3501 to realize the variable attenuator. The module 3501 consists of a semiconductor chip 2602 and a carrier 3502. The metal layer 3503 is regarded as the reference ground plane of the module 3501. Each point on the metal layer 3503 is regarded as the node 999. The elements 3507 and 3508 connect with the metal layer 3503 through via layer 3506. Each point on the elements 3507 and 3508 are regarded as the node 999. The elements 113, 114, 115, 116, 119, 120, 122, 123, 124, and 125 connect with the element 3507 through the bump 3206. The elements 113, 114, 115, 116, 119, 120, 122, 123, 124, and 125 connect with the element 3508 through the bump 3204, and 3205. The elements 107 and 108 are realized by the bump 3207 and 3208. The node 128 connects with the semiconductor chip 2602 through the bump 3209. The metal layer 3503, 3504 and via layer 3506 can be made by the metal, comprising aluminum, copper, electroplating copper, sputtering copper, silver, and gold. The thickness of the dielectric layer 3505 is between 40.0 micrometers and 2000.0 micrometers. The relative dielectric constant of the dielectric layer 3505 is between 2.0 and 20.0. The diameter of via on via layer 3506 is between 40.0 micrometers and 2000.0 micrometers. The semiconductor chip 2602 is attached on the carrier 3502 through the flip-chip processes.

Figure 36:
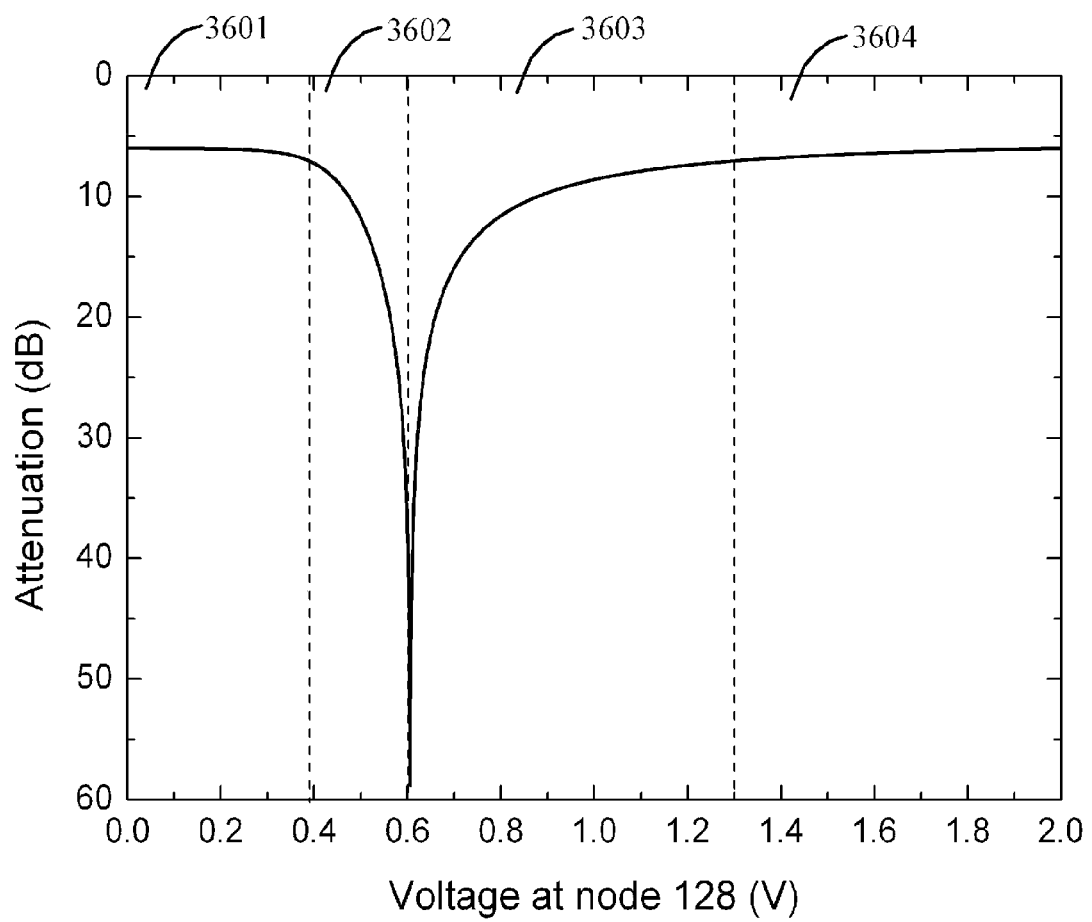
FIG. 36 is a schematic diagram of a curve of the attenuation of the variable attenuator 101 versus the voltage at the node 128.

FIG. 36 shows a curve of the attenuation of the variable attenuator 101 versus the voltage at node 128. The frequency of the input signal is at 24.0 GHz. The elements 117 and 118, which are in the forms of the element 609 and 610, are realized by using CMOS 0.18 micrometers technology. The breakdown voltage between the nodes 117c and 117b is 2.2V. The breakdown voltage between nodes 118c and 118b is 2.4 V. The elements 117 and 118 are n-channel FET 609 and 610. The elements 117 and 118 are identical, and the ratio of the width to the length is 180.0. The value of the curve in the FIG. 36 is calculated by using the equation of $-20*\log(x)$, where x is the magnitude of the transmission coefficient between nodes 102a and 106a. The curve in FIG. 36 can be divided into four partitions based on the different control voltages at node 128. The first partition 3601 is the attenuation versus the voltage between 0.0 V and 0.38 V, the second partition 3602 is the attenuation versus the voltage between 0.38 V and 0.61 V, the third partition 3603 is the attenuation versus the voltage between 0.61 V and 1.30 V, and fourth partition 3604 is the attenuation versus the voltage between 1.30 V and 2.0 V. In the partition 3601, the attenuation is kept as a constant value of 6.0 dB when the voltage is between 0.0 V and 0.22 V. When voltage is increased from 0.22 V to 0.38 V, the attenuation is increased from 6.0 dB to 7.0 dB. In the partition 3402, when the voltage is increased from 0.38 V to 0.55 V, the attenuation is increased from 7.0 dB to 17.7 dB. When the voltage is increased from 0.55 V to 0.61 V, the attenuation is increased from 17.7 dB to 58.8 dB. In the partition 3603, when the voltage is increased from 0.61 V to 0.8 V, the attenuation is decreased from 58.8 dB to 11.6 dB. When the voltage is increased from 0.8 V to 1.0 V, the attenuation is decreased from 11.6 dB to 8.6 dB. When the voltage is increased from 1.0 V to 1.3 V, the attenuation is decreased from 8.6 dB to 7.1 dB. In the partition 3604, when the voltage is increased from 1.3 V to 2.0 V, the attenuation is decreased from 7.1 dB to 6.0 dB. The maximum attenuation of the variable attenuator 101 is 58.8 dB when the voltage at node 128 is 0.61 V. The maximum and minimum differences in the attenuation between the partitions 3601 and 3602 are 52.8 dB and 1.0 dB. The maximum and minimum differences in the attenuation between the partitions 3601 and 3603 are 0.0 dB and 52.8 dB. The maximum and minimum differences in the attenuation between the partitions 3601 and 3604 are 1.0 dB and 0.0 dB. The maximum and minimum differences in the attenuation between the partitions 3602 and 3603 are 51.8 dB and 0.0 dB. The maximum and minimum differences in the attenuation between the partitions 3602 and 3604 are 52.8 dB and 0.0 dB. The maximum and minimum differences in the attenuation between the partitions 3603 and 3604 are 52.8 dB and 0.0 dB. The maximum and minimum difference in the attenuation for the voltage at the node 128 between 0.0 V and 2.0 V are 0.0 dB and 52.8 dB.

Figure 37:
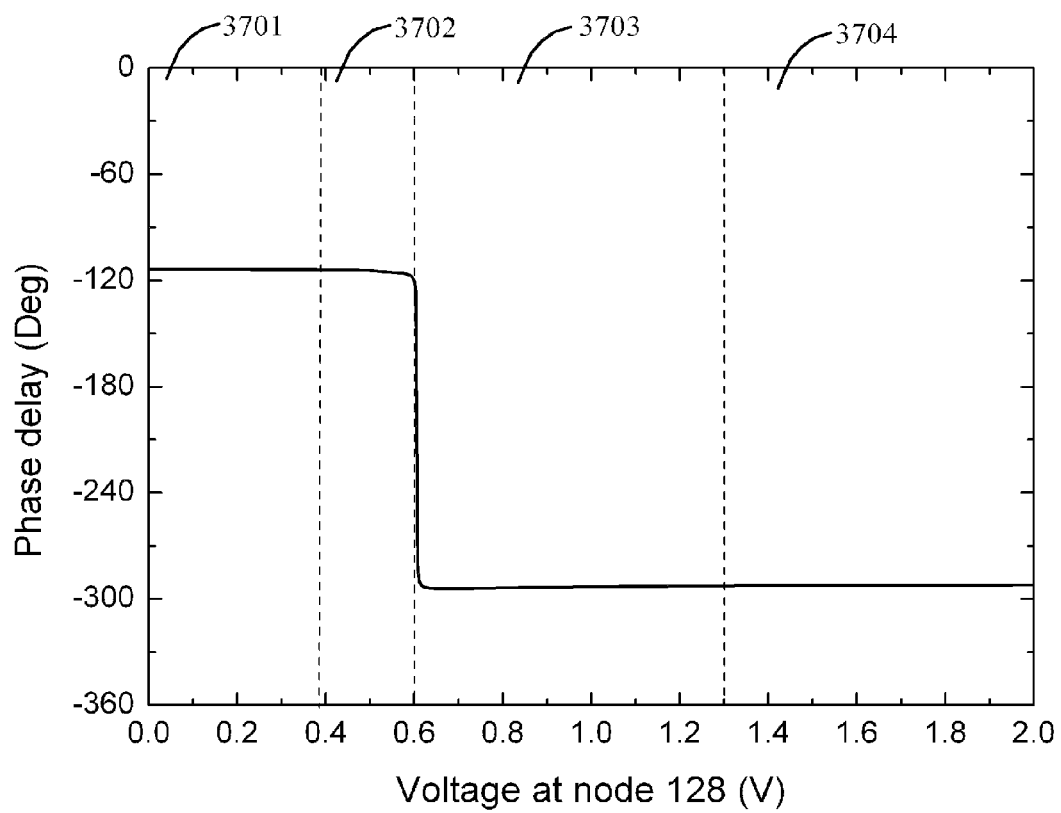
FIG. 37 is a schematic diagram of a phase delay of the variable attenuator 101 versus the voltage at the node 128.

FIG. 37 shows a curve of the phase of the transmission coefficient between 102a and 106a versus the voltage at node 128. The frequency of the input signal is at 24.0 GHz. The elements 117 and 118, which are in the forms of the element 609 and 610, are realized by using CMOS 0.18 micrometers technology. The breakdown voltage between the nodes 117c and 117b is 2.4 V. The breakdown voltage between nodes 118c and 118b is 2.2V. The elements 117 and 118 are identical and the ratio of the width to the length is 180.0. The curve in FIG. 37 can be divided into four partitions based on the different control voltages at node 128. The first partition 3701 is the phase versus the voltage between 0.0 V and 0.38 V, the second partition 3702 is the phase versus the voltage between 0.38 V and 0.61 V, the third partition 3703 is the phase versus the voltage between 0.61 V and 1.3 V, and fourth partition 3704 is the phase versus the voltage between 1.3 V and 2.0 V. In the partition 3701, the phase is kept as a constant value of −113.8 degrees when the voltage is between 0.0 V and 0.39 V. In the partition 3502, when the voltage is increased from 0.39 V to 0.5 V, the phase is decreased from −113.8 degrees to −114.0 degrees. When the voltage is increased from 0.5 V to 0.60 V, the phase is decreased from −114.0 degrees to −114.4 degrees. When the voltage is 0.61 V, the phase transition is occurred. In the partition 3403, when the voltage is increased from 0.62 V to 0.63 V, the phase is decreased from −292.8 degrees to −293.7 degrees. When the voltage is between 0.63 V and 1.3 V, the phase is decreased from −293.7 degrees to −292.7 degrees. In the partition 3704, the phase is increased from −292.7 degrees to −292.2 degrees when the voltage is between 1.3 V and 2.0 V. The maximum and minimum difference in the phase between the partition 3701 and 3702 are 176 degrees and 0.0 degrees. The maximum and minimum difference in the phase between the partition 3701 and 3703 are 179.1 degrees and 176.0 degrees. The maximum and minimum difference in the phase between the partition 3701 and 3704 are 179.1 degrees and 178.5 degrees. The maximum and minimum difference in the phase between the partition 3702 and 3703 are 179.1 degrees and 174.0 degrees. The maximum and minimum difference in the phase between the partition 3702 and 3704 are 178.0 degrees and 173.0 degrees. The maximum and minimum difference in the phase between the partition 3703 and 3704 are 8.0 degrees and 0.0 degrees. The maximum and minimum difference in the phase for the voltage at the node 128 between 0.0 V and 2.0 V are 179.1 degrees and 0.0 degrees.

Figure 38:
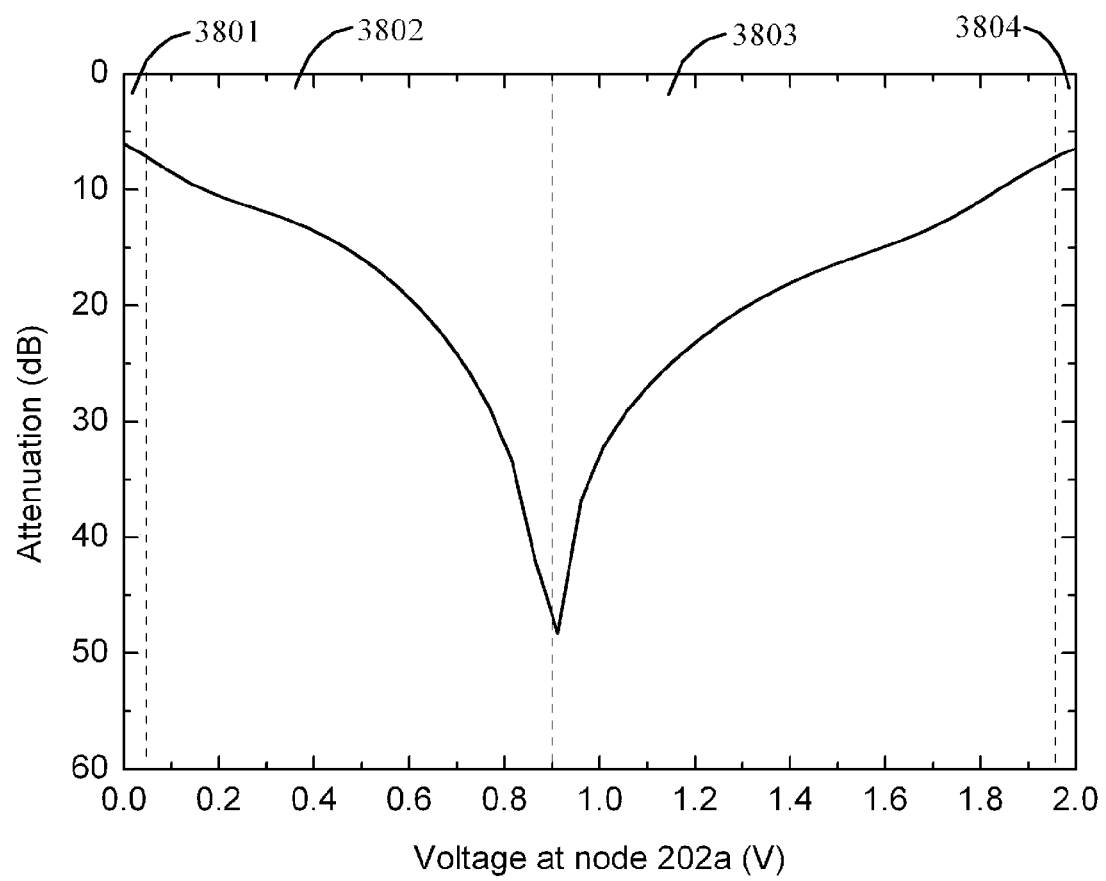

FIG. 38 shows a curve of the attenuation of the variable attenuator 201 versus the voltage at node 202a. The frequency of the input signal is at 24.0 GHz. The elements 117 and 118, which are in the forms of the element 609 and 610, are realized by using CMOS 0.18 micrometers technology. The breakdown voltage between the nodes 117c and 117b is 2.4 V. The breakdown voltage between nodes 118c and 118b is 2.4V. The elements 117 and 118 are identical and the ratio of the width to the length is 180.0. The value of the curve in FIG. 38 is calculated by using the equation of −20*log (x), where x is the magnitude of the transmission coefficient between nodes 102a and 106a. The curve in FIG. 38 can be divided into four partitions based on the different control voltages at node 128. The first partition 3801 is the attenuation versus the voltage between 0.0 V and 0.04 V, the second partition 3802 is the attenuation versus the voltage between 0.04 V and 0.91 V, the third partition 3803 is the attenuation versus the voltage between 0.91 V and 1.94 V, and fourth partition 3804 is the attenuation versus the voltage between 1.94 V and 2.0 V. In the partition 3801, when the voltage is increased from 0.0 V to 0.04 V, the attenuation is increased from 6.0 dB to 7.0 dB. In the partition 3802, when the voltage is increased from 0.04 V to 0.2 V, the attenuation is increased from 7.0 dB to 10.6 dB. When the voltage is increased from 0.2 V to 0.4 V, the attenuation is increased from 10.6 dB to 13.6 dB. When the voltage is increased from 0.4 V to 0.6 V, the attenuation is increased from 13.6 dB to 19.0 dB. When the voltage is increased from 0.6 V to 0.91 V, the attenuation is increased from 19.0 dB to 48.3 dB. In the partition 3803, when the voltage is increased from 0.91 V to 1.0 V, the attenuation is decreased from 48.3 dB to 32.1 dB. When the voltage is increased from 1.0V to 1.4 V, the attenuation is decreased from 32.1 dB to 18.2 dB. When the voltage is increased from 1.4 V to 1.7 V, the attenuation is decreased from 18.2 dB to 13.5 dB. When the voltage is increased from 1.7 V to 1.94 V, the attenuation is decreased from 13.5 dB to 7.0 dB. In the partition 3804, when the voltage is increased from 1.94 V to 2.0 V, the attenuation is decreased from 7.0 dB to 6.2 dB. The maximum attenuation of the variable attenuator 201 is 48.3 dB when the voltage at node 128 is 0.91 V. The maximum and minimum differences in the attenuation between the partitions 3801 and 3802 are 42.3 dB and 0.0 dB. The maximum and minimum differences in the attenuation between the partitions 3801 and 3803 are 42.3 dB and 0.0 dB. The maximum and minimum differences in the attenuation between the partitions 3801 and 3804 are 1.0 dB and 0.0 dB. The maximum and minimum differences in the attenuation between the partitions 3802 and 3803 are 41.3 dB and 0.0 dB. The maximum and minimum differences in the attenuation between the partitions 3802 and 3804 are 41.3 dB and 0.0 dB. The maximum and minimum differences in the attenuation between the partitions 3803 and 3804 are 41.3 dB and 0 dB. The maximum and minimum difference in the attenuation for the voltage at the node 128 between 0.0 V and 2.0 V are 42.3 dB and 0 dB.

Figure 39:
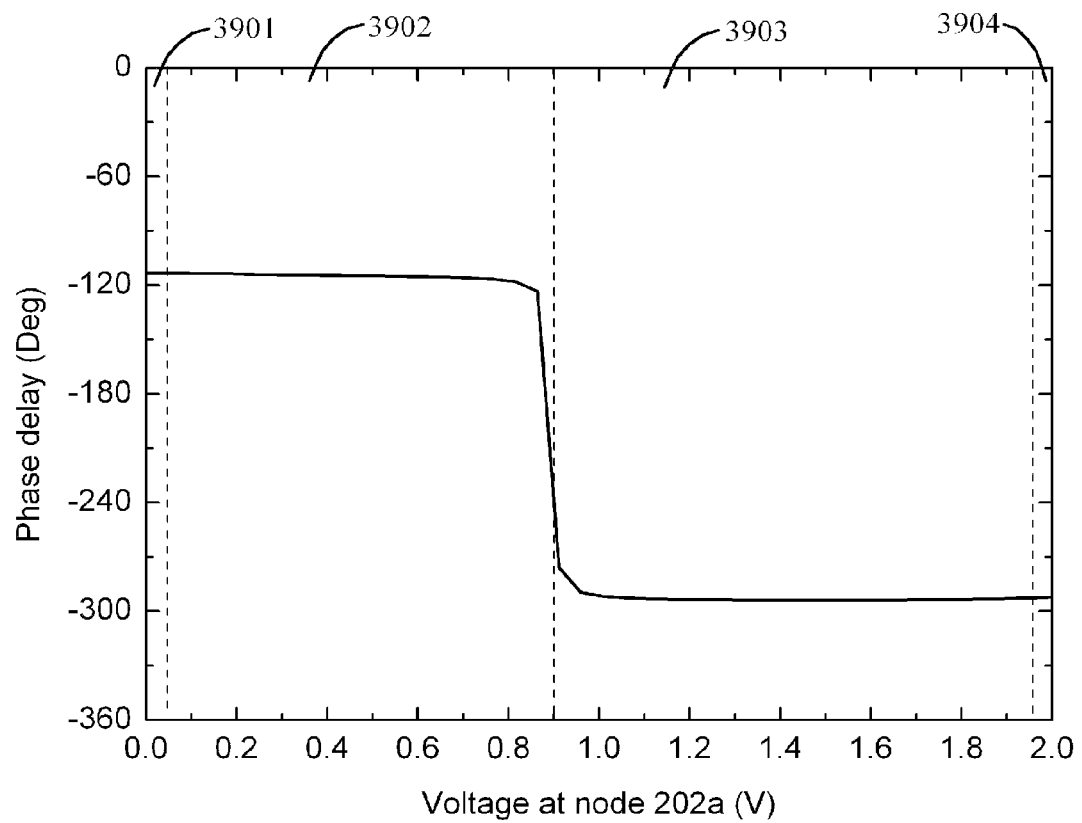

FIG. 39 shows a curve of the phase of the transmission coefficient between 102a and 106a versus the voltage at node 202a. The frequency of the input signal is at 24.0 GHz. The elements 117 and 118, which are in the forms of the element 609 and 610, are realized by using CMOS 0.18 micrometers technology. The breakdown voltage between the nodes 117c and 117b is 2.4 V. The breakdown voltage between nodes 118c and 118b is 2.4 V. The elements 117 and 118 are identical and the ratio of the width to the length is 180. The curve in FIG. 39 can be divided into four partitions based on the different control voltages at node 202a. The first partition 3901 is the phase versus the voltage between 0.0 V and 0.04 V, the second partition 3902 is the phase versus the voltage between 0.04 V and 0.91 V, the third partition 3903 is the phase versus the voltage between 0.91 V and 1.94 V, and fourth partition 3904 is the phase versus the voltage between 1.94 V and 2.0 V. In the partition 3901, the phase is kept as a constant value of −113.3 degrees when the voltage is between 0.0 V and 0.04 V. In the partition 3902, when the voltage is increased from 0.05 V to 0.8 V, the phase is decreased from −113.3 degrees to −118.0 degrees. When the voltage is increased from 0.8 V to 0.85 V, the phase is decreased from −118.0 degrees to −123.1 degrees. When the voltage is 0.91 V, the phase transition is occurred. In the partition 3903, when the voltage is increased from 0.91 V to 1.0 V, the phase is decreased from −275.9 degrees to −291.7 degrees. When the voltage is increased from 1.0 V to 1.94 V, the phase is increased from −291.7 degrees to −292.6 degrees. In the partition 3904, the phase is a constant value of −292.6 degrees when the voltage is between 1.94 V and 2.0 V. The maximum and minimum differences in the phase between the partitions 3901 and 3902 are 162.6 degrees and 0.0 degrees. The maximum and minimum differences in the phase between the partitions 3901 and 3903 are 179.3 degrees and 162.6 degrees. The maximum and minimum differences in the phase between the partitions 3901 and 3904 are 179.3 degrees and 0.0 degrees. The maximum and minimum differences in the phase between the partitions 3902 and 3903 are 179.3 degrees and 0.0 degrees. The maximum and minimum differences in the phase between the partitions 3902 and 3904 are 179.3 degrees and 16.6 degrees. The maximum and minimum differences in the phase between the partitions 3903 and 3904 are 16.6 degrees and 0.0 degrees. The maximum and minimum differences in the phase for the voltage at the node 202a between 0.0 V and 2.0 V are 179.3 degrees and 0.0 degrees.

Figure 40:
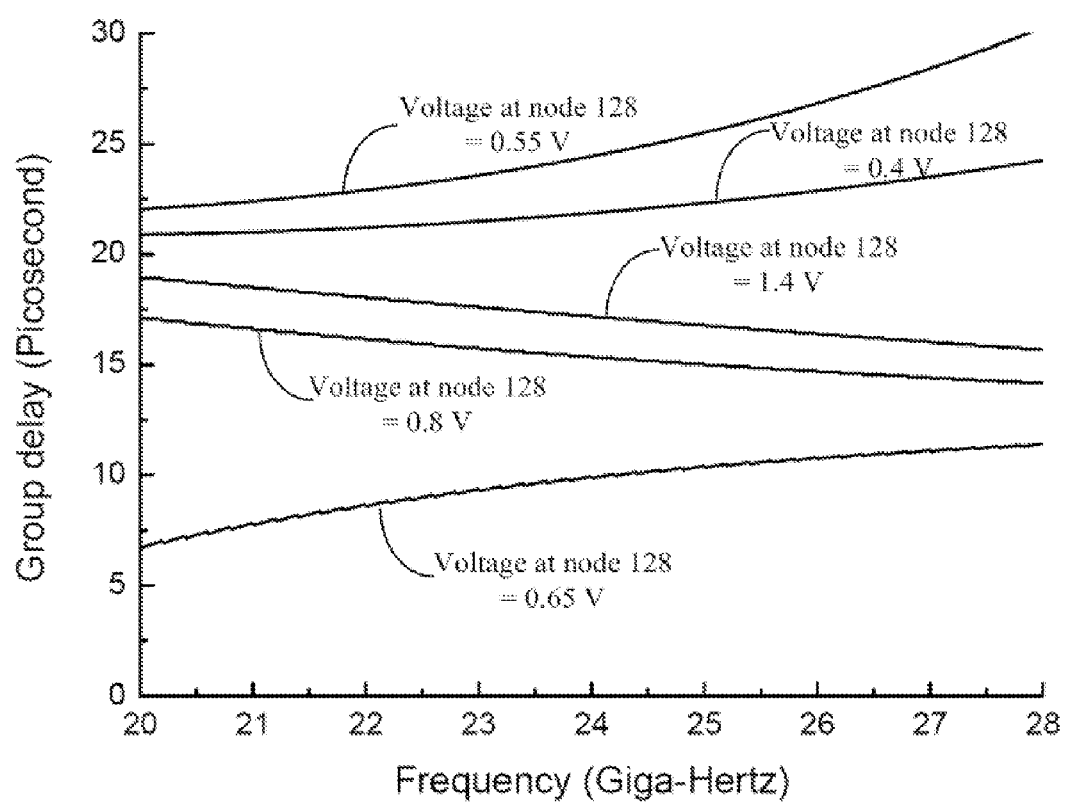
FIG. 40 is a schematic diagram of the group delay of the variable attenuator 101 with different voltages at node 128.

FIG. 40 shows the group delay of the variable attenuator 101 with difference control voltages at node 128 when the frequency at the node 102a and 106a is between 20.0 GHz and 28.0 GHz. When the voltage at node 128 is 0.4 V, the maximum and minimum group delays of the variable attenuator 101 are 24.2 picoseconds and 20.9 picoseconds. When the voltage at node 128 is 0.55 V, the maximum and minimum group delays of the variable attenuator 101 are 30.2 picoseconds and 22.0 picoseconds. When the voltage at node 128 is 0.65 V, the maximum and minimum group delays of the variable attenuator 101 are 11.4 picoseconds and 6.7 picoseconds. When the voltage at node 128 is 0.8 V, the maximum and minimum group delays of the variable attenuator 101 are 17.1 picoseconds and 14.2 picoseconds. When the voltage at node 128 is 1.4 V, the maximum and minimum group delays of the variable attenuator 101 are 18.9 picoseconds and 15.7 picoseconds.

Figure 41:
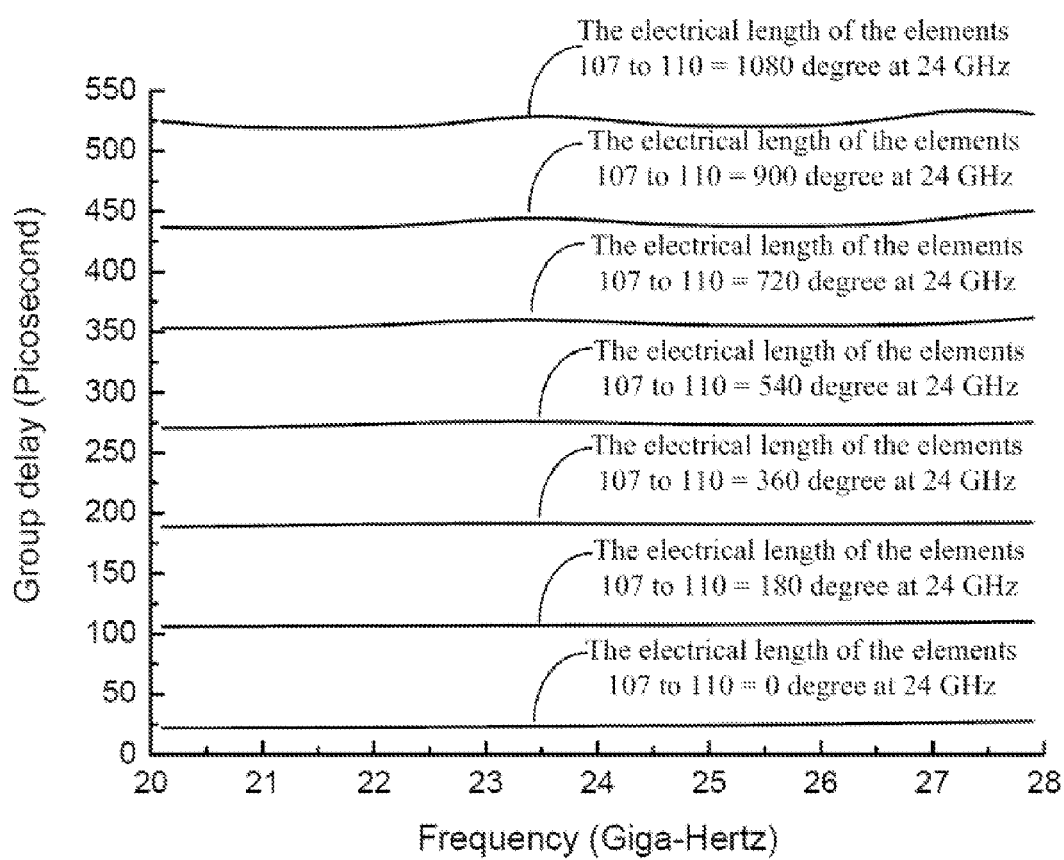
FIG. 41 is a schematic diagram of the group delay of the variable attenuator 101 with different electrical lengths of the elements 107 to 110.

FIG. 41 shows the syntheses on the group delay of the variable attenuator 101 with different electrical lengths of the elements 107, 108, 109, and 110. The voltage at node 128 is 0.4 V, and the electrical lengths of the elements 107, 108, 109, and 110 are identical. The group delay of the variable attenuator 101 is 40.0 picoseconds when the electrical length is 0.0 degrees at 24 GHz. The group delay is 110.0 picoseconds when the electrical length is 180.0 degrees at 24 GHz. The group delay is 190.0 picoseconds when the electrical length is 360.0 degrees at 24 GHz. The group delay is 275.0 picoseconds when the electrical length is 540.0 degrees at 24 GHz. The group delay is 355.0 picoseconds when the electrical length is 720.0 degrees at 24GHz. The group delay is 440.0 picoseconds when the electrical length is 900.0 degrees at 24 GHz. The increasing of the group delay of the variable attenuator 101 is proportional to the increasing of the electrical length of the elements 107, 108, 109, and 110.

Those skilled in the art will readily observe that numerous modifications and alterations of the device and method may be made while retaining the teachings of the invention.

What is claimed is:

1. A variable attenuator, comprising:
a substrate;
a first internal matching network;
a second internal matching network;
a third internal matching network;
a fourth internal matching network;
a first external matching network;
a second external matching network;
a first delay network;
a second delay network;
a first variable impedance network;
a second variable impedance network;
a biasing network;
a power combining network.

2. The variable attenuator of claim 1, wherein a group delay is synthesized with first and second internal delay networks.

3. The variable attenuator of claim 1, wherein an attenuation equal to 30.0 dB or over 30.0 dB is created with the first, second, third, and fourth internal matching network.

4. The variable attenuator of claim 1, wherein a phase reversal equal to 175 degrees or over 175 degrees is made.

5. The variable attenuator of claim 1, wherein the substrate is made of silicon.

6. The variable attenuator of claim 1, wherein the substrate is laminated substrate.

7. The variable attenuator of claim 1, further comprising a silicon substrate and a mesh metal shields the variable attenuator from the silicon substrate.

8. The variable attenuator of claim 1, wherein a coupler is made by metal with a thickness of 3 micrometers or over 3.0 micrometers.

* * * * *